(12) United States Patent
Shibazaki

(10) Patent No.: US 8,902,402 B2
(45) Date of Patent: Dec. 2, 2014

(54) MOVABLE BODY APPARATUS, EXPOSURE APPARATUS, EXPOSURE METHOD, AND DEVICE MANUFACTURING METHOD

(75) Inventor: Yuichi Shibazaki, Kumagaya (JP)

(73) Assignee: Nikon Corporation, Tokyo (JP)

( * ) Notice: Subject to any disclaimer, the term of this patent is extended or adjusted under 35 U.S.C. 154(b) by 906 days.

(21) Appl. No.: 12/640,636

(22) Filed: Dec. 17, 2009

(65) Prior Publication Data
US 2010/0159403 A1    Jun. 24, 2010

Related U.S. Application Data

(60) Provisional application No. 61/139,104, filed on Dec. 19, 2008, provisional application No. 61/213,375, filed on Jun. 2, 2009.

(30) Foreign Application Priority Data

May 20, 2009  (JP) ................................. 2009-122416

(51) Int. Cl.
   *G03B 27/42* (2006.01)
   *G03F 7/20* (2006.01)
(52) U.S. Cl.
   CPC ........ *G03F 7/70716* (2013.01); *G03F 7/70733* (2013.01); *G06F 7/70775* (2013.01)
   USPC .................................. 355/53; 355/30; 355/72
(58) Field of Classification Search
   CPC ............ G03F 7/70716; G03F 7/70775; G03F 7/70733; G03F 7/70341; G03B 27/58
   USPC ................................................. 355/30, 53, 72
   See application file for complete search history.

(56) References Cited

U.S. PATENT DOCUMENTS

| | | | |
|---|---|---|---|
| 4,465,368 A | 8/1984 | Matsuura et al. | |
| 4,780,617 A | 10/1988 | Umatate et al. | |
| 5,196,745 A | 3/1993 | Trumper | |
| 5,448,332 A | 9/1995 | Sakakibara et al. | |
| 5,610,715 A | 3/1997 | Yoshii et al. | |

(Continued)

FOREIGN PATENT DOCUMENTS

| JP | A-57-117238 | 7/1982 |
|---|---|---|
| JP | A-4-265805 | 9/1992 |

(Continued)

OTHER PUBLICATIONS

U.S. Appl. No. 12/561,533, filed Sep. 17, 2009 in the name of Yuichi Shibazaki.

(Continued)

*Primary Examiner* — Mesfin T Asfaw
(74) *Attorney, Agent, or Firm* — Oliff PLC

(57) ABSTRACT

In an exposure station, positional information of a stage holding a wafer is measured by a first fine movement stage position measurement system including a measurement arm, and in a measurement station, positional information of a stage holding a wafer is measured by a second fine movement stage position measurement system including another measurement arm. An exposure apparatus has a third fine movement stage position measurement system which can measure positional information of a stage when the stage is carried from the measurement station to the exposure station. The third fine movement stage measurement system includes an encoder system including a plurality of Y heads and a laser interferometer system including a laser interferometer.

56 Claims, 35 Drawing Sheets

(56) References Cited

U.S. PATENT DOCUMENTS

| | | | |
|---|---|---|---|
| 5,646,413 A | 7/1997 | Nishi | |
| 5,969,441 A | 10/1999 | Loopstra et al. | |
| 6,020,964 A * | 2/2000 | Loopstra et al. | 356/500 |
| 6,208,407 B1 | 3/2001 | Loopstra | |
| 6,590,634 B1 | 7/2003 | Nishi et al. | |
| 6,611,316 B2 | 8/2003 | Sewell | |
| 6,778,257 B2 | 8/2004 | Bleeker et al. | |
| 6,819,425 B2 | 11/2004 | Kwan | |
| 7,023,610 B2 | 4/2006 | Ohtsuki et al. | |
| 7,025,498 B2 | 4/2006 | del Puerto | |
| 7,102,729 B2 | 9/2006 | Renkens et al. | |
| 7,161,659 B2 | 1/2007 | Van Den Brink et al. | |
| 7,238,931 B2 | 7/2007 | Nabeshima et al. | |
| 7,253,875 B1 | 8/2007 | Luttikhuis et al. | |
| 7,256,871 B2 | 8/2007 | Loopstra et al. | |
| 7,289,212 B2 | 10/2007 | Kwan | |
| 7,292,312 B2 | 11/2007 | Loopstra et al. | |
| 7,333,174 B2 | 2/2008 | Koenen et al. | |
| 7,348,574 B2 | 3/2008 | Pril et al. | |
| 7,349,069 B2 | 3/2008 | Beems et al. | |
| 7,362,446 B2 | 4/2008 | Van Der Pasch et al. | |
| 7,405,811 B2 | 7/2008 | Beems et al. | |
| 2002/0041377 A1 | 4/2002 | Hagiwara et al. | |
| 2003/0025890 A1 | 2/2003 | Nishinaga | |
| 2003/0223079 A1 | 12/2003 | Hill | |
| 2005/0052632 A1 | 3/2005 | Miyajima | |
| 2005/0128461 A1 | 6/2005 | Beems et al. | |
| 2005/0236558 A1 | 10/2005 | Nabeshima et al. | |
| 2005/0259234 A1 | 11/2005 | Hirukawa et al. | |
| 2006/0114445 A1 | 6/2006 | Ebihara | |
| 2006/0139660 A1 | 6/2006 | Patrick Kwan | |
| 2006/0187431 A1 | 8/2006 | Shibazaki | |
| 2006/0227308 A1 * | 10/2006 | Brink et al. | 355/53 |
| 2006/0227309 A1 | 10/2006 | Loopstra et al. | |
| 2007/0052976 A1 | 3/2007 | Pril et al. | |
| 2007/0076218 A1 | 4/2007 | Van Empel et al. | |
| 2007/0127006 A1 | 6/2007 | Shibazaki | |
| 2007/0195296 A1 | 8/2007 | Van Der Pasch et al. | |
| 2007/0216882 A1 | 9/2007 | Benschop et al. | |
| 2007/0223007 A1 | 9/2007 | Klaver et al. | |
| 2007/0263191 A1 | 11/2007 | Shibazaki | |
| 2007/0263197 A1 | 11/2007 | Luttikhuis et al. | |
| 2007/0288121 A1 | 12/2007 | Shibazaki | |
| 2008/0043212 A1 | 2/2008 | Shibazaki | |
| 2008/0074681 A1 | 3/2008 | Loopstra et al. | |
| 2008/0088843 A1 | 4/2008 | Shibazaki | |
| 2008/0094592 A1 | 4/2008 | Shibazaki | |
| 2008/0094593 A1 | 4/2008 | Shibazaki | |
| 2008/0094594 A1 | 4/2008 | Shibazaki | |
| 2008/0094604 A1 | 4/2008 | Shibazaki | |
| 2008/0105026 A1 | 5/2008 | Loopstra et al. | |
| 2008/0106722 A1 | 5/2008 | Shibazaki | |
| 2008/0165345 A1 | 7/2008 | Hill | |
| 2008/0218713 A1 | 9/2008 | Shibazaki | |
| 2008/0246936 A1 | 10/2008 | Loopstra et al. | |
| 2008/0297751 A1 | 12/2008 | Shibazaki | |
| 2009/0004580 A1 | 1/2009 | Kanaya | |
| 2009/0027640 A1 | 1/2009 | Shibazaki et al. | |
| 2009/0033900 A1 | 2/2009 | Kanaya | |
| 2009/0040488 A1 | 2/2009 | Shibazaki et al. | |
| 2009/0051892 A1 | 2/2009 | Shibazaki et al. | |
| 2009/0051893 A1 | 2/2009 | Shibazaki et al. | |
| 2009/0051894 A1 | 2/2009 | Shibazaki et al. | |
| 2009/0051895 A1 | 2/2009 | Shibazaki | |
| 2009/0053629 A1 | 2/2009 | Shibazaki et al. | |
| 2009/0059194 A1 | 3/2009 | Kanaya | |
| 2009/0059198 A1 | 3/2009 | Shibazaki et al. | |
| 2009/0073405 A1 | 3/2009 | Kanaya | |
| 2009/0115982 A1 | 5/2009 | Kanaya | |
| 2009/0122285 A1 | 5/2009 | Kanaya | |
| 2009/0122286 A1 | 5/2009 | Kanaya | |
| 2009/0122287 A1 | 5/2009 | Kanaya | |
| 2009/0153822 A1 | 6/2009 | Shibazaki | |
| 2009/0161086 A1 | 6/2009 | Shibazaki | |
| 2009/0190110 A1 | 7/2009 | Shibazaki | |
| 2009/0225288 A1 | 9/2009 | Shibazaki | |
| 2009/0233234 A1 | 9/2009 | Shibazaki | |
| 2009/0284716 A1 | 11/2009 | Kanaya | |
| 2009/0284717 A1 | 11/2009 | Kanaya | |
| 2009/0284723 A1 | 11/2009 | Shibazaki | |
| 2009/0284724 A1 | 11/2009 | Kanaya | |
| 2010/0045961 A1 | 2/2010 | Li et al. | |

FOREIGN PATENT DOCUMENTS

| | | |
|---|---|---|
| JP | A-09-102453 | 4/1997 |
| JP | A-2002-014005 | 1/2002 |
| JP | A-2003-249443 | 9/2003 |
| WO | WO 01/35168 A1 | 5/2001 |
| WO | WO 03/065428 A1 | 8/2003 |
| WO | WO 2006/038952 A2 | 4/2006 |
| WO | WO 2007/083758 A1 | 7/2007 |
| WO | WO 2007/097379 A1 | 8/2007 |
| WO | WO 2008/037131 A1 | 4/2008 |
| WO | WO 2008/038752 A1 | 4/2008 |
| WO | WO 2008/056735 A1 | 5/2008 |
| WO | WO 2008/061186 A2 | 5/2008 |

OTHER PUBLICATIONS

U.S. Appl. No. 12/561,480, filed Sep. 17, 2009 in the name of Yuichi Shibazaki.
U.S. Appl. No. 12/561,510, filed Sep. 17, 2009 in the name of Yuichi Shibazaki.
U.S. Appl. No. 12/385,577, filed Apr. 13, 2009 in the name of Yuichi Shibazaki.
U.S. Appl. No. 12/640,299, filed Dec. 17, 2009 in the name of Yuichi Shibazaki.
U.S. Appl. No. 12/640,617, filed Dec. 17, 2009 in the name of Yuichi Shibazaki.
U.S. Appl. No. 12/640,508, filed Dec. 17, 2009 in the name of Yuichi Shibazaki.
Written Opinion of the International Searching Authority issued in PCT/JP2009/071711 on Apr. 6, 2010.
International Search Report issued in PCT/JP2009/071711 on Apr. 6, 2010.
Written Opinion of the International Searching Authority issued in PCT/JP2009/071721 on Mar. 25, 2010.
International Search Report issued in PCT/JP2009/071721 on Mar. 25, 2010.
Written Opinion of the International Searching Authority issued in PCT/JP2009/071734 on Mar. 24, 2010.
International Search Report issued in PCT/JP2009/071734 on Mar. 24, 2010.
International Search Report issued in Application No. PCT/JP2009/071722 on Apr. 19, 2010.
Written Opinion of the International Searching Authority issued in Application No. PCT/JP2009/071722 on Apr. 19, 2010.

* cited by examiner

MOVABLE BODY APPARATUS, EXPOSURE APPARATUS, EXPOSURE METHOD, AND DEVICE MANUFACTURING METHOD

CROSS-REFERENCE TO RELATED APPLICATIONS

This non-provisional application claims the benefit of Provisional Application No. 61/139,104 filed Dec. 19, 2008, and Provisional Application No. 61/213,375 filed Jun. 2, 2009, the disclosures of which are hereby incorporated herein by reference in its entirety.

BACKGROUND OF THE INVENTION

1. Field of the Invention

The present invention relates to movable body apparatuses, exposure apparatuses, exposure methods, and device manufacturing methods, and more particularly, to a movable body apparatus including a movable body which can move along a plane parallel to a predetermined two-dimensional plane, an exposure apparatus which is equipped with the movable body apparatus and exposes an object with an energy beam, an exposure method performed in the exposure apparatus, and a device manufacturing method using the exposure apparatus or the exposure method.

2. Description of the Background Art

Conventionally, in a lithography process for manufacturing electron devices (microdevices) such as semiconductor devices (such as integrated circuits) and liquid crystal display devices, exposure apparatuses such as a projection exposure apparatus by a step-and-repeat method (a so-called stepper) and a projection exposure apparatus by a step-and-scan method (a so-called scanning stepper (which is also called a scanner) are mainly used.

In these types of exposure apparatuses, the position of a wafer stage which moves two-dimensionally, holding a substrate (hereinafter generally referred to as a wafer) such as a wafer or a glass plate on which a pattern is transferred and formed, was measured using a laser interferometer in general. However, requirements for a wafer stage position control performance with higher precision are increasing due to finer patterns that accompany higher integration of semiconductor devices recently, and as a consequence, short-term variation of measurement values due to temperature fluctuation and/or the influence of temperature gradient of the atmosphere on the beam path of the laser interferometer can no longer be ignored.

To improve such an inconvenience, various inventions related to an exposure apparatus that has employed an encoder having a measurement resolution at the same level or better than a laser interferometer as the position measuring device of the wafer stage have been proposed (refer to, e.g., PCT International Publication No. 2007/097379 (the corresponding U.S. Patent Application Publication No. 2008/0088843) and the like). However, in the liquid immersion exposure apparatus disclosed in PCT International Publication. No. 2007/097379 and the like, there still were points that should have been improved, such as a throat of the wafer stage (a grating installed on the wafer stage upper surface) being deformed when influenced by heat of vaporization and the like when the liquid evaporates.

To improve such an inconvenience, in, for example, PCT International Publication No. 2008/038752 (the corresponding U.S. Patent Application Publication No. 2009/0094594), as a fifth embodiment, an exposure apparatus is disclosed which is equipped with an encoder system that has a grating arranged on the upper surface of a wafer stage configured by a light transmitting member and measures the displacement of the wafer stage related to the periodic direction of the grating by making a measurement beam from an encoder main body placed below the wafer stage enter the wafer stage and be irradiated on the grating, and by receiving a diffraction light which occurs in the grating. In this apparatus, because the grating is covered with a cover glass, the grating is immune to the heat of vaporization, which makes it possible to measure the position of the wafer stage with high precision.

However, depending on the type of exposure apparatus (for example, in an exposure apparatus which employs a dual stage structure as is disclosed in, U.S. Pat. No. 7,161,659), it becomes necessary to move a wafer stage inside a measurement range (e.g., an exposure position) of an encoder system, after a predetermined processing (e.g., alignment measurement of a wafer) has been performed on a wafer outside the measurable range of the encoder system. Accordingly, development of a system that can measure positional information of a wafer stage in a much wider range with high accuracy was desired.

SUMMARY OF THE INVENTION

According to a first aspect of the present invention, there is provided a first movable body apparatus, comprising: a movable body which is movable at least along a two-dimensional plane including a first axis and a second axis that are orthogonal to each other; a first measurement system which measures positional information of the movable body in a direction parallel to the first axis and a direction parallel to the second axis when the movable body moves within a predetermined range within the two-dimensional plane, by irradiating at least one first measurement beam from below on a first measurement plane substantially parallel to the two-dimensional plane placed on the movable body and receiving a light from the first measurement plane of the first measurement beam; a second measurement system which measures positional information of the movable body at least in a direction parallel to the first axis outside the predetermined range of within the two-dimensional plane; and a control system which controls a position of the movable body, based on measurement information of at least one of the first measurement system and the second measurement system.

According to this apparatus, the positional information of the movable body moving within the predetermined range in the two-dimensional plane is measured by the first measurement system irradiating the first measurement beam from below on the first measurement plane which is substantially parallel to the two-dimensional plane placed on the movable body. Accordingly, within the predetermined range in the two dimensional plane described above, the positional information of the movable body can be measured with high precision. Further, the positional information of the movable body at least in the direction parallel to the first axis outside the predetermined range of within the two-dimensional plane is measured by the second measurement system. Furthermore, the position of the movable body is controlled by the control system, based on the measurement information of at least one of the first measurement system and the second measurement system. Accordingly, the control system can unfailingly control the position of the movable body in a wide range within the two-dimensional plane, based on the measurement information of the first and/or the second measurement system.

According to a second aspect of the present invention, there is provided a second movable body apparatus, comprising: a first support member which moves within a first range in a two dimensional plane including a first axis and a second axis that are orthogonal to each other; a second support member which moves within a second range positioned on one side of a direction parallel to the first axis of the first range in the two-dimensional plane; a holding member which is placed in the vicinity of a border of the first range and the second range; a movable body which is supported relatively movable at least within a plane parallel to the two-dimensional plane, by the first support member and the second support member; a first measurement system which measures positional information of the movable body in a direction parallel to the first axis and a direction parallel to the second axis, by irradiating at least one first measurement beam from below on a first measurement plane substantially parallel to the two-dimensional plane placed on the movable body supported by the first support member and receiving a light from the first measurement plane of the first measurement beam; and a second measurement system which measures positional information of the movable body on the holding member when the movable body is delivered between the first support member and the second support member via the holding member.

According to this apparatus, the positional information of the movable body supported by the first support member is measured by the first measurement system irradiating the first measurement beam from below on the first measurement plane which is substantially parallel to the two-dimensional plane placed on the movable body. Accordingly, the positional information of the movable body supported by the first support member can be measured with high precision. Further, the positional information of the movable body on the holding member when the movable body is delivered between the first support member and the second support member via the holding member is measured by the second measurement system. Accordingly, the positional information of the movable body in a wide range within the two-dimensional plane can be measured, based on the measurement information of the first and/or the second measurement system.

According to a third aspect of the present invention, there is provided a first exposure apparatus that forms a pattern on an object by an irradiation of an energy beam, the apparatus comprising: the movable body apparatus of one of the first and second movable body apparatuses of the present invention in which the object is mounted on the movable body; and a patterning device which irradiates the energy beam on the object mounted on the movable body.

According to this apparatus, because the apparatus is equipped with one of the first and second movable body apparatuses of the present invention, a pattern can be formed with high accuracy on the object.

According to a fourth aspect of the present invention, there is provided a device manufacturing method, including exposing an object using the exposure apparatus of the present invention; and developing the object which has been exposed.

According to a fifth aspect of the present invention, there is provided a second exposure apparatus that exposes an object with an energy beam, the apparatus comprising: a first support member which is movable within a first range including an exposure station where exposure of the object by the energy beam is performed; a second support member which is movable within a second range including a measurement station where measurement of alignment information of the object is performed; a movable body which holds the object, and is movably supported by each of the first and second support members; a first measurement system which measures positional information of the movable body supported by the first support member; a second measurement system which measures positional information of the movable body supported by the second support member; and a third measurement system which measures positional information of the movable body when the movable body is delivered from one of the first and second support members to the other.

According to this apparatus, positional information of the movable body supported by the first support member moving while holding the object within the first range including the exposure station where exposure of the object with the energy beam is performed, is measured by the first measurement system. Further, positional information of the movable body supported by the second support member moving while holding the object within the second range including the measurement station where measurement of alignment information of the object is performed, is measured by the second measurement system. Furthermore, positional information of the movable body when the movable body is delivered from one of the first and second support members to the other is measured by the third measurement system. Accordingly, it becomes possible to measure the positional information of the movable body within a broad range including the exposure station and the measurement station, based on the measurement information of the first, second, and third measurement systems.

According to a sixth aspect of the present invention, there is provided an exposure method in which an object is exposed with an energy beam, the method comprising: moving a first support member supporting a movable body holding the object within a first range including an exposure station where exposure of the object by the energy beam is performed, and measuring positional information of the movable body supported by the first support member using a first measurement system; moving a second support member supporting a movable body holding the object within a second range including a measurement station where measurement of alignment information of the object is performed, and measuring positional information of the movable body supported by the second support member using a second measurement system; and measuring positional information of the movable body using a third measurement system when the movable body is delivered from one of the first and second support members to the other.

According to the method, it becomes possible to measure the positional information of the movable body within a broad range including the exposure station and the measurement station, based on the measurement information of the first, second, and third measurement systems.

According to a seventh aspect of the present invention, there is provided a device manufacturing method, including exposing an object using the exposure method of the present invention; and developing the object which has been exposed.

BRIEF DESCRIPTION OF THE DRAWINGS

In the accompanying drawings;

FIG. 5 is a view used to explain an auxiliary stage which the exposure apparatus in FIG. 1 is equipped with;

DESCRIPTION OF THE EMBODIMENTS

An embodiment of the present invention will be described below, with reference to FIGS. 1 to 32.

Figure 1:
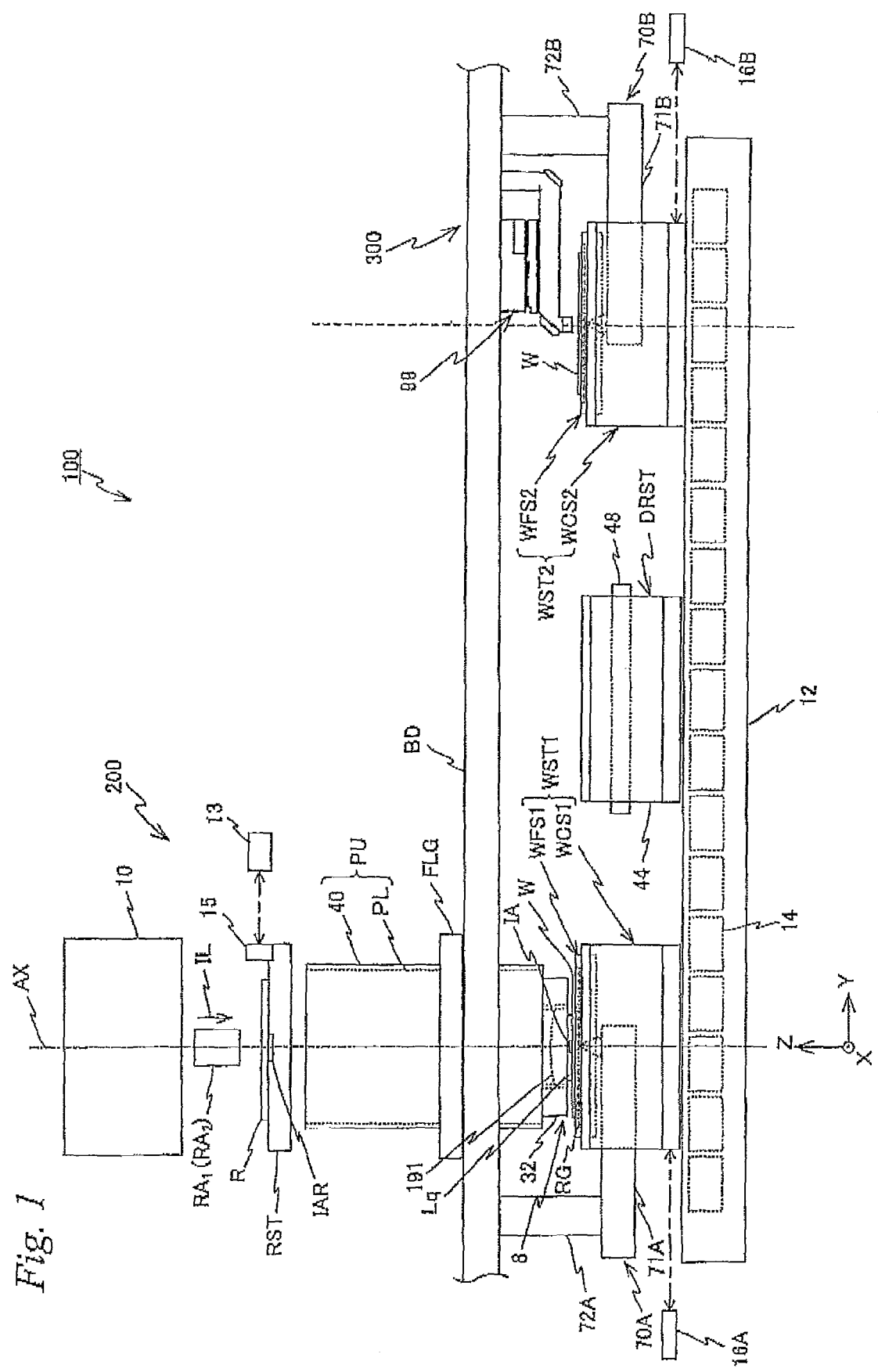
FIG. 1 is a view that schematically shows a configuration of an exposure apparatus of an embodiment.

FIG. 1 shows a schematic configuration of an exposure apparatus 100 in the embodiment. Exposure apparatus 100 is a projection exposure apparatus by the step-and-scan method, or a so-called scanner. As it will be described later, a projection optical system PL is arranged in the embodiment, and in the description below, a direction parallel to an optical axis AX of projection optical system PL will be described as the Z-axis direction, a direction within a plane orthogonal to the Z-axis direction in which a reticle and a wafer are relatively scanned will be described as the Y-axis direction, a direction orthogonal to the Z-axis and the Y-axis will be described as the X-axis direction, and rotational (inclination) directions around the X-axis, the Y-axis, and the z-axis will be described as $\theta x$, $\theta y$, and $\theta z$ directions, respectively.

As shown in FIG. 1, exposure apparatus 100 is equipped with an exposure station 200 placed close to the end on the −Y side of a base board 12, a measurement station 300 placed close to the end on the +Y side of base board 12, two wafer stages WST1 and WST2, a relay stage DRST, and a control system and the like for these parts. Now, base board 12 is supported on the floor surface almost horizontally (parallel to the XY plane) by a vibration isolation mechanism (omitted in drawings). Base board 12 is made of a member having a tabular form, and the degree of flatness of the upper surface is extremely high and serves as a guide surface when the three stages WST1, WST2, and DRST described above move. Incidentally, in FIG. 1, wafer stage WST1 is located at exposure station 200, and wafer W is held on wafer stage WST1 (to be more specific, fine movement stage WFS1). Further, wafer stage WST2 is located at measurement station 300, and another wafer W is held on wafer stage WST2 (to be more specific, fine movement stage WFS2).

Exposure station 200 comprises an illumination system 10, a reticle stage RST, a projection unit PU, a local liquid immersion device 8 and the like.

Illumination system 10 includes a light source, an illuminance uniformity optical system, which includes an optical integrator and the like, and an illumination optical system that has a reticle blind and the like (none of which are shown), as is disclosed in, for example, U.S. Patent Application Publication No. 2003/0025890 and the like. Illumination system 10 illuminates a slit-shaped illumination area TAR which is set on a reticle R with a reticle blind (also referred to as a masking system) by illumination light (exposure light) IL with a substantially uniform illuminance. In this case, as illumination light IL, for example, an ArF excimer laser beam (wavelength 193 nm) is used.

On reticle stage RST, reticle R on which a circuit pattern or the like is formed on its pattern surface (the lower surface in FIG. 1) is fixed, for example, by vacuum chucking. Reticle stage RST is finely drivable within an XY plane, for example, by a reticle stage drive section 11 (not shown in FIG. 1, refer to FIG. 3) that includes a linear motor or the like, and reticle stage RST is also drivable in a scanning direction (in this case, the Y-axis direction, which is the lateral direction of the page surface in FIG. 1) at a predetermined scanning speed.

The positional information (including rotation information in the θz direction) of reticle stage RST in the XY plane is constantly detected, for example, at a resolution of around 0.25 nm by a reticle laser interferometer (hereinafter referred to as a "reticle interferometer") 13, via a movable mirror 15 (the mirrors actually arranged are a Y movable mirror (or a retro reflector) that has a reflection surface which is orthogonal to the Y-axis direction and an X movable mirror that has a reflection surface orthogonal to the X-axis direction) fixed on reticle stage RST. The measurement values of reticle interferometer 13 are sent to a main controller 20 (not shown in FIG. 1, refer to FIG. 3). Incidentally, positional information of reticle stage RST can be measured by an encoder system as is disclosed in, for example, U.S. Patent Application Publication No. 2007/0288121 and the like.

Projection unit PU is placed below reticle stage RST in FIG. 1. Projection unit PU is supported via flange portion FLG provided in the outer periphery of the projection unit, by a main frame (also called a metrology frame) BD supported horizontally by a support member (not shown). Projection unit PU includes a barrel 40, and projection optical system PL held within barrel 40. As projection optical system PL, for example, a dioptric system is used, consisting of a plurality of lenses (lens elements) that is disposed along optical axis AX, which is parallel to the Z-axis direction. Projection optical system PL is, for example, a both-side telecentric dioptric system that has a predetermined projection magnification (such as one-quarter, one-fifth, or one-eighth times). Therefore, when illumination system 10 illuminates illumination area IAR on reticle R with illumination area IL, by illumination light IL which has passed through reticle R placed so that its pattern surface substantially coincides with a first surface (object surface) of projection optical system PL, a reduced image of the circuit pattern of reticle R within illumination area IAR via projection optical system PL (projection unit PU) is formed on a wafer W whose surface is coated with a resist (a sensitive agent) and is placed on a second surface (image plane surface) side of projection optical system PL, on an area (hereinafter also referred to as an exposure area) IA conjugate with illumination area TAR. And by reticle stage RST and fine movement stage WFS1 (or fine movement stage WFS2) being synchronously driven, reticle R is relatively moved in the scanning direction (the Y-axis direction) with respect to illumination area IAR (illumination light IL) while wafer W is relatively moved in the scanning direction (the Y-axis direction) with respect to exposure area IA (illumination light TL), thus scanning exposure of a shot area (divided area) on wafer W is performed, and the pattern of reticle R is transferred onto the shot area. That is, in the embodiment, pattern of reticle R is generated on wafer W according to illumination system 10 and projection optical system PL, and then by the exposure of the sensitive layer (resist layer) on wafer W with illumination light IL, the pattern is formed on wafer W. In the embodiment, main frame BD is supported almost horizontally by a plurality of (e.g. three or four) support Members which are each placed on an installation surface (floor surface) via a vibration isolation mechanism. Incidentally, the vibration isolation mechanism can be placed between each of the support members and main frame BD. Further, as is disclosed in, for example, PCT International Publication No. 2006/038952, main frame BD (projection unit PU) can be supported by suspension with respect to a main frame member or to a reticle base (not shown), placed above projection unit PU.

Local liquid immersion device 8 is provided corresponding to the point that exposure apparatus 100 of the embodiment performs exposure by a liquid immersion method. Local liquid immersion device 8 includes a liquid supply device 5, a liquid recovery device 6 (both of which are not shown in FIG. 1, refer to FIG. 3), a nozzle unit 32 and the like. As shown in FIG. 1, nozzle unit 32 is supported in a suspended state by main frame BD supporting projection unit PU and the like via a support member (not shown) so that the periphery of the lower end portion of barrel 40 that holds an optical element closest to the image plane side (the wafer W side) constituting projection optical system PL, in this case, a lens (hereinafter also referred to as a "tip lens") 191, is enclosed. Nozzle unit 32 is equipped with a supply opening and a recovery opening of a liquid Lq, a lower surface to which wafer W is placed facing and at which the recovery opening is arranged, and a supply flow channel and a recovery flow channel that are connected to a liquid supply pipe 31A and a liquid recovery pipe 313 (both of which are not shown in FIG. 1, refer to FIG. 4), respectively. One end of a supply pipe (not shown) is connected to liquid supply pipe 31A while the other end of the supply pipe is connected to a liquid supply unit 5 (not shown in FIG. 1, refer to FIG. 3), and one end of a recovery pipe (not shown) is connected to liquid recovery pipe 31B while the other end of the recovery pipe is connected to a liquid recovery device 6 (not shown in FIG. 1, refer to FIG. 3). In the embodiment, main controller 20 controls liquid supply device 5 (refer to FIG. 3), and supplies liquid between tip lens 191 and wafer W via liquid supply pipe 31A and nozzle unit 32, as well as control liquid recovery device 6 (refer to FIG. 3), and recovers liquid from between tip lens 191 and wafer W via nozzle unit 32 and liquid recovery pipe 31B. During the operations, main controller 20 controls liquid supply device 5 and liquid recovery device 6 so that the quantity of liquid supplied constantly equals the quantity of liquid which has been recovered. Accordingly, a constant quantity of liquid Lq (refer to FIG. 1) is held constantly replaced in the space between tip lens 191 and wafer W. In the embodiment, as the liquid above, pure water that transmits the ArF excimer laser beam (light with a wavelength of 193 nm) is to be used. Incidentally, refractive index n of the water with respect to the ArF excimer laser beam is around 1.44, and in the pure water, the wavelength of illumination light IL is 193 nm×1/n, shorted to around 134 nm.

Besides this, in exposure station 200, a fine movement stage position measurement system 70A is provided, including a measurement arm 71A supported almost in a cantilevered state (supported in the vicinity of one end) by main frame BD via a support member 72A. However, fine movement stage position measurement system 70A will be described after describing the fine movement stage, which will be described later, for convenience of the explanation.

In measurement station 300, an alignment device 99 provided in main frame BD, and a fine movement stage position measurement system 70B, which has a symmetric but a similar configuration with fine movement stage position measurement system 70A previously described, including a measurement arm 71B supported in a cantilevered state (supported in the vicinity of one end) by main frame BD via a support member 72B, are provided.

Figure 4:
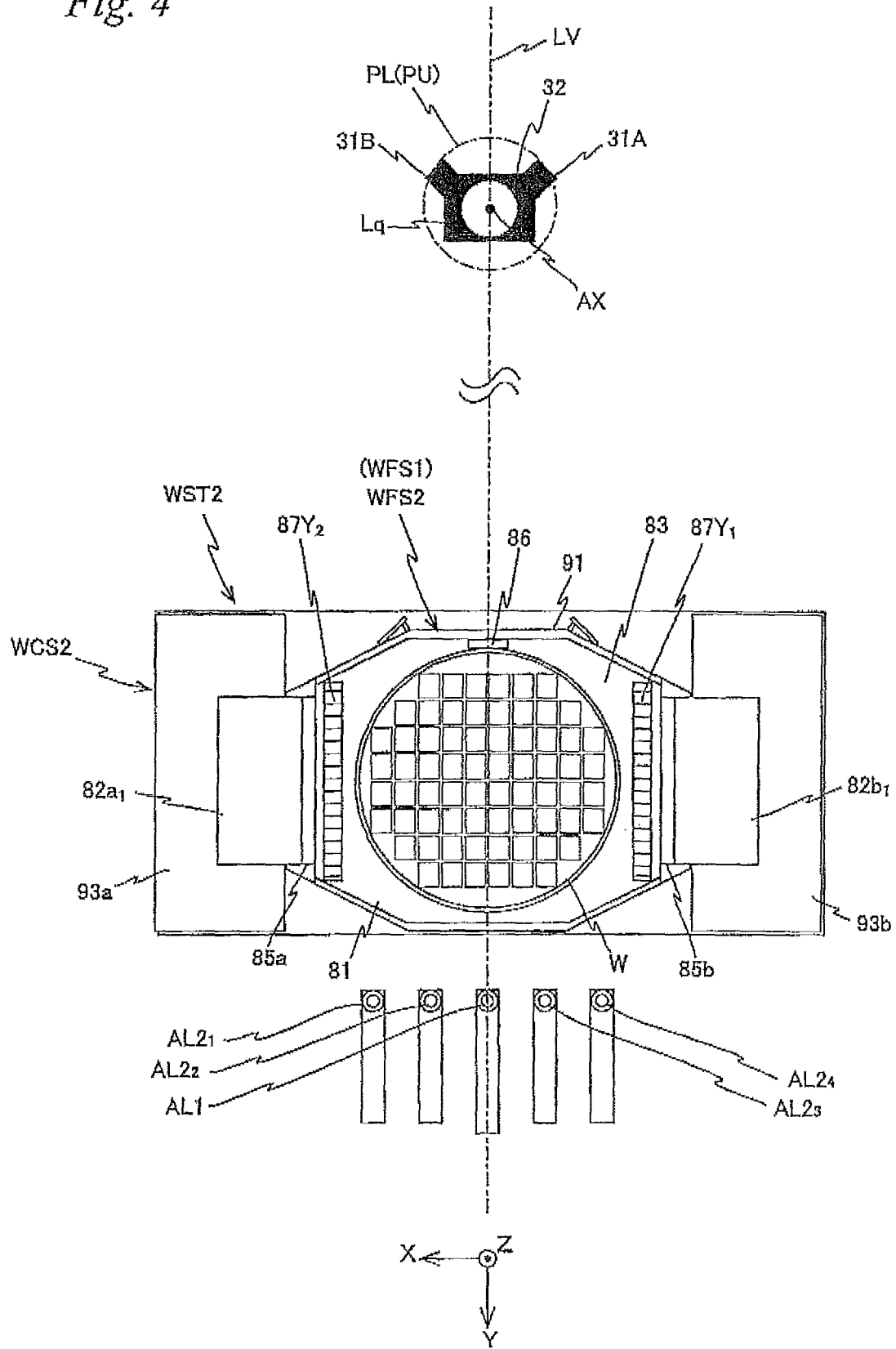
FIG. 4 is a planar view showing a placement of an alignment system and a projection unit PU which the exposure apparatus in FIG. 1 is equipped with, along with a wafer stage.

Aligner 99, as disclosed in, for example, U.S. Patent Application Publication NO. 2008/0088843 and the like, includes five alignment systems AL1, and $AL2_1$ to $AL2_4$, shown in FIG. 4. To be more specific, as shown in FIG. 4, a primary alignment system AL1 is placed on a straight line (hereinafter, referred to as a reference axis) LV, which passes through the center of projection unit PU (optical axis AX of projection optical system PL, which also coincides with the center of exposure area IA previously described in the embodiment) and is also parallel to the Y-axis, in a state where the detection center is located at a position that is spaced apart from optical axis AX at a predetermined distance on the −Y side. On one side and the other side in the X-axis direction with primary alignment system AL1 in between, secondary alignment systems $AL2_1$ and $AL2_2$, and $AL2_3$ and $AL2_4$ whose detection centers are substantially symmetrically placed with respect to a reference axis LV are severally arranged. That is five alignment systems AL1 and $AL2_1$ to $AL2_4$ are placed so that their detection centers are placed along the X-axis direction. Incidentally, in FIG. 1, the five alignment systems AL1 and $AL2_1$ to $AL2_4$ are shown as an aligner 99, including the holding apparatus (sliders) which hold these systems. Incidentally, a concrete configuration and the like of aligner 99 will be described furthermore later on.

Figure 2A:
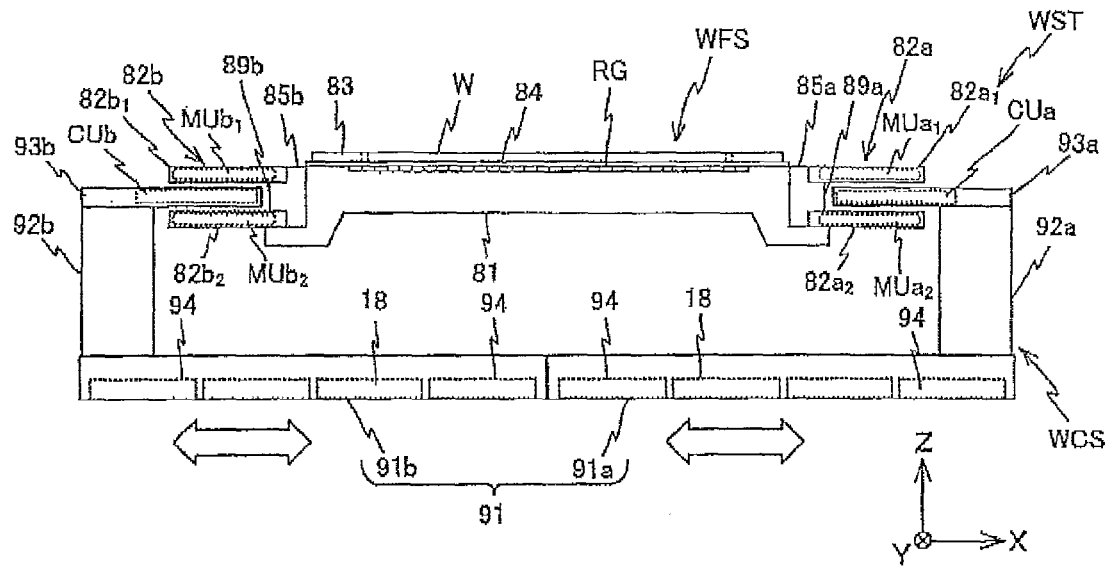
FIG. 2A shows a side view of a wafer stage which the exposure apparatus in FIG. 1 is equipped with when viewed from a −Y direction.

As it can be seen from FIGS. 1, 2A and the like, wafer stage WST1 has a wafer coarse movement stage WCS1, which is supported by levitation above base board 12 by a plurality of non-contact bearings, such as, for example, air bearings 94 provided on its bottom surface and is driven in the XY two-dimensional direction by a coarse movement stage drive system 51A (refer to FIG. 3), and a wafer fine movement stage WFS1, which is supported in a non-contact manner by coarse movement stage WCS1 and is relatively movable with respect to coarse movement stage WCS1. Fine movement stage WFS1 is driven by a fine movement stage drive system 52A (refer to FIG. 3) with respect to coarse movement stage WCS1 in the X-axis direction, the Y-axis direction, the Z-axis direction, the θx direction, the θy direction, and the θz direction (hereinafter expressed as directions of six degrees of freedom, or directions of six degrees of freedom (X, Y, Z, θx, θy, θz)).

Similar to wafer stage WST1, wafer stage WST2 has a wafer coarse movement stage WCS2, which is supported by levitation above base board 12 by a plurality of non-contact bearings (e.g., air bearings (omitted in drawings)) provided on its bottom surface and is driven in the XY two-dimensional direction by a coarse movement stage drive system 51B (refer to FIG. 3) and a wafer fine movement stage WFS2, which is supported in a non-contact manner by coarse movement stage WCS2 and is relatively movable with respect to coarse movement stage WCS2. Fine movement stage WFS2 is driven by a fine movement stage drive system 52B (refer to FIG. 3) with respect to coarse movement stage WCS2 in directions of six degrees of freedom (X, Y, Z, θx, θz).

Positional information (also including rotation information in the θz direction) in the XY plane of wafer stage WST1 (coarse movement stage WCS1) is measured by a wafer stage position measurement system 16A. Further, positional information in directions of six degrees of freedom (X, Y, Z, θx, θy, and θz) of fine movement stage WFS1 (or fine movement stage WFS2 which will be described later on) supported by coarse movement stage WCS1 in exposure station 200 is measured by fine movement stage position measurement system 70A (refer to FIG. 3).

Figure 3:
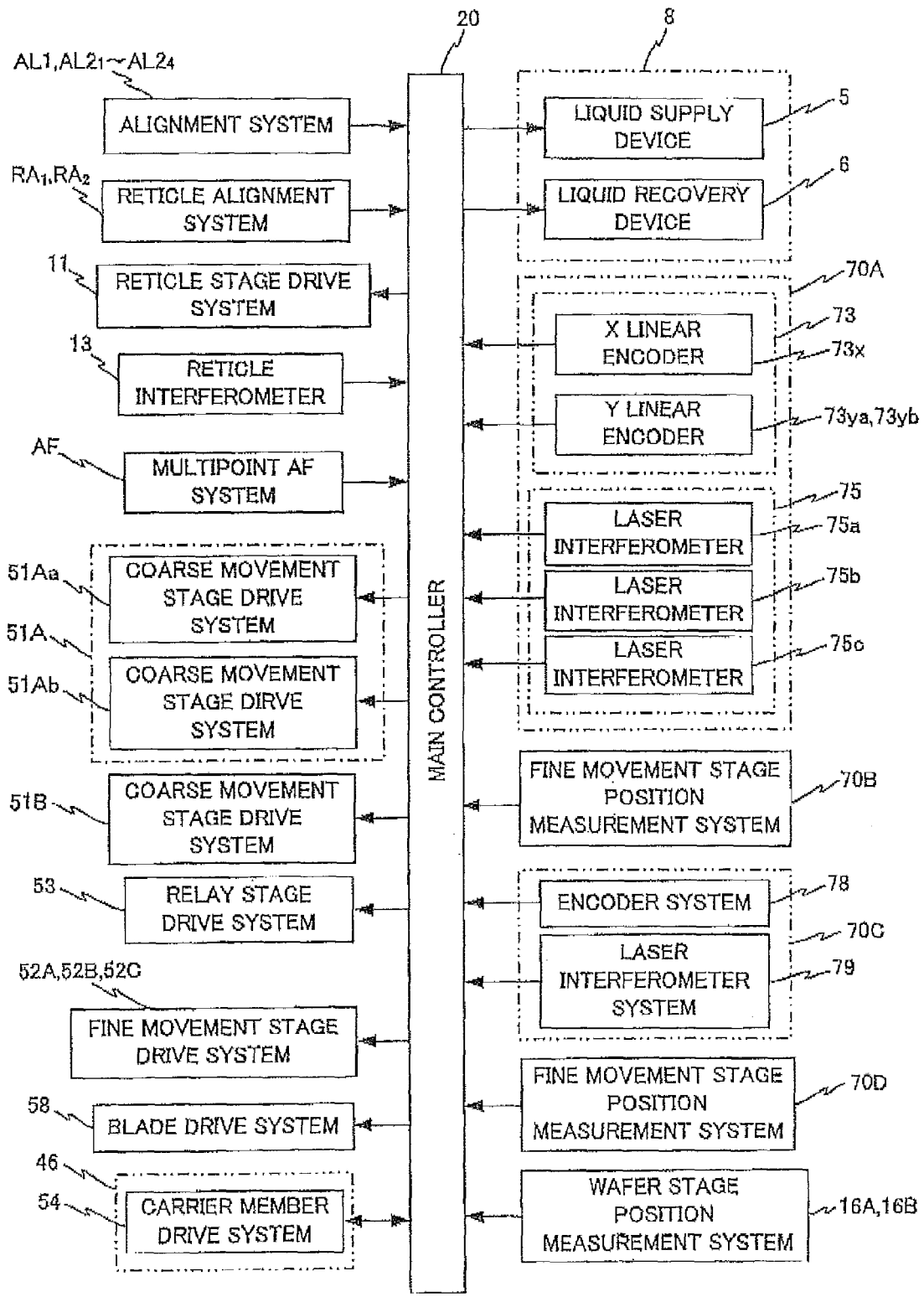
FIG. 3 is a block diagram used to explain an input/output relation of a main controller equipped in the exposure apparatus in FIG. 1.

Positional information (also including rotation information in the θz direction) in the XY plane of wafer stage WST2 (coarse movement stage WCS2) is measured by a wafer stage position measurement system 16B (refer to FIG. 3). Further, positional information in directions of six degrees of freedom of fine movement stage WFS2 (or fine movement stage WFS1) supported by coarse movement stage WCS2 in measurement station 300 is measured by fine movement stage position measurement system 70B (refer to FIG. 3).

Further, outside exposure station 200 and measurement station 300, or more specifically, outside the measurement range of fine movement stage position measurement system 70A and fine movement stage position measurement system 70B, positional information of fine movement stages WFS1 and WFS2 is measured by a fine movement stage position measurement system 70C (refer to FIG. 3). Measurement results (measurement information) of wafer stage position measurement systems 16A and 16B, and fine movement stage position measurement systems 70A, 70B, and 70C are supplied to math controller 20 (refer to FIG. 3) for position control of coarse movement stage WCS1, fine movement stage WFS1, coarse movement stage WCS2, and fine movement stage WFS2.

Like coarse movement stage WCS1 and WCS2, relay stage DRST is supported by levitation above base board 12 by a plurality of non-contact bearings (e.g., air bearings (omitted in drawings)) provided on its bottom surface, and is driven in the XY two-dimensional direction by a relay stage drive system 53 (refer to FIG. 3).

Positional information (also including rotation information in the θz direction) in the XY plane of relay stage DRST is measured by a position measurement system (not shown) including, for example, an interferometer and/or an encoder and the like. The measurement results of the position measurement system are supplied to main controller 20 for position control of relay stage MST.

Figure 5:
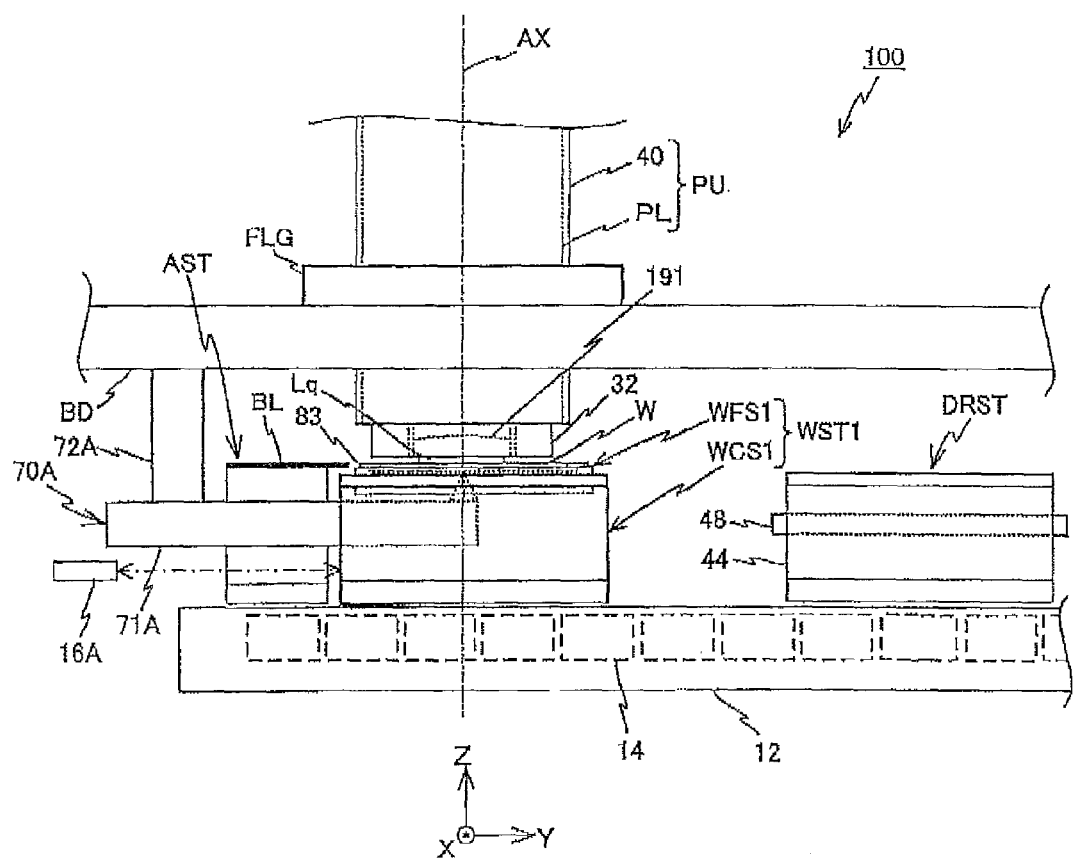

Furthermore, although illustration is omitted in FIG. 1, as shown in FIG. 5, exposure apparatus 100 of the embodiment is equipped with an auxiliary stage AST that has a blade BL, in the vicinity of projection unit PU. Auxiliary stage AST, as it can be seen from FIG. 5, is supported by levitation above base board 12 by a plurality of non-contact bearings (e.g., air bearings (omitted in drawings)) provided on its bottom surface, and is driven in the XY two-dimensional direction by an auxiliary stage drive system 58 (not shown in FIG. 5, refer to FIG. 3).

Configuration and the like of each of the parts configuring the stage system including the various measurement systems described above will be explained in detail, later on.

Moreover, in exposure apparatus 100 of the embodiment, a multiple point focal point position detection system (hereinafter shortly referred to as a multipoint AF system) AF (not shown in FIG. 1, refer to FIG. 3) by the oblique incidence method having a similar configuration as the one disclosed in, for example, U.S. Pat. No. 5,448,332 and the like, is arranged in the vicinity of projection unit PU. Detection signals of multipoint AF system AF are supplied to main controller 20 (refer to FIG. 3) via an AF signal processing system (not shown). Main controller 20 detects positional information (surface position information) of the wafer W surface in the Z-axis direction at a plurality of detection points of the multipoint AF system AF based on detection signals of multipoint AF system AF, and, performs a so-called focus leveling control of wafer W during the scanning exposure based on the detection results. Incidentally, positional information (unevenness information) of the wafer W surface can be acquired in advance at the time of wafer alignment (EGA) by arranging the multipoint AF system in the vicinity of aligner 99 (alignment systems AL1, and AL2$_1$ to AL2$_4$), the so-called focus leveling control of wafer W can be performed at the time of exposure, using the surface position information and measurement values of a laser interferometer system 75 (refer to FIG. 3) configuring a part of fine movement stage position measurement system 70A which will be described later on. In this case, multipoint AF system does not have to be provided in the vicinity of projection unit PU. Incidentally, measurement values of an encoder system 73 which will be described later configuring fine movement stage position measurement system 70A can also be used, rather than laser interferometer system 75 in focus leveling control.

Further, as is disclosed in detail in, for example, U.S. Pat. No. 5,646,413 and the like, a pair of reticle alignment systems RA$_1$ and RA$_2$ (reticle alignment system. RA$_2$ is hidden behind reticle alignment system RA$_1$ in the depth of the page surface in FIG. 1.) of an image processing method that has an imaging device such as a CCD and the like and uses a light (in the embodiment, illumination light IL) of the exposure wavelength as an illumination light for alignment is placed above reticle stage RST. The pair of reticle alignment systems RA$_1$ and RA$_2$ is used, in a state where a measurement plate to be described later on fine movement stage WFS1 (or WFS2) is positioned directly below projection optical system PL with main controller 20 detecting a projection image of a pair of reticle alignment marks (omitted in drawings) formed on reticle R and a corresponding pair of first fiducial marks on the measurement plate via projection optical system PL, to detect a detection center of a projection area of a pattern of reticle R and a reference position on the measurement plate using projection optical system PL, namely to detect a positional relation with a center of the pair of first fiducial marks. Detection signals of reticle alignment detection systems RA$_1$, and RA$_2$ are supplied to main controller 20 (refer to FIG. 3) via a signal processing system (not shown). Incidentally, reticle alignment systems RA$_1$ and RA$_2$ do not have to be provided. In this case, it is desirable for fine movement stage WFS to have a detection system in which a light transmitting section (light-receiving section) is installed so as to detect a projection image of the reticle alignment mark, as disclosed in, for example, U.S. Patent Application Publication No. 2002/0041377 and the like.

FIG. 3 shows a block diagram showing an input/output relation of main controller 20, which centrally configures a control system of exposure apparatus 100 and has overall control over each part. Main controller 20 includes a workstation (or a microcomputer) and the like, and has overall control over each part of exposure apparatus 100, such as local liquid immersion device 8, coarse movement stage drive systems 51A and 51B, fine movement stage drive systems 52A and 52B, and relay stage drive system 53 and the like previously described.

Now, a configuration and the like of each part of the stage systems will be described in detail. First of all, wafer stages WST1 and WST2 will be described. In the embodiment, wafer stage WST1 and wafer stage WST2 are configured identically, including the drive system, the position measurement system and the like. Accordingly, in the following description, wafer stage WST1 will be taken up and described, representatively.

Figure 2B:
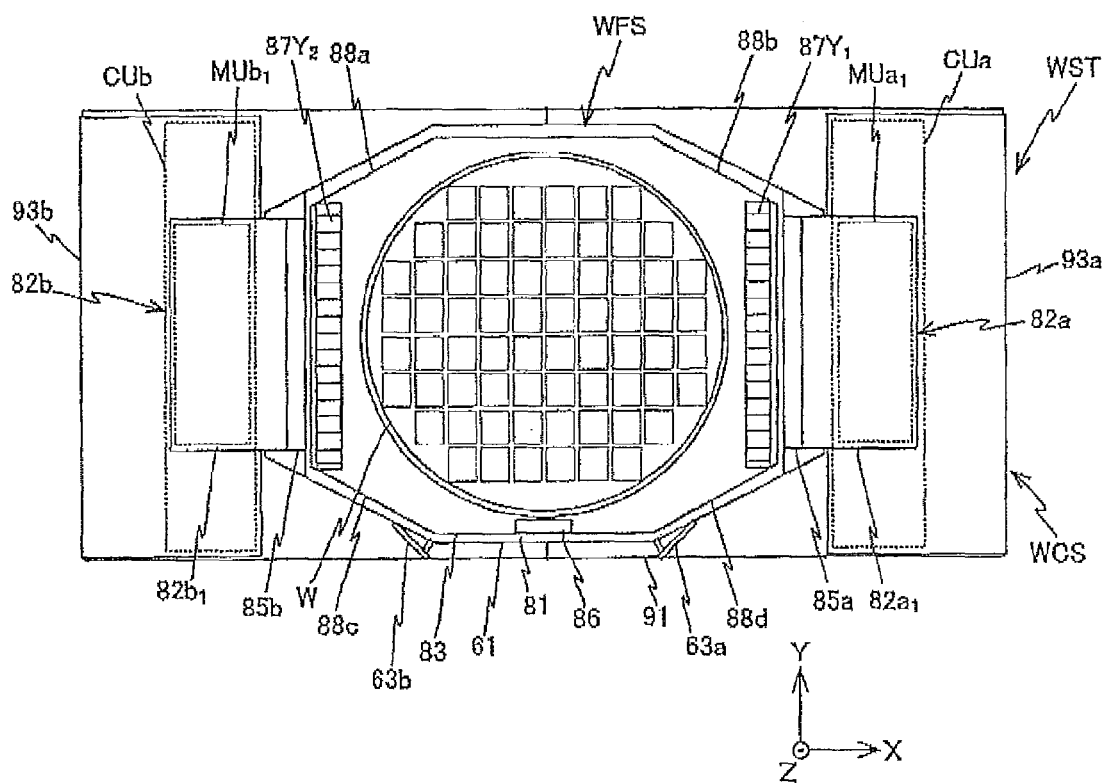
FIG. 2B is the wafer stage shown in a planar view.

As shown in FIGS. 2A and 2B, coarse movement stage WCS1 is equipped with a rectangular plate shaped coarse movement slides section 91 whose longitudinal direction is in the X-axis direction in a planar view (when viewing from the +Z direction), a rectangular plate shaped pair of side wall sections 92a and 92b which are each fixed on the upper surface of coarse movement slider section 91 on one end and the other end in the longitudinal direction in a state parallel to the YZ surface, with the Y-axis direction serving as the longitudinal direction, and a pair of stator sections 93a and 93b that are each fixed on the upper surface of side wall sections 92a and 92b. As a whole, coarse movement stage WCS1 has a box like shape having a low height whose upper surface in a center in the X-axis direction and surfaces on both sides in the Y-axis direction are open. More specifically, in coarse movement stage WCS1, a space is formed inside penetrating in the Y-axis direction. To surfaces (inner side surfaces) facing each other of side wall sections 92a and 92b, mirror-polishing is applied, so as to form reflection surfaces. Incidentally, instead of forming a reflection surface, a reflection mirror consisting of a plane mirror can be fixed.

Figure 6:
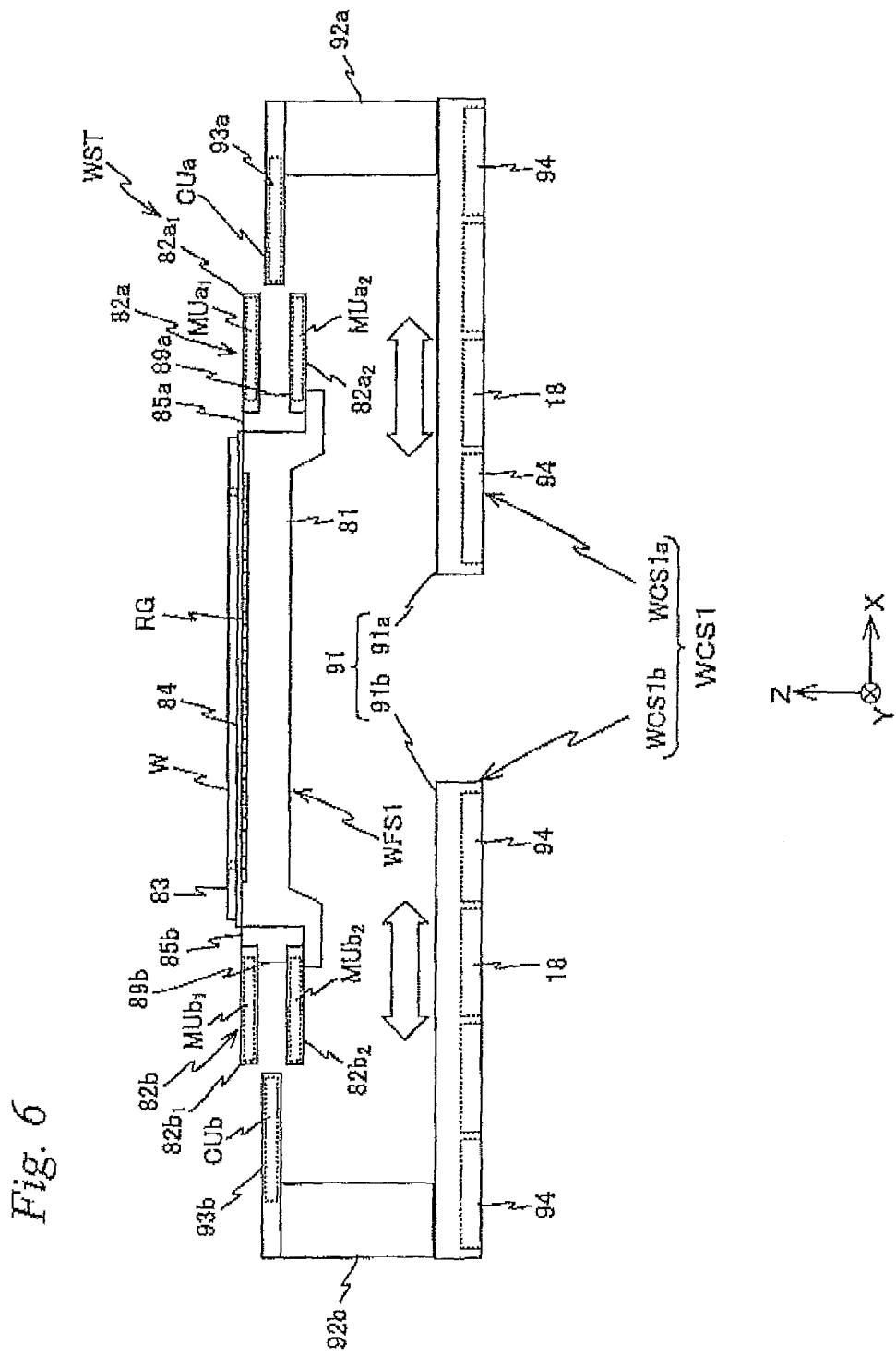
FIG. 6 is a view used to explain a separation structure of a coarse movement stage.

As shown in FIG. 6, coarse movement stage WSC1 is configured separable into two sections, which are a first section WCS1a and a second section WCS1b, with a separation line in the center in the longitudinal direction of coarse movement slider section 91 serving as a boundary. Accordingly, coarse movement slider section 91 is configured of a first slider section 91a which structures a part of the first section WCS1a, and a second slider section 91b which structures a part of the second section WCS1b.

Inside base 12, a coil unit is housed, including a plurality of coils 14 placed in the shape of a matrix with the XY two-dimensional direction serving as a row direction and a column direction, as shown in FIG. 1.

In correspondence with the coil unit, on the bottom surface of coarse movement stage WCS1, or more specifically, on the bottom surface of the first slider section 91a and the second slider section 91b, a magnet unit is provided consisting of a plurality of permanent magnets 18 placed in the shape of a matrix with the XY two-dimensional direction serving as a row direction and a column direction, as shown in FIG. 2A. The magnet unit configures coarse movement stage drive systems 51Aa and 51Ab (refer to FIG. 3), consisting of a planar motor employing a Lorentz electromagnetic drive method as is disclosed in, for example, U.S. Pat. No. 5,196,745, along with the coil unit of base board 12. The magnitude and direction of current supplied to each of the coils 14 configuring the coil unit are controlled by main controller 20 (refer to FIG. 3).

On the bottom surface of each of the first slider section 91a and the second slider section 91b, a plurality of air bearings 94 is fixed around the magnet unit described above. The first section WCS1a and the second section WCS1b of coarse Movement stage WCS1 are each supported by levitation above base board 12 by a predetermined clearance, such as around several μm, by air bearings 94, and are driven in the X-axis direction, the Y-axis direction, and the θz direction by coarse movement stage drive systems 51Aa and 51Ab.

The first section WCS1a and the second section WCS1b are normally locked integrally, via a lock mechanism (not shown). More specifically, the first section WCS1a and the second section WCS1b normally operate integrally. Therefore, in the following description, a drive system consisting of a planar motor that drives coarse movement stage WCS1, which is made so that the first section WCS1a and the second section WCS1b are integrally formed, will be referred to as a coarse movement stage drive system 51A (refer to FIG. 3).

Incidentally, as coarse movement stage drive system 51A, the drive method is not limited to the planar motor using the Lorentz electromagnetic force drive method, and for example, a planar motor by a variable reluctance drive system can also be used. Besides this, coarse movement stage drive system 51A can be configured by a planar motor of a magnetic levitation type. In this case, the air bearings will not have to be arranged on the bottom surface of coarse movement slider section 91.

The pair of stator sections 93a and 93b is each made of a member with a tabular outer shape, and in the inside, coil units CUa and CUb are housed consisting of a plurality of coils to drive fine movement stage WFS1 (or WFS2). The magnitude and direction of current supplied to each of the coils configuring coil units CUa and CUb are controlled by main controller 20 (refer to FIG. 3). The configuration of coil units CUa and CUb will be described further, later in the description. While fine movement stage WFS1 and fine movement stage WFS2 are configured identically, and are supported and driven similarly in a non-contact manner by coarse movement stage WCS1 in this case, in the following description, fine movement stage WFS1 will be taken up and described, representatively.

As shown in FIGS. 2A and 2B, the pair of stator sections 93a and 93b each have a rectangle tabular shape whose longitudinal direction is in the Y-axis direction. Stator section 93a has an end on the +X side fixed to the upper surface of side wall section 92a, and stator section 93b has an end on the −X side fixed to the upper surface of side wall section 92b.

As shown in FIGS. 2A and 2B, fine movement stage WFS1 is equipped with a main body section 81 consisting of an octagonal plate shape member whose longitudinal direction is in the X-axis direction in a planar view, and a pair of mover sections 82a and 82b that are each fixed to one end and the other end of main body section 81 in the longitudinal direction.

Main body section 81 is formed of a transparent material through which light can pass, so that a measurement beam (a laser beam) of an encoder system which will be described later can proceed inside the main body section. Further, main body section 81 is formed solid (does not have any space inside) in order to reduce the influence of air fluctuation to the laser beam inside the main body section. Incidentally, it is preferable for the transparent material to have a low thermal expansion, and as an example in the embodiment, synthetic quarts (glass) is used. Incidentally, main body section 82 can be structured all by the transparent material or only the section which the measurement beam of the encoder system passes through can be structured by the transparent material, and only the section which this measurement beam passes through can be formed solid.

In the center of the upper surface of main body section 81 (to be more precise, a cover glass which will be described later) of fine movement stage WFS1, a wafer holder (not shown) is arranged which holds wafer W by vacuum suction or the like. In the embodiment, for example, a wafer holder of a-so-called pin chuck method on which a plurality of support sections (pin members) supporting wafer W are formed within a loop shaped projecting section (rim section) is used, and grating RG to be described later is provided on the other surface (rear surface) of the wafer holder whose one surface (surface) is a wafer mounting surface. Incidentally, the wafer holder can be formed integrally with fine movement stage WFS1, or can be fixed to main body section 81, for example, via an electrostatic chuck mechanism, a clamping mechanism, or by adhesion and the like. In the former case, grating RG is to be provided on a back surface side of fine movement stage WFS1.

Furthermore, on the upper surface of main body section 81 on the outer side of the wafer holder (mounting area of wafer W), as shown in FIGS. 2A and 2B, a plate (a liquid repellent plate) 83 is attached that has a circular opening one size larger than wafer W (the wafer holder) formed in the center, and also has an octagonal outer shape (contour) corresponding to main body section 81. Plate 83 is made of a material with a low coefficient of thermal expansion, such as glass or ceramics (e.g., such as Zerodur (the brand name) of Schott AG, Al2O3, or TiC), and on the surface of plate 83, a liquid repellent treatment is applied. To be more specific, a liquid repellent film is formed, for example, by fluorine resin materials, fluorine series resin materials such as polytetrafluoroethylene (Teflon (registered trademark)), acrylic resin materials, or silicon series resin materials and the like. Plate 83 is fixed to the upper surface of main body section 81, so that its entire surface (or a part of its surface) becomes substantially flush with the surface of wafer W. Further, in plate 83, on the −Y side end of plate 83, as shown in FIG. 2B, a measurement plate 86, which has a narrow rectangular shape in the X-axis direction, is set in a state where its surface is substantially flush with the surface of plate 83, or more specifically, the surface of wafer W. On the surface of measurement plate 86, at least a pair of first fiducial marks detected by each of the pair of reticle alignment systems RA1 and RA2 and a second fiducial mark detected by primary alignment system AL1 are formed (both the first and second fiducial marks are omitted in the drawing). Incidentally, instead of attaching plate 83 to main body section 81, for example, the wafer holder can be formed integrally with fine movement stage WFS1, and a liquid repellent treatment can be applied to the upper surface of fine movement stage WFS1 in a periphery area (an area the same as plate 83 (can include the surface of measurement plate 86) surrounding the wafer holder.

As shown in FIG. 2A, on the upper surface of main body section 81, a two-dimensional grating (hereinafter merely referred to as a grating) RG is placed horizontally (parallel to the wafer W surface). Grating RG is fixed (or formed) on the upper surface of main body section 81 consisting of a transparent material. Grating RG includes a reflection diffraction grating (X diffraction grating) whose periodic direction is in the X-axis direction and a reflection diffraction grating (Y diffraction grating) whose periodic direction is in the Y-axis direction. In the embodiment, the area (hereinafter, forming area) on main body section 81 where the two-dimensional grating is fixed or formed, as an example, is in a circular shape which is one size larger than wafer W.

Grating RG is covered and protected with a protective member, such as, for example, a cover glass 84. In the embodiment, on the upper surface of cover glass 84, the holding mechanism (electrostatic chuck mechanism and the like) previously described to hold the wafer holder by suction is provided. Incidentally, in the embodiment, while cover glass 84 is provided so as to cover almost the entire surface of the upper surface of main body section 81, cover glass 84 can be arranged so as to cover only a part of the upper surface of math body section 81 which includes grating RG. Further, while the protective member (cover glass 84) can be formed of the same material as main body section 81, besides this, the protective member can be formed of, for example, metal or ceramics. Further, although a plate shaped protective member is desirable because a sufficient thickness is required to protect grating RG, a thin film protective member can also be used depending on the material.

Incidentally, of the forming area of grating RG, on a surface of cover glass 84 corresponding to an area where the forming area spreads to the periphery of the wafer holder, it is desirable, for example, to provide a reflection member (e.g., a thin film and the like) which covers the forming area, so that the measurement beam of the encoder system irradiated on grating RG does not pass through cover glass 84, or more specifically, so that the intensity of the measurement beam does not change greatly in the inside and the outside of the area on the rear surface of the wafer holder.

Moreover, the other surface of the transparent plate which has grating RG fixed or formed on one surface can be placed in contact or in proximity to the rear surface of the wafer holder and a protective member (cover glass 84) can also be provided on the one surface side of the transparent plate, or, the one surface of the transparent plate which has grating RG fixed or formed can be placed in contact or in proximity to the rear surface of the wafer holder, without having the protective member (cover glass 84) arranged. Especially in the former case, grating RG can be fixed to or formed on an opaque member such as ceramics instead of the transparent plate, or grating RG can be is fixed to or formed on the rear side of the wafer holder. Or, the hold wafer holder and grating RG can simply be held by a conventional fine movement stage. Further, the wafer holder can be made of a solid glass member, and grating RG can be placed on the upper surface (a wafer mounting surface) of the glass member.

As it can also be seen from FIG. 2A, main body section 81 consists of an overall octagonal plate shape member that has an extending section which extends outside on one end and the other end in the longitudinal direction, and on its bottom surface, a recessed section is formed at the section facing grating RG. Main body section 81 is formed so that the center area where grating RG is arranged is formed in a plate shape whose thickness is substantially uniform.

On the upper surface of each of the extending sections on the +X side and the −X side of main body section 81, spacers 85a and 85b having a projecting shape when sectioned are provided, with each of the projecting sections 89a and 89b extending outward in the Y-axis direction.

As shown in FIGS. 2A and 2B, mover section 82a includes two plate-like members $82a_1$ and $82a_2$ having a rectangular shape in a planar view whose size (length) in the Y-axis direction and size (width) in the X-axis direction are both shorter than stator section 93a (around half the size). These two plate-like members $82a_1$ and $82a_2$ are both fixed parallel to the XY plane, in a state set apart only by a predetermined distance in the Z-axis direction (vertically), via projecting section 89a of spacer 85a previously described, with respect to the end on the +X side in the longitudinal direction of main body section 81. In this case, the −X side end of plate-like member $82a_2$ is clamped by spacer 85a and the extending section on the +X side of main body section 81. Between the two plate-like members $82a_1$ and $82a_2$, an end on the −X side of stator section 93a of coarse movement stage WCS1 is inserted in a non-contact manner. Inside plate-like members $82a_1$ and $82a_2$, magnet units $MUa_1$ and $MUa_2$ which will be described later are provided.

Mover section 82b includes two plate-like members $82b_1$ and $82b_2$ maintained at a predetermined distance in the Z-axis direction (vertically), and is configured in a similar manner with mover section 82a, although being symmetrical. Between the two plate-like members $82b_1$ and $82b_2$, an end on the +X side of stator section 93b of coarse movement stage WCS is inserted in a non-contact manner. Inside plate-like members $82b_1$ and $82b_2$, magnet units $MUb_1$ and $MUb_2$ are provided, which are configured similar to magnet units $MUa_1$ and $MUa_2$.

Now, as is previously described, because the surface on both sides in the Y-axis direction is open in coarse movement stage WCS1, when attaching fine movement stage WFS1 to coarse movement stage WCS1, the position of fine movement stage WFS1 in the Z-axis direction should be positioned so that stator section 93a, 93b are located between plate-like members $82a_1$ and $82a_2$, and $82b_1$ and $82b_2$, respectively, and then fine movement stage WFS1 can be moved (slid) in the Y-axis direction.

Further, as shown in FIG. 2B, in an area on one side and the other side in the X-axis direction (the lateral direction of the page surface in FIG. 2B) on the upper surface of plate 83, Y scales $87Y_1$ and $87Y_2$ are fixed, respectively. Y scales $87Y_1$ and $87Y_2$ are each composed of a reflective grating (for example, a one-dimensional diffraction grating) having a periodic direction in the Y-axis direction in which grid lines whose longitudinal direction is in the X-axis direction are placed in a predetermined pitch along a direction parallel to the Y-axis (the Y-axis direction).

Y scales $87Y_1$ and $87Y_2$ are made, with graduations of the diffraction grating marked, for example, in a pitch between 138 nm to 4 μm, such as a pitch of 1 μm, on a thin plate shaped glass. A liquid repellent treatment against liquid Lq is applied to the surface of these scales. Incidentally, the pitch of the grating is shown much wider in FIG. 2B than the actual pitch, for the sake of convenience. The same is true also in other drawings. Incidentally, the type of diffraction gratings used for Y scales $87Y_1$ and $87Y_2$ are not limited to the diffraction grating made up of grooves or the like that are mechanically formed, and for example, can also be a grating that is created by exposing interference fringe on a photosensitive resin. Further, in order to protect the diffraction grating, the diffraction grating can be covered with a glass plate with low thermal expansion that has water repellency so that the surface of the glass plate becomes the same height (surface position) as the Surface of the wafer.

Incidentally, near one end in the longitudinal direction of Y scales $87Y_1$ and $87Y_2$, a pattern for positioning (not shown) is arranged, respectively, to decide a relative position (to be described later) between an encoder head and a scale. The pattern for positioning is configured, for example, from grid lines that have different reflectivity, and when the encoder head scans the pattern, the intensity of the output signal of the encoder changes. Therefore, a threshold value is determined beforehand, and the position where the intensity of the output signal exceeds the threshold value is detected. Then, the relative position between the encoder head and each of the Y scales is set, with the detected position as a reference.

Further, as shown in FIG. 2B, mirror-polishing is applied to each inclined plane (a plane, which is perpendicular to the XY plane and is also inclined with respect to the X-axis and the Y-axis) formed on the four corners of plate 83, so as to form reflection surfaces 88a, 88b, 88c, and 88d for a laser interferometer system 79 (refer to FIG. 3) (to be described later). Incidentally, instead of forming the reflection surfaces described above, movable mirrors consisting of plane mirrors can be attached to plate 83.

Further, as shown in FIG. 2B, mirror-polishing is applied to the side surface on the −Y side of main body section 81 of fine movement stage WFS1 (and fine movement stage WFS2), so that a reflection surface 61 for fine movement stage position measurement system 70D (refer to FIG. 3) (to be described later) is formed. Incidentally, instead of forming reflection surface 61, a movable mirror consisting of a plane mirror can be attached to main body section 81. Further, to two side surfaces (inclined planes) that have reflection surface 61 of main body section 81 of fine movement stage WFS1 (and fine movement stage WFS2) arranged in between, movable mirrors 63a and 63b consisting of plane mirrors for fine movement stage position measurement system 70D (to be described later) are fixed. The reflection surfaces of movable mirrors 63a and 63b are each perpendicular to the XY plane, and also form an angle, for example, of 45 degrees, with respect to the XZ plane.

Next, a configuration of fine movement stage drive system 52A to relatively drive fine movement stage WFS1 with respect to coarse movement stage WCS1 will be described.

Fine movement stage drive system 52A includes the pair of magnet units $MUa_1$ and $MUa_2$ that mover section 82a previously described has, coil unit CUa that stator section 93a has, the pair of magnet units $MUb_1$ and $MUb_2$ that Mover section 82b has, and coil unit Cub that stator section 93b has.

This will be explained further in detail. As it can be seen from FIGS. 7, 8A, and 8B, at the end on the −X side inside stator section 93a, two lines of coil rows are placed a predetermined distance apart in the X-axis direction, which are a plurality of (in this case, twelve) YZ coils (hereinafter appropriately referred to as "coils") 55 and 57 that have a rectangular shape in a planar view and are placed equally apart in the Y-axis direction. YZ coil 55 has an upper part winding 55a and a lower part winding 55b in a rectangular shape in a planar view that are disposed such that they overlap in the vertical direction (the Z-axis direction). Further, between the two lines of coil rows described above inside stator section 93a, en X coil (hereinafter shortly referred to as a "coil" as appropriate) 56 is placed, which is narrow and has a rectangular shape in a planar view and whose longitudinal direction is in the Y-axis direction. In this case, the two lines of coil rows and X coil 56 are planed equally spaced in the X-axis direction. Coil unit CUa is configured including the two lines of coil rows and X coil 56.

Incidentally, in the description below, while one of the stator sections 93a of the pair of stator sections 93a and 93b and mover section 82a supported by this stator section 93a will be described using FIGS. 7 to 9C, the other (the −X side) stator section 93b and mover section 82b will be structured similar to these sections and will function in a similar manner. Accordingly, coil unit Cub, and magnet units $MUb_1$ and $MUb_2$ are structured similar to coil unit CUa, and magnet units $MUa_1$ and $MUa_2$.

Figure 7:
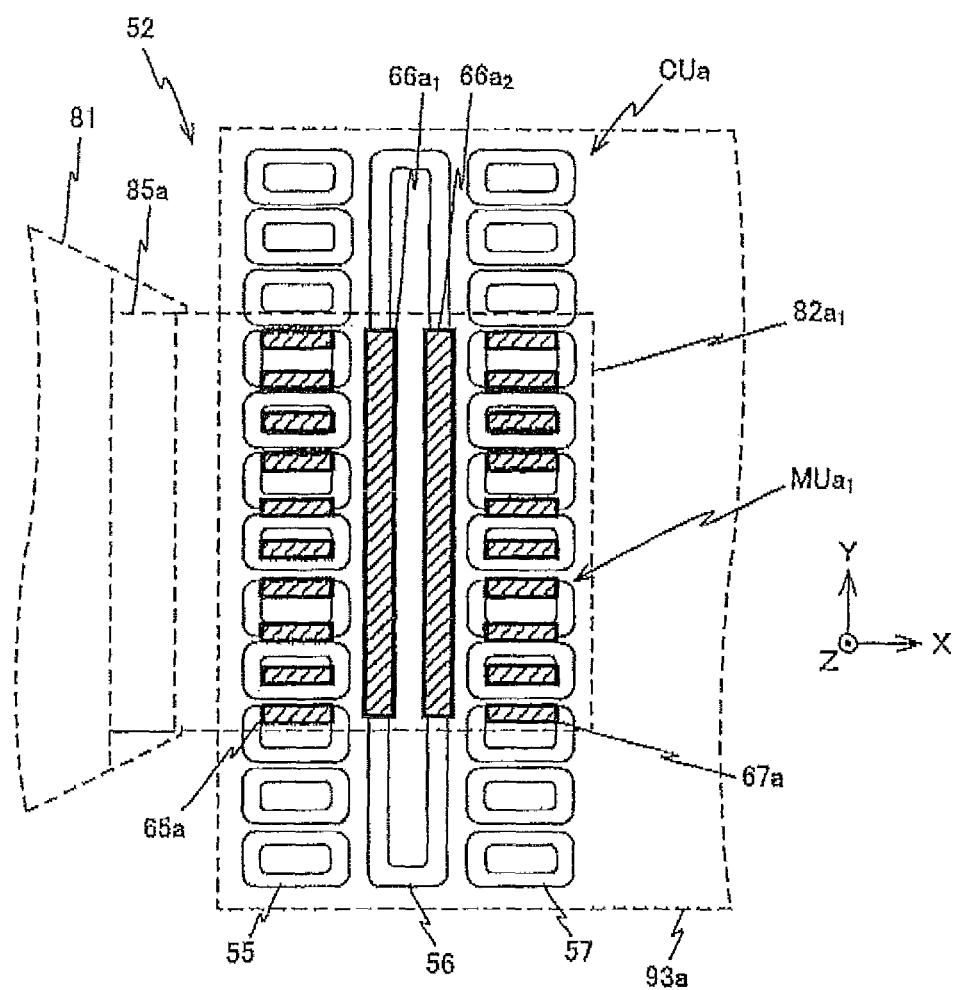
FIG. 7 is a planar view showing a placement of a magnet unit and a coil unit that structure a fine movement stage drive system.
Figure 8A:
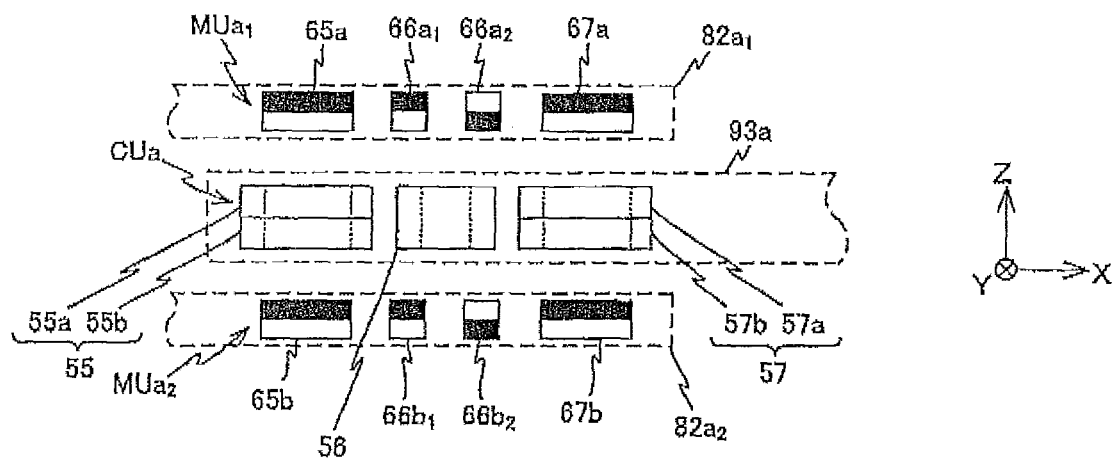
FIG. 8A is a side view showing a placement of a magnet unit and a coil unit that structure a fine movement stage drive system when viewed from the −Y direction.
Figure 8B:
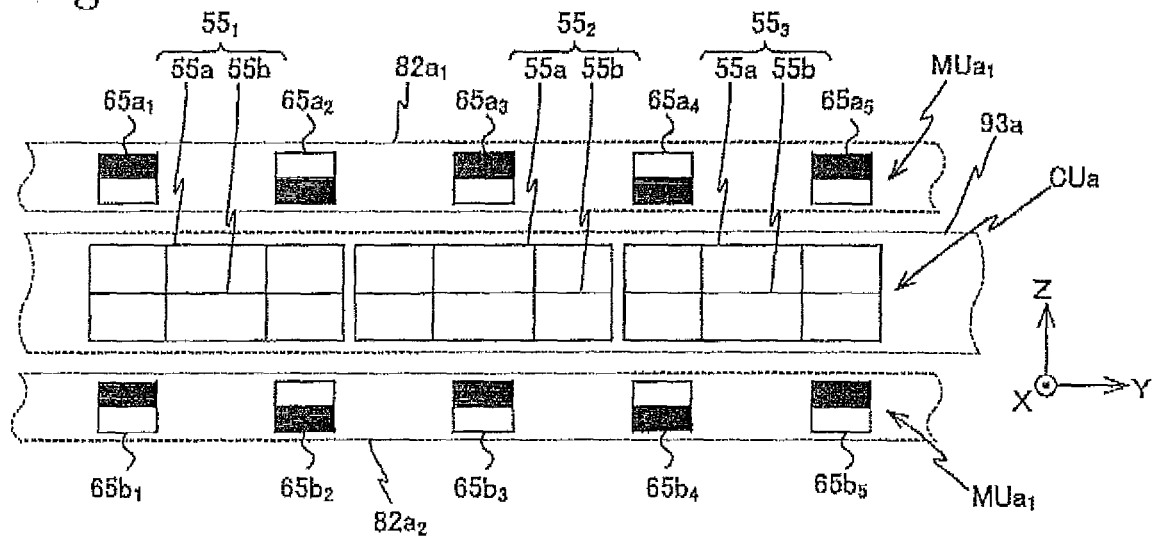
FIG. 8B is a side view showing a placement of a magnet unit and a coil unit that structure a fine movement stage drive system when viewed from the +X direction.

Inside plate-like member 82a1 on the +Z side configuring a part of movable section 82a of fine movement stage WFS1, as it can be seen when referring to FIGS. 7, 8A, and 8B, two lines of magnet rows are placed a predetermined distance apart in the X-axis direction, which are a plurality of (in this case, ten) permanent magnets 65a and 67a that have a rectangular shape in a planar view and whose longitudinal direction is in the X-axis direction. The two lines of magnet rows are placed facing coils 55 and 57, respectively.

As shown in FIG. 8B, the plurality of permanent magnets 65a are configured such that permanent magnets whose upper surface sides (+Z sides) are N poles and the lower surface sides (−Z sides) are S poles and permanent magnets whose upper surface sides (+Z sides) are S poles and the lower surface sides (−Z sides) are N poles are arranged alternately in the Y-axis direction. The magnet row consisting of the plurality of permanent magnets 67a is structured similar to the magnet row consisting of the plurality of permanent magnets 65a.

Further, between the two lines of magnet rows described above inside plate-like member $82a_1$, a pair (two) of permanent magnets $66a_1$ and $66a_2$ whose longitudinal direction is in the Y-axis direction is placed set apart in the X axis direction, facing coil 56. As shown in FIG. 8A, permanent magnet $66a_1$ is configured such that its upper surface side (+Z side) is an N pole and its lower surface side (−Z side) is an S pole, whereas with permanent magnet $66a_2$, its upper surface side (+Z side) is an S pole and its lower surface side (−Z side) is an N pole.

Magnet unit $Ma_1$ is configured by the plurality of permanent magnets 65a and 67a, and $66a_1$ and $66a_2$ described above.

As shown in FIG. 8A, also inside plate-like member $82a_2$ on the −Z side, permanent magnets 65b, $66b_1$, $66b_2$, and 67b are placed in a placement similar to plate-like member $82a_1$ on the +Z side described above. Magnet unit $MUa_2$ is configured by these permanent magnets 65b, $66b_2$, $66b_2$, and 67b. Incidentally, in FIG. 7, permanent magnets 65b, $66b_1$, $66b_2$, and 67b inside plate-like members $82a_2$ on the −Z side are placed in the depth of the page surface, with magnets 65a, $66a_1$, $66a_2$, and 67a placed on top.

Now, with fine movement stage drive system 52A, as shown in FIG. 8B, positional relation (each distance) in the Y-axis direction between the plurality of permanent magnets 65 and the plurality of YZ coils 55 is set so that when in the plurality of permanent magnets (in FIG. 8B, permanent magnets $65a_1$ to $65a_5$ which are sequentially arranged along the Y-axis direction) placed adjacently in the Y-axis direction, two adjacent permanent magnets $65a_1$ and $65a_2$ each face the winding section of YZ $55_1$, then permanent magnet $65a_3$ adjacent to these permanent magnets does not face the winding section of YZ coil $55_2$ adjacent to YZ coil $55_1$ described above (so that permanent magnet $65a_3$ faces the hollow center in the center of the coil, or faces a core, such as an iron core, to which the coil is wound). Incidentally, as shown in FIG. 8B, permanent magnets $65a4$ and $65a_5$ each face the winding section of YZ coil $55_3$, which is adjacent to YZ coil $55_2$. The distance between permanent magnets 65b, 67a, and 67b in the Y-axis direction is also similar (refer to FIG. 8B).

Figure 9A:
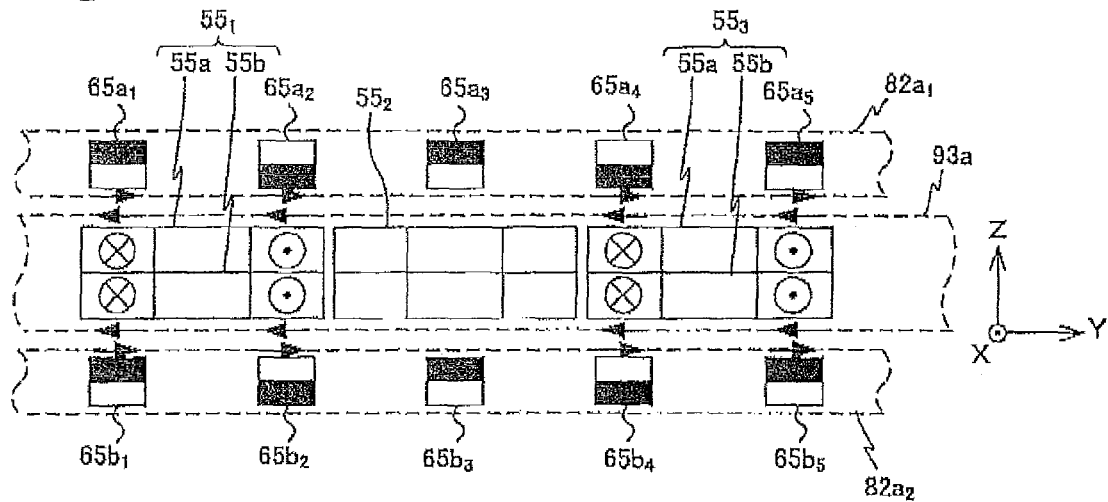
FIG. 9A is a view used to explain a drive principle when a fine movement stage is driven in the Y-axis direction.

Accordingly, in fine movement stage drive system 52A, as an example, when a clockwise electric current when viewed from the +Z direction is supplied to the upper part winding and the lower part winding of coils $55_1$ and $55_3$, respectively, as shown in FIG. 9A in a state shown in FIG. 8B, a force (Lorentz force) in the −Y direction acts on coils $55_1$ and $55_3$, and as a reaction force, a force in the +Y direction acts on permanent magnets 65a and 65b. By these action of forces, fine movement stage WFS1 moves in the +Y direction with respect to coarse movement stage WCS1. When a counter-clockwise electric current when viewed from the +Z direction is supplied to each of the coils $55_1$ and $55_3$ conversely to the case described above, fine movement stage WFS1 moves in the −Y direction with respect to coarse movement stage WCS1.

By supplying an electric current to coil 57, electromagnetic interaction is performed between permanent magnet 67 (67a, 67b) and fine movement stage WFS1 can be driven in the Y-axis direction. Main controller 20 controls a position of fine movement stage WFS1 in the Y-axis direction by controlling the current supplied to each coil.

Figure 9B:
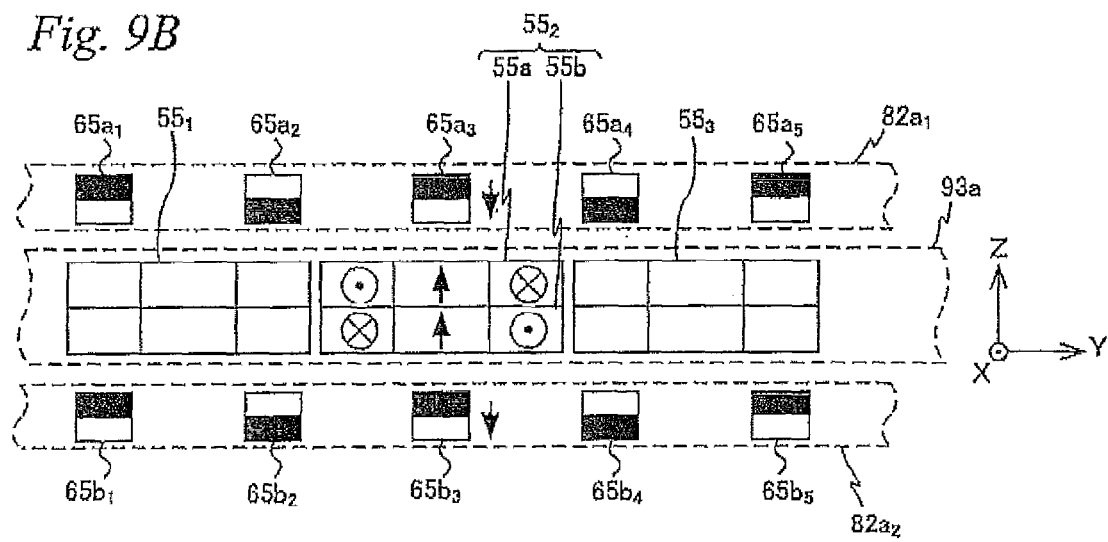
FIG. 9B is a view used to explain a drive principle when a fine movement stage is driven in the Z-axis direction.

Further, in fine movement stage drive system 52A, as an example, when a counterclockwise electric current when viewed from the +Z direction is supplied to the upper part winding of coil $55_2$ and a clockwise electric current when viewed from the +Z direction is supplied to the lower part winding as shown in FIG. 9 in a state shown in FIG. 8B, an attraction force is generated between coil $55_2$ and permanent magnet $65a3$ whereas a repulsive force (repulsion) is generated between coil $55_2$ and permanent magnet $65b_3$, respectively, and by these attraction force and repulsive force, fine movement stage WFS1 is moved downward (−Z direction) with respect to coarse movement stage WSC1, or more particularly, moved in a descending direction. When a current in a direction opposite to the case described above is supplied to the upper part winding and the lower part winding of coil $55_2$, respectively, fine movement stage WFS1 moves upward (+Z direction) with respect to coarse movement stage WCS1, or more particularly, moves in an upward direction. Main controller 20 controls a position of fine movement stage WFS1 in the Z-axis direction which is in a levitated state by controlling the current supplied to each coil.

Figure 9C:
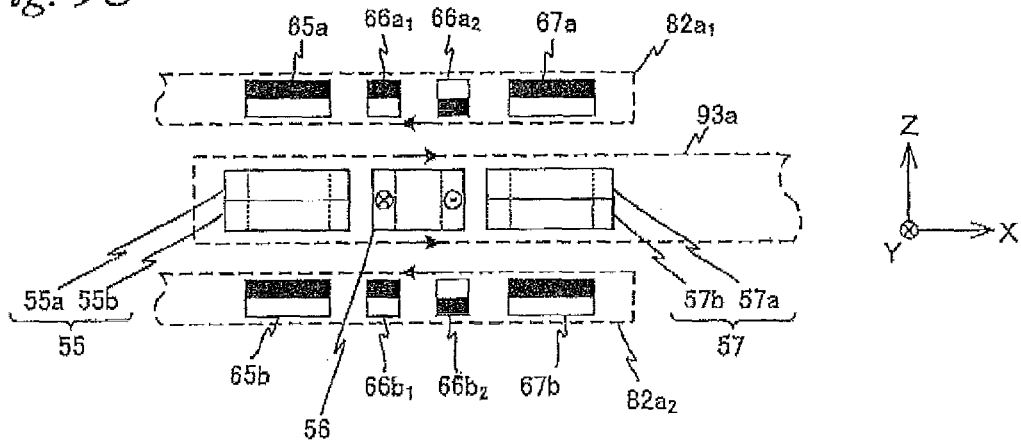
FIG. 9C is a view used to explain a drive principle when a fine movement stage is driven in the X-axis direction.

Further, in a state shown in FIG. 8A, when a clockwise electric current when viewed from the +Z direction is supplied to coil 56, a force in the +X direction acts on coil 56 as shown in FIG. 9C, and as its reaction, a force in the −X direction acts on permanent magnets $66a_1$ and $66a_2$, and $66b_1$ and $66b_2$, respectively, and fine movement stage WFS1 is moved in the −X direction with respect to coarse movement stage WSC1. Further, when a counterclockwise electric current when viewed from the +Z direction is supplied to coil 56 conversely to the case described above, a force in the +X direction acts on permanent magnets $66a_1$ and $66a_2$, and $66b_1$ and $66b_2$, and fine movement stage WFS1 is moved in the +X direction with respect to coarse movement stage WCS1. Main controller 20 controls a position of fine movement stage WFS1 in the X-axis direction by controlling the current supplied to each coil.

As is obvious from the description above, in the embodiment, main controller 20 drives fine movement stage WFS1 in the Y-axis direction by supplying an electric current alternately to the plurality of YZ coils 55 and 57 that are arranged in the Y-axis direction. Further, along with this, by supplying electric current to coils of YZ coils 55 and 57 that are not used to drive fine movement stage WFS1 in the Y-axis direction, main controller 20 generates a drive force in the Z-axis direction separately from the drive force in the Y-axis direction and makes fine movement stage WFS1 levitate from coarse movement stage WCS1. And, main controller 20 drives fine movement stage WFS1 in the Y-axis direction while maintaining the levitated state of fine movement stage WFS1 with respect to coarse movement stage WCS1, namely a noncontact state, by sequentially switching the coil subject to current supply according to the position of fine movement stage WFS1 in the Y-axis direction. Further, main controller 20 can also drive fine movement stage WFS1 independently in the X-axis direction along with the Y-axis direction, in a state where fine movement stage WFS1 is levitated from coarse movement stage WCS1.

Figure 10A:
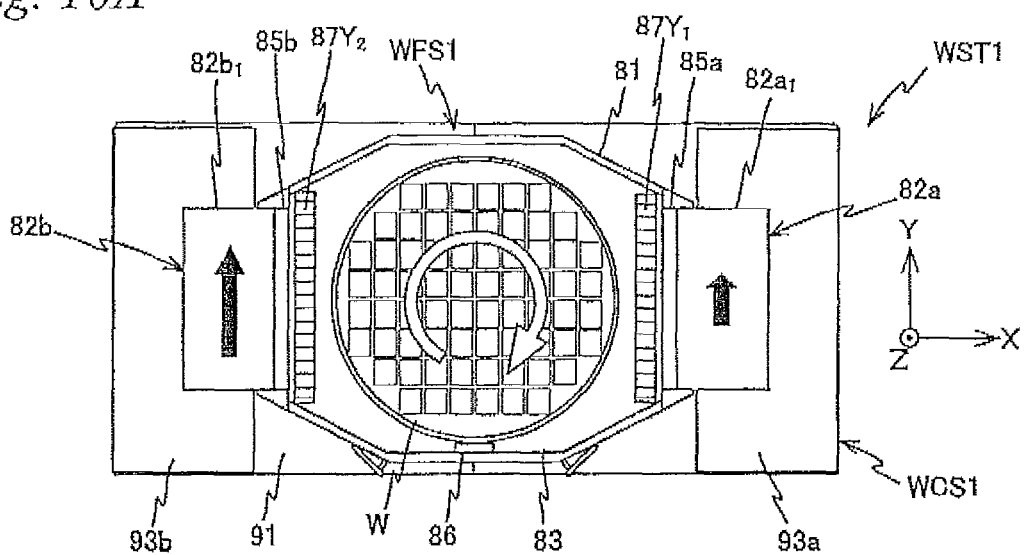
FIG. 10A is a view used to explain an operation when a fine movement stage is rotated around the Z-axis with respect to a coarse movement stage.

Further, as shown in FIG. 10A, for example, main controller 20 can make fine movement stage WFS1 rotate around the Z-axis (θz rotation) (refer to the outlined arrow in FIG. 10A), by applying a drive force (thrust) in the Y-axis direction having a different magnitude to both mover section 82a on the +X side and mover section 82b on the −X side of fine movement stage WFS1 (refer to the black arrow in FIG. 10A). Incidentally, in contrast with FIG. 10A, by making the drive force applied to mover section 82a on the +X side larger than the −X side, fine movement stage WFS1 can be made to rotate counterclockwise with respect to the Z-axis.

Figure 10B:
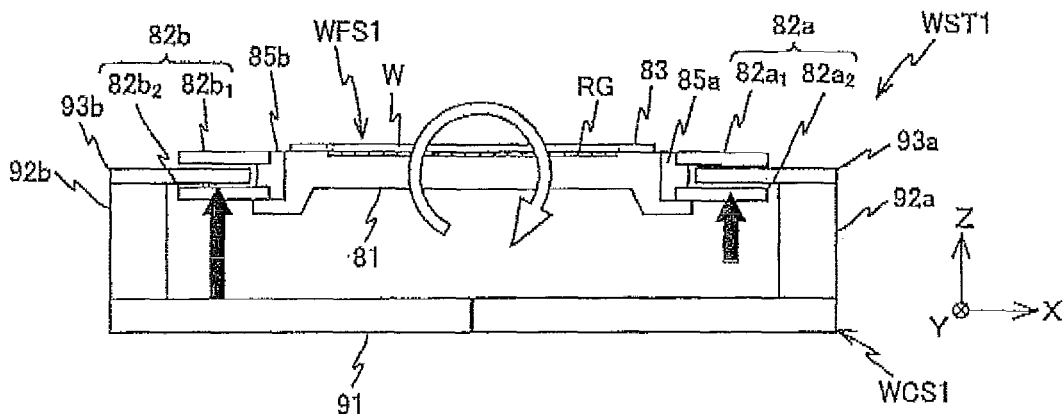
FIG. 10B is a view used to explain an operation when a fine movement stage is rotated around the Y-axis with respect to a coarse movement stage.

Further, as shown in FIG. 10B, main controller 20 can make fine movement stage WFS1 rotate around the Y-axis (θy drive) (refer to the outlined arrow in FIG. 10B), by applying a different levitation force (refer to the black arrows in FIG. 10B) to both mover section 82a on the +X side and mover section 82b on the −X side of fine movement stage WFS1. Incidentally, in contrast with FIG. 10B, by making the levitation force applied to mover section 82a on the +X side larger than the −X side, fine movement stage WFS1 can be made to rotate counterclockwise with respect to the Y-axis.

Figure 10C:
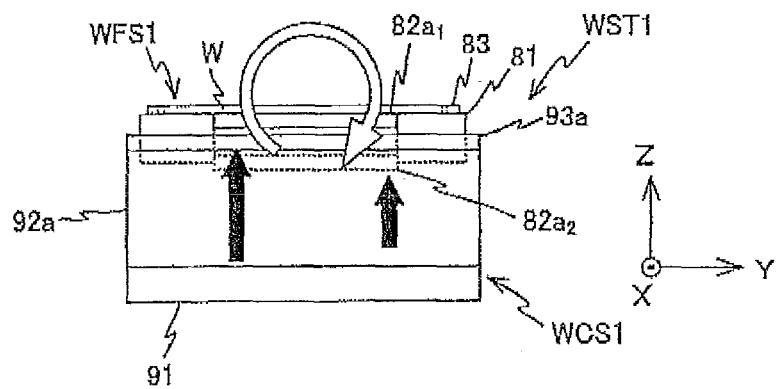
FIG. 10C is a view used to explain an operation when a fine movement stage is rotated around the X-axis with respect to a coarse movement stage.

Further, as shown in FIG. 10C, for example, main controller 20 can make fine movement stage WFS1 rotate around the X-axis (θx drive) (refer to the outlined arrow in FIG. 10C), by applying a different levitation force to both mover sections 82a and 82b of fine movement stage WFS1 on the + side and the − side in the Y-axis direction (refer to the black arrow in FIG. 10C). Incidentally, in contrast with FIG. 10C, by making the levitation force applied to mover section 82a (and 82b) on the −Y side smaller than the levitation force on the +Y side, fine movement stage WFS1 can be made to rotate counterclockwise with respect to the X-axis.

As it can be seen from the description above, in the embodiment, fine movement stage drive system 52A supports fine movement stage WFS1 by levitation in a non-contact state with respect to coarse movement stage WCS1, and can also drive fine movement stage WFS1 in a non-contact manner in directions of six degrees of freedom (X, Y, Z, θx, θy, θz) with respect to coarse movement stage WCS1.

Figure 11:
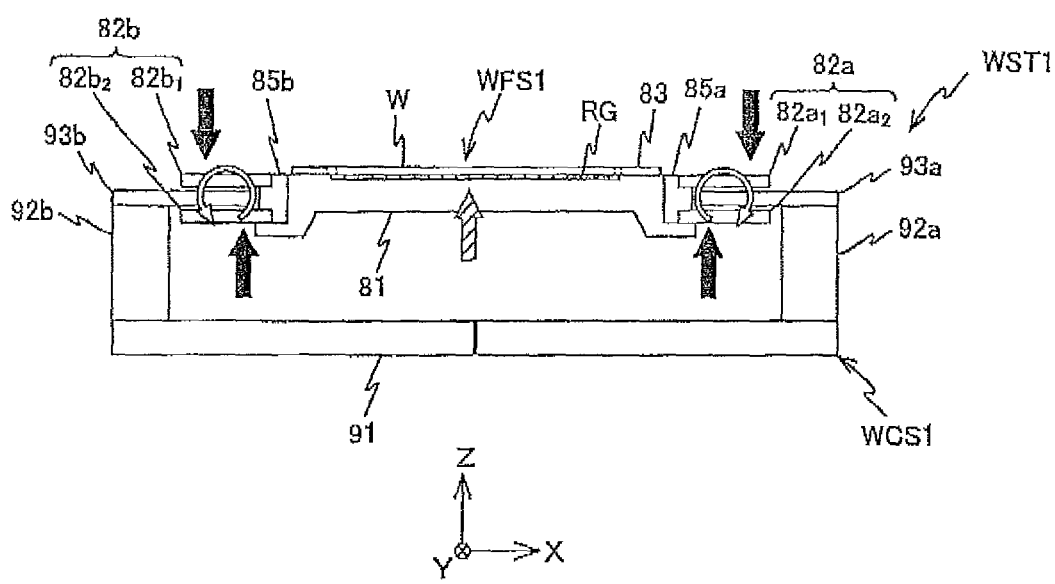
FIG. 11 is a view used to explain an operation when a center section of the fine movement stage is deflected in the +Z direction.

Further, in the embodiment, by supplying electric current to the two lines of coils 55 and 57 (refer to FIG. 7) placed inside stator section 93a in directions opposite to each other when applying the levitation force to fine movement stage WFS1, for example, main controller 20 can apply a rotational force (refer to the outlined arrow in FIG. 11) around the Y-axis simultaneously with the levitation force (refer to the black arrow in FIG. 11) with respect to mover section 82a, as shown in FIG. 11. Further, by applying a rotational force around the y-axis to each of the pair of mover sections 82a and 82b in directions opposite to each other, main controller 20 can deflect the center of fine movement stage WFS1 in the +Z direction or the −Z direction (refer to the hatched arrow in FIG. 11). Accordingly, as shown in FIG. 11, by bending the center of fine movement stage WFS1 in the +Z direction, the deflection in the middle part of fine movement stage WFS1 (main body section 81) in the X-axis direction due to the self-weight of wafer W and main body section 81 can be canceled out, and degree of parallelization of the wafer W surface with respect to the XY plane (horizontal surface) can be secured. This is particularly effective, in the case such as when the diameter of wafer W becomes large and fine movement stage WFS1 also becomes large.

Further, when wafer W is deformed by its own weight and the like, there is a risk that the surface of wafer W mounted on fine movement stage WFS1 will no longer be within the range of the depth of focus of projection optical system PL within the irradiation area (exposure area IA) of illumination light IL. Therefore, similar to the case described above where main controller 20 deflects the center in the X-axis direction of fine movement stage WFS1 to the +Z direction, by applying a rotational force around the Y-axis to each of the pair of mover sections 82a and 82b in directions opposite to each other, wafer W is deformed to be substantially flat, and the surface of wafer W within exposure area IA can fall within the range of the depth of focus of projection optical system PL. Incidentally, while FIG. 11 shows an example where fine movement stage WFS1 is bent in the +Z direction (a convex shape), fine movement stage WFS1 can also be bent in a direction opposite to this (a concave shape) by controlling the direction of the electric current supplied to the coils.

Incidentally, the method of making fine movement stage WFS1 (and wafer W held by this stage) deform in a concave shape or a convex shape within a surface (XZ plane) perpendicular to the Y-axis can be applied, not only in the case of correcting deflection caused by its own weight and/or focus leveling control, but also in the case of employing a super-resolution technology which substantially increases the depth of focus by changing the position in the Z-axis direction at a predetermined point within the range of the depth of focus, while the predetermined point within the shot area of wafer W crosses exposure area IA.

As is previously described, fine movement stage WFS2 is configured identical to fine movement stage WFS1 described above, and can be supported in a non-contact manner by coarse movement stage WCS1 instead of fine movement stage WFS1. In this case, coarse movement stage WCS1 and fine movement stage WFS2 supported by coarse movement stage WCS1 configure wafer stage WST1, and a pair of mover sections (one pair each of magnet units $MUa_1$ and $MUa_2$, and $MUb_1$ and $MUb_2$) equipped in fine movement stage WFS2 and a pair of stator sections 93a and 93b (coil units CUa and CUb) of coarse movement stage WCS1 configure fine movement stage drive system 52A. And by this fine movement stage drive system 52A, fine movement stage WFS2 is driven in a non-contact manner in directions of six degrees of freedom with respect to coarse movement stage WCS1.

Further, fine movement stages WFS2 and WFS1 can each make coarse movement stage WCS2 support them in a non-contact manner, and coarse movement stage WCS2 and fine movement stage WFS2 or WFS1 supported by coarse movement stage WCS2 configure wafer stage WST2. In this case, a pair of mover sections (one pair each of magnet units $MUa_1$ and $MUa_2$, and $MUb_1$ and $MUb_2$) equipped in fine movement stage WFS2 or WFS1 and a pair of stator sections 93a and 93b (coil units CUa and CUb) of coarse movement stage WCS2 configure fine movement stage drive system 52B (refer to FIG. 3). And by this fine movement stage drive system 52B, fine movement stage WFS2 or WFS1 is driven in a non-contact manner in directions of six degrees of freedom with respect to coarse movement stage WCS2.

Referring back to FIG. 1, relay stage DRST is equipped with a stage main section 44 configured similar to coarse movement stages WCS1 and WCS2 (however, it is not structured so that it can be divided into a first section and a second section), and a carrier apparatus 46 (refer to FIG. 3) provided inside stage main section 44. Accordingly, stage main section 44 can support (hold) fine movement stage WFS1 or WFS2 in a non-contact manner as in coarse movement stages WCS1 and WCS2, and the fine movement stage supported by relay stage DRST can be driven in directions of six degrees of freedom (X, Y, Z, θx, θy, and θz) by fine movement stage drive system 52C (refer to FIG. 3) with respect to relay stage DRST. However, the fine movement stage should be slidable at least in the Y-axis direction with respect to relay stage DRST.

Carrier apparatus 46 is equipped with a carrier member main section which is reciprocally movable in the Y-axis direction with a predetermined stroke along both of the side walls in the X-axis direction of stage main section 44 of relay stage DRST and is vertically movable also in the Z-axis direction with a predetermined stroke, a carrier member 48 including a movable member which can relatively move in the Y-axis direction with respect to the carrier member main section while holding fine movement stage WFS1 or WFS2, and a carrier member drive system 54 (refer to FIG. 3) which can individually drive the carrier member main section configuring carrier member 48 and the movable member. Carrier member drive system 54 individually drives the carrier member main section and the movable member, based on measurement values of a sensor (not shown) (e.g., an encoder) which measures a position in the Y-axis direction of the each of the carrier member main section and the movable member.

Now, in exposure apparatus 100 of the embodiment, main controller 20 performs delivery of fine movement stages WFS1 and WFS2 between coarse movement stages WCS1 and WCS2, reciprocally, via relay stage DRST. Delivery of fine movement stages WFS1 and WFS2 between coarse movement stages WCS1 and WCS2, reciprocally, in concrete terms, means, for example, switching from a first state (refer to FIG. 1) where fine movement stage WFS1 is supported by coarse movement stage WCS1 and fine movement stage WFS2 is supported by coarse movement stage WCS2, to a second state where fine movement stage WFS2 is supported by coarse movement stage WCS1 and fine movement stage WFS1 is supported by coarse movement stage WCS2, or conversely, switching from the second state to the first state.

In exposure apparatus 100 of the embodiment, at the time of exposure operation by the step-and-scan method to wafer W, and the time of alignment measurement of wafer W using aligner 99, positional information (including the positional information in the θz direction) in the XY plane of each of the fine movement stages WFS1 and WFS2 is measured by main controller 20 using encoder system 73 (refer to FIG. 3) of fine movement stage position measurement systems 70A and 70B. Positional information of each of the fine movement stages WFS1 and WFS2 is sent to main controller 20, which controls the position of each of the fine movement stages WFS1 and WFS2 based on this positional information.

In contrast to this, when fine movement stage WFS1 (or WFS2) is delivered from coarse movement stage WCS2 to coarse movement stage WCS1 via relay stage DRST, the positional information of fine movement stage WFS1 (or WFS2) in the XY plane is measured by main controller 20 using fine movement stage position measurement system 70C (refer to FIG. 3), which includes an encoder system 78 and laser interferometer system 79. The concrete configuration of fine movement stage position measurement system 70C will be described, later in the description.

Further, when fine movement stage WFS1 (or WFS2) is delivered from coarse movement stage WCS1 to coarse movement stage WCS2 via relay stage DRST, the positional information of fine movement stage WFS1 (or WFS2) in the XY plane is measured by main controller 20 using fine movement stage position measurement system 70D (refer to FIG. 3), which mainly includes a laser interferometer system. The concrete configuration of fine movement stage position measurement system 70D will be described, later in the description.

Further, the positional information of coarse movement stages WCS1 and WCS2 within the XY plane when the reciprocal delivery of fine movement stages WFS1 and WFS2 is performed, is measured by main controller 20, using wafer stage position measurement systems 16A and 16B (refer to FIGS. 1 and 3). As shown in FIG. 1, wafer stage position measurement systems 16A and 16B include laser interferometers which irradiate measurement beams on reflection surfaces formed on each of the side surfaces of coarse movement stages WCS1 and WCS2 by mirror-polishing, and measure the positional information of coarse movement stages WCS1 and WCS2 within the XY plane. Incidentally, although illustration is omitted in FIG. 1, in actual practice, a Y reflection surface perpendicular to the Y-axis and an X reflection surface perpendicular to the X-axis are formed on each of the coarse movement stages WCS1 and WCS2, and corresponding to these surfaces, an X interferometer and a Y interferometer are each provided which irradiate measurement beams, respectively, on to the X reflection surfaces and the Y reflection surfaces. Incidentally, in wafer stage position measurement systems 16A and 16B, for example, the Y interferometer has a plurality of measurement axes, and positional information (rotational information) in the θz direction of coarse movement stages WCS1 and WCS2 can also be measured, based on an output of each of the measurement axes. Incidentally, the positional information of coarse movement stages WCS1 and WCS2 in the XY plane can be measured using other measurement devices, such as for example, an encoder system, instead of wafer stage position measurement systems 16A and 16B described above. In this case, for example, a two-dimensional scale can be placed on the upper surface of base board 12, and an encoder head can be arranged on the bottom surface of coarse movement stage WCS1.

Figure 12A:
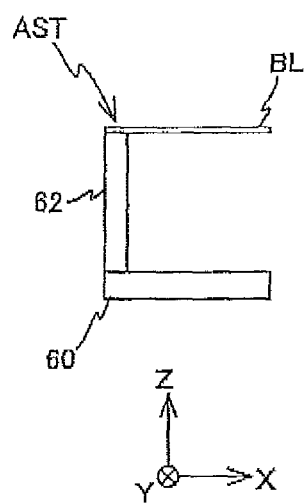
FIG. 12A is a view showing auxiliary stage AST seen from the −Y direction.
Figure 12B:
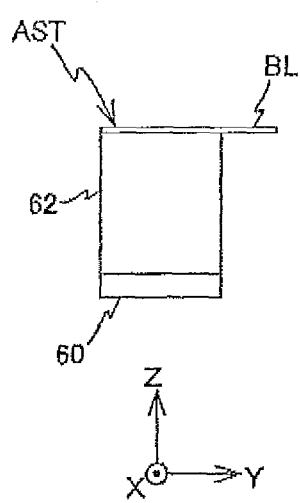
FIG. 12B is a view showing auxiliary stage AST seen from the +X direction, and 12C is a view showing auxiliary stage AST seen from the +Z direction.
Figure 12C:
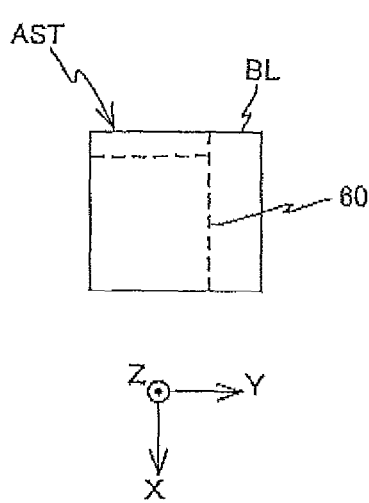

Next, auxiliary stage AST will be described. FIGS. 12A, 12B, and 12C show a side view (a view seen from the −Y direction), a front view (a view seen from the +X direction), and a planar view (a view seen from the +Z direction) of auxiliary stage AST, respectively. As shown in FIGS. 12A to 12C, auxiliary stage AST is equipped with a rectangular shaped slider section 60 whose longitudinal direction is in the X-axis direction in a planar view (when viewed from the +Z direction), a support section 62 made of a rectangular plate member fixed in a state parallel to the YZ plane to an end on the −X side of the upper surface of slider section 60, and a blade BL made of a rectangular plate which is supported in a cantilevered state by support section 62.

On the bottom surface of slider section 60, although it is not shown, a magnet unit is provided which is made up of a plurality of permanent magnets that configure an auxiliary stage drive system 58 (refer to FIG. 3) made up of a planar motor using the Lorenz electromagnetic force drive method, along with the coil unit of base board 12. On the bottom surface of slider section 60, a plurality of air bearings is fixed around the magnet unit described above. Auxiliary stage AST is supported by levitation above base board 12 by a predetermined clearance, such as around several μm, by the air bearings previously described, and is driven in the X-axis direction and the Y-axis direction by auxiliary stage drive system 58.

Figure 20:
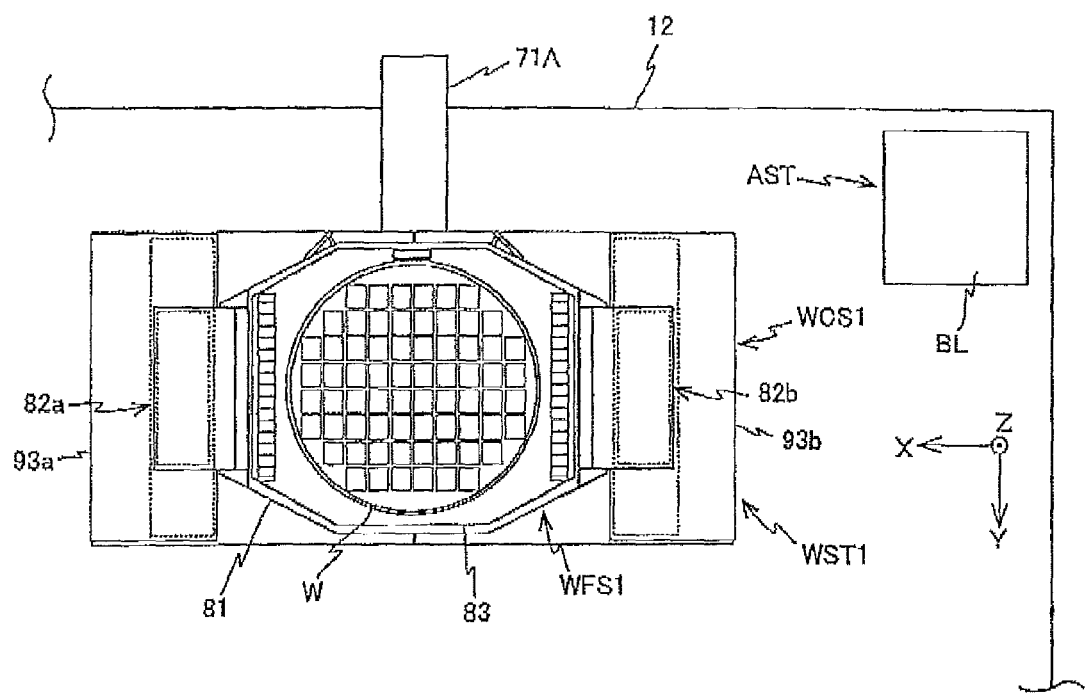
FIG. 20 is a view showing a waiting position of an auxiliary stage.

Usually, auxiliary stage AST waits at a waiting position distanced by a predetermined distance or more on the −X side of measurement arm 71A, as shown in FIG. 20. Because blade BL configures a part of auxiliary stage AST, when auxiliary stage AST is driven within the XY plane, then blade BL is also driven in the XY plane. More specifically, auxiliary stage drive system 58 also serves as a blade drive system which drives blade BL in the X-axis direction and the Y-axis direction.

As it can be seen from FIGS. 12A and 12B, an end on the −X side of blade BL is fixed to the upper surface of support section 62, in a state where an end on the +Y side projects out outside of support section 62 by a predetermined amount.

In the embodiment, the upper surface of blade BL has liquid repellency to liquid Lq. Blade BL, for example, includes a metal base material such as stainless steel and the like, and a film of a liquid-repellent material formed on the surface of the base material. The liquid-repellent material includes, for example, PFA (Tetra fluoro ethylene-perfluoro alkylvinyl ether copolymer), PTFE (Poly tetra fluoro ethylene), Teflon (a registered trademark) and the like. Incidentally, the material forming the film can be an acrylic-based resin or a silicone-based resin. Further, the whole blade BL can be formed of at least one of the PFA, PTFE, Teflon (a registered trademark), acrylic-based resin, and silicone-based resin. In the embodiment, the contact angle of the upper surface of blade BL to liquid Lq is, for example, 90 degrees or more.

Auxiliary stage AST is engageable with measurement arm 71A from the −X side, and in the engaged state, blade BL is located right above measurement arm 71A. Further, blade BL can be in contact or in proximity with fine movement stage WFS1 (or WFS2), which is supported by coarse movement stage WCS1, from the −Y side, and a surface appearing to be completely flat (for example, refer to FIG. 21) is formed in the contact or proximity state with the upper surface of fine movement stage WFS1 (or WFS2). Blade BL (auxiliary stage AST) is driven by main controller 20 via auxiliary stage drive system 58, and performs delivery of a liquid immersion space (liquid Lq) with fine movement stage WFS1 (or WFS2). Incidentally, the delivery of the liquid immersion space (liquid Lq) between blade BL and fine movement stage WFS1 (or WFS2) will be described further later on.

Next, a concrete configuration and the like of aligner 99 shown in FIG. 1 will be described, referring to FIG. 13.

Figure 13:
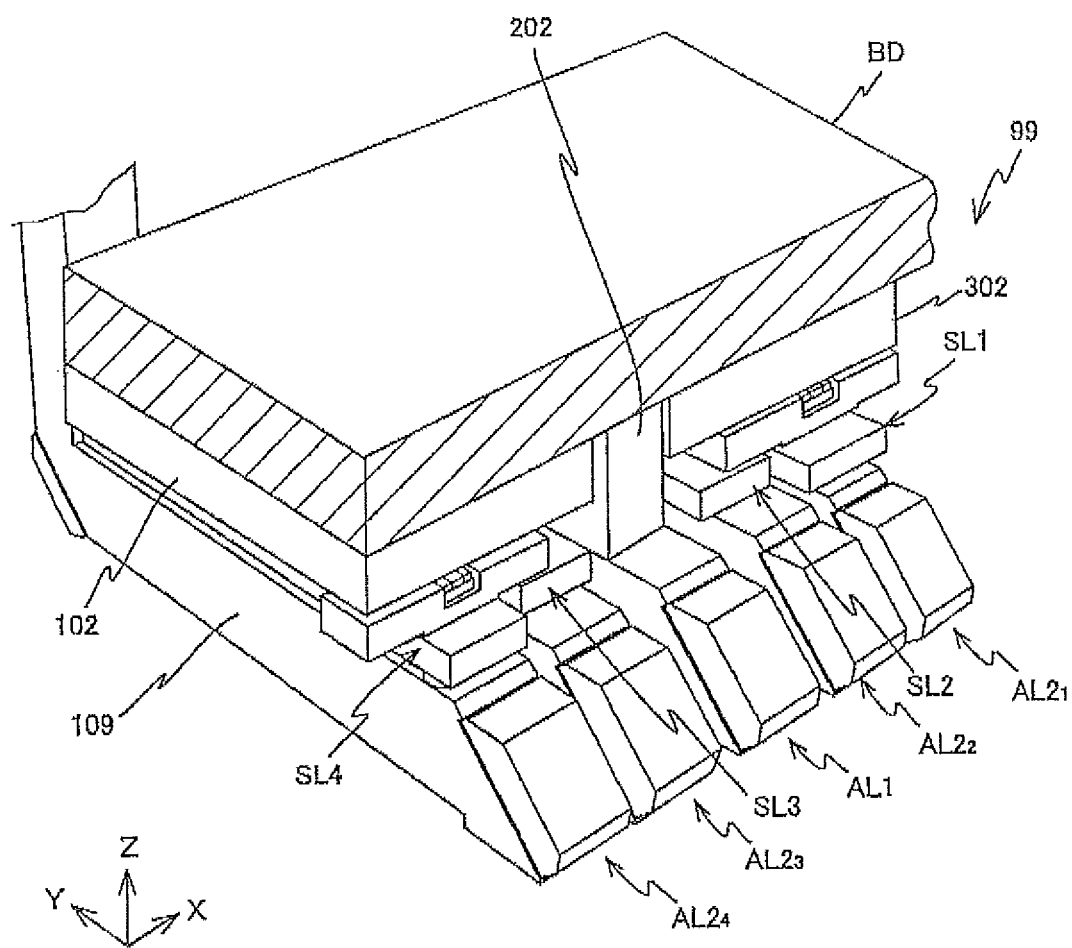
FIG. 13 is a perspective view showing an aligner.

FIG. 13 shows a perspective view of aligner 99 in a state where main frame BD is partially broken. As described above, aligner 99 is equipped with primary alignment system AL1 and four secondary alignment systems $AL2_1$, $AL2_2$, $AL2_3$, and $AL2_4$. The pair of secondary alignment systems $AL2_1$ and $AL2_2$ placed on the +X side of primary alignment system AL1 and the pair of secondary alignment systems $AL2_3$ and $AL2_4$ placed on the −X side have a symmetric configuration centered on primary alignment system AL1. Further, as is disclosed in, for example, PCT International Publication No. 2008/056735 (the corresponding U.S. Patent Application Publication No. 2009/0233234), secondary alignment systems AL21 to AL24 are independently movable by a drive system which includes a slider, a drive mechanism and the like that will be described later on.

Primary alignment system AL1 is supported via a support member 202, in a suspended state at the lower surface of main frame BD. As primary alignment system AL1, for example, an FIA (Field Image Alignment) system by an image processing method is used that irradiates a broadband detection beam that does not expose the resist on a wafer to a subject mark, and picks up an image of the subject mark formed on a light-receiving plane by the reflected light from the subject mark and an image of an index (an index pattern on an index plate arranged within each alignment system) (not shown), using an imaging device (such as CCD), and then outputs their imaging signals. The imaging signals from this primary alignment system AL1 are supplied to main controller 20 (refer to FIG. 3).

Sliders SL1 and SL2 are axed to the upper surface of secondary alignment systems $AL2_1$ and $AL2_2$, respectively. On the +Z side of sliders SL1 and SL2, an FIA surface plate 302 is provided fixed to the lower surface of main frame BD. Further, sliders SL3 and SL4 are fixed to the upper surface of secondary alignment systems $AL2_3$ and $AL2_4$, respectively. On the +Z side of sliders SL3 and SL4, an FIA surface plate 102 is provided fixed to the lower surface of main frame BD.

Secondary alignment system $AL2_4$ is an FIA system like primary alignment system AL1, and includes a roughly L-shaped barrel 109 in which an optical member such as a lens has been arranged. On the upper surface (a surface on the +Z side) of the portion extending in the Y-axis direction of barrel 109, slider SL4 previously described is fixed, and this slider SL4 is arranged facing FIA surface plate 102 previously described.

FIA surface plate 102 is made of a member (e.g., Invar and the like) which is a magnetic material also having a low thermal expansion, and an armature unit including a plurality of armature coils are arranged in a part of the plate (near the end on the +Y side). As an example, the armature unit includes two Y drive coils and a pair of X drive coil groups. Further, in the inside of FIA surface plate 102, a liquid flow channel (not shown) is formed, and by the cooling liquid which flows through the flow channel, the temperature of PTA surface plate 102 is controlled (cooled) to a predetermined temperature.

Slider SL4 includes a slider main section, a plurality of static gas bearings provided in the slider main section, a plurality of permanent magnets, and a magnet pole unit. As the static gas bearings, a static gas bearing of a so-called ground gas supply type is used that supplies gas via a gas flow channel within FIA surface plate 102. The plurality of permanent magnets face FIA surface plate 102 made of the magnetic material previously described, and a magnetic attraction acts constantly between the plurality of permanent magnets and FIA surface plate 102. Accordingly, while gas is not supplied to the plurality of static gas bearings, slider SL4 moves closest to (is in contact with) the lower surface of FIA surface plate 102 by a magnetic attraction. When gas is supplied to the plurality of static gas bearings, a repulsion occurs between FIA surface plate 102 and slider SL4 due to static pressure of the gas. By a balance between the magnetic attraction and the static pressure (repulsion) of the gas, slider SL4 is maintained (held) in a state where a predetermined clearance is formed between the upper surface of the slider and the lower surface of FIA surface plate 102. Hereinafter, the former is referred to as a "landed state", and the latter will be referred to as a "floating state".

The magnet pole unit is provided corresponding to the armature unit previously described, and in the embodiment, by an electromagnetic interaction between the magnet pole unit and the armature unit (the two Y drive coils and the pair of X drive coil groups), a drive force in the X-axis direction, a drive force in the Y-axis direction, and a drive force in a rotational ($\theta z$) direction around the Z-axis can be applied to slider SL4. Incidentally, in the description below, a drive mechanism (an actuator) configured by the magnet pole unit and the armature unit described above will be referred to as an "alignment system motor".

Secondary alignment system $AL2_3$ placed on the +X side of secondary alignment system $AL2_4$ is configured in a similar manner as secondary alignment system $AL2_4$ described above, and slider SL3 is also structured almost the same as slider SL4. Further, between slider SL3 and FIA surface plate 102, a drive mechanism (an alignment system motor) as in the drive mechanism previously described is provided.

When driving (adjusting the position of) secondary alignment systems $AL2_4$ and $AL2_3$, main controller 20 supplies gas to the static gas bearings previously described, and by forming a predetermined clearance between sliders SL4 and SL3 and FIA surface plate 102, makes sliders SL4 and SL3 more into the floating state described above. Then, by controlling the electric current supplied to the armature unit configuring each of the alignment system motors based on the measurement values of the measurement devices (not shown in a state maintaining the floating state, main controller 20 finely drives slider SL4 (secondary alignment system $AL2_4$) and slider SL3 (secondary alignment system $AL2_3$) in the X-axis, the Y-axis and the $\theta z$ directions.

Referring back to FIG. 13, secondary alignment systems $AL2_1$ and $AL2_2$ also have a configuration like secondary alignment systems $AL2_3$ and $AL2_4$ described above, while slider SL2 has a configuration in symmetry with slider SL3 described above, and slider SL1 has a configuration in symmetry with slider SL4 described above. Further, the configuration of FIA surface plate 302 is in symmetry with the configuration of FIA surface plate 102 described above.

Next, a configuration of fine movement stage position measurement system 70A (refer to FIG. 3) used to measure the positional information of fine movement stage WFS1 or WFS2 (configuring wafer stage WST1), which is movably held by coarse movement stage WCS1 in exposure station 200, will be described. In this case, the case will be described where fine movement stage position measurement system 70A measures the positional information of fine movement stage WFS1.

As shown in FIG. 1, fine movement stage position measurement system 70A is equipped with an arm member (a measurement arm 71A) which is inserted in a space inside coarse movement stage WCS1 in a state where wafer stage WST1 is placed below projection optical system PL. Measurement arm 71A is supported cantilevered (the vicinity of one end is supported) from main frame ED of exposure apparatus 100 via a support section 72A. Incidentally, in the case a configuration is employed where the arm (measurement) members do not interfere with the movement of the wafer stage, the configuration is not limited to the cantilever support, and both ends in the longitudinal direction can be supported. Further, the arm member should be located further below (the −Z side) grating RG (the placement plane substantially parallel to the XY plane) previously described, and for example, can be placed lower than the upper surface of base board 12. Furthermore, while the arm member was to be supported by main frame BD, for example, the arm member can be installed on an installation surface (such as a floor surface) via a vibration isolation mechanism. In this case, it is desirable to arrange a measuring device which measures a relative positional relation between main frame BD and the arm member. The arm member can also be referred to as a metrology aria or a measurement member.

Measurement arm 71A is a square column shaped (that is, a rectangular solid shape) member having a longitudinal rectangular cross section whose longitudinal direction is in the Y-axis direction and size in a height direction (the Z-axis direction) is larger than the size in a width direction (the X-axis direction), and is made of a material which is the same that transmits light, such as, for example, a glass member affixed in plurals. Measurement arm 71A is formed solid, except for the portion where the encoder head (an optical system) which will be described later is housed. In the state where wafer stage WST1 is placed below projection optical system PL as previously described, the tip of measurement arm 71A is inserted into the space of coarse movement stage WCS1, and its upper surface faces the lower surface (to be more precise, the lower surface of main body section 81 (not shown in FIG. 1, refer to FIG. 2A) of fine movement stage WFS1 as shown in FIG. 1. The upper surface of measurement arm 71A is placed almost parallel with the lower surface of fine movement stage WFS1, in a state where a predetermined clearance, such as, for example, around several mm, is formed with the lower surface of fine movement stage WFS1. Incidentally, the clearance between the upper surface of measurement arm 71A and the lower surface of fine movement stage WFS can be more than or less than several mm.

As shown in FIG. 3, fine movement stage position measurement system 70A is equipped with encoder system 73 which measures the position of fine movement stage WFS1 in the X-axis direction, the Y-axis direction, and the θz direction, and laser interferometer system 75 which measures the position of fine movement stage WFS1 in the Z-axis direction, the θx direction, and the θy direction. Encoder system 73 includes an X linear encoder 73x measuring the position of fine movement stage WFS1 in the X-axis direction, and a pair of Y linear encoders 73ya and 73yb (hereinafter, also appropriately referred to together as Y linear encoder 73y) measuring the position of fine movement stage WFS1 in the Y-axis direction. In encoder system 73, a head of a diffraction interference type is used that has a configuration similar to an encoder head (hereinafter shortly referred to as a head) disclosed in, for example, U.S. Pat. No. 7,238,931, and PCT International Publication No. 2007/083758 (the corresponding U.S. Patent Application Publication No-2007/288121). However, in the embodiment, a light source and a photodetection system (including a photodetector) of the head are placed external to measurement arm 71A as in the description later on, and only an optical system is placed inside measurement arm 71A, or more specifically, facing grating RG. Hereinafter, the optical system placed inside measurement arm 71A will be referred to as a head, besides the case when specifying is especially necessary.

Figure 14A:
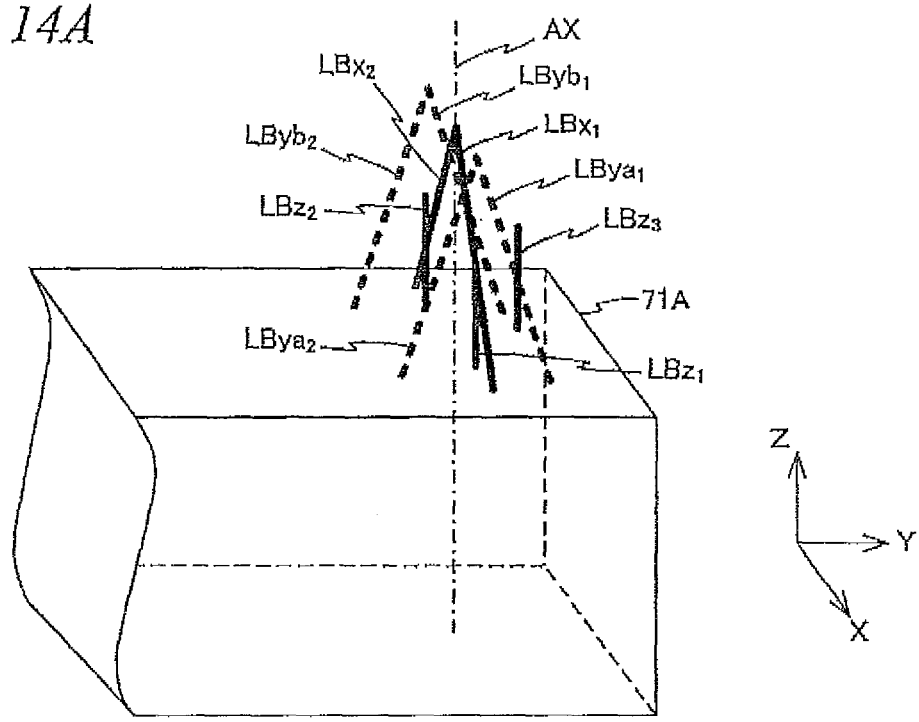
FIG. 14A shows a perspective view of a tip of a measurement arm.
Figure 14B:
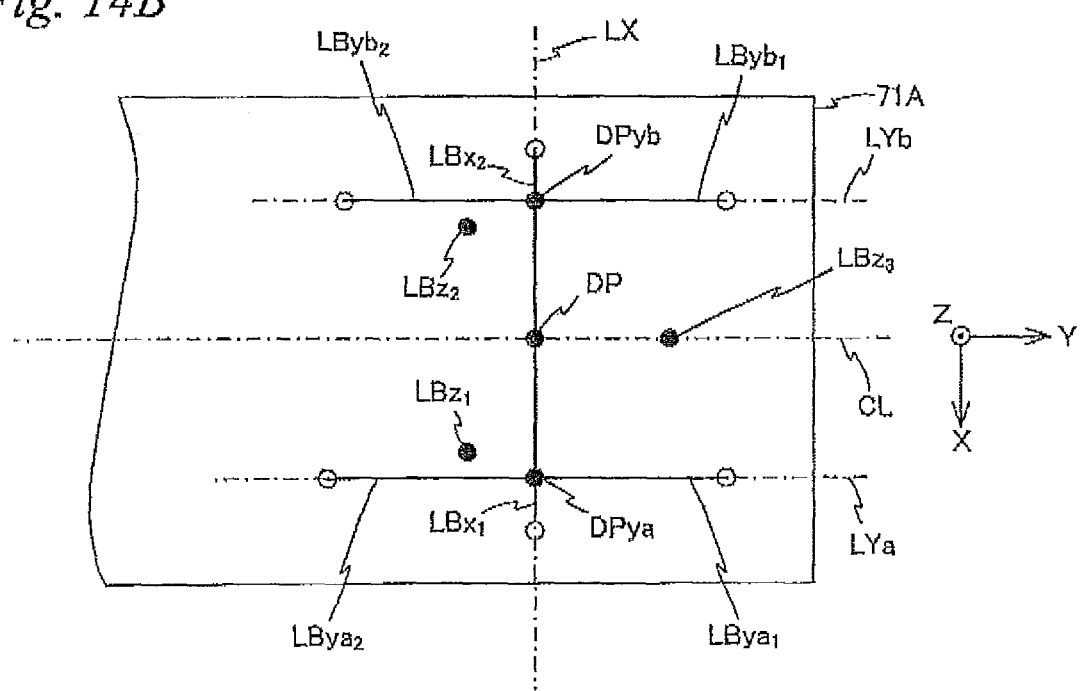
FIG. 14B is a view of the tip of the measurement arm when viewed from the +Z direction.

FIG. 14A shows a tip of measurement arm 71A in a perspective view, and FIG. 14B shows an upper surface of the tip of measurement arm 71A in a planar view when viewed from the direction. Encoder system 73 measures the position of fine movement stage WFS1 in the X-axis direction using one X head 77x (refer to FIGS. 15A and 15B), and the position in the Y-axis direction using a pair of Y heads 77ya and 77yb (refer to FIG. 15B). More specifically, X linear encoder 73x previously described is configured by X head 77x which measures the position of fine movement stage WFS1 in the X-axis direction using an X diffraction grating of grating RG, and the pair of Y linear encoders 73ya and 73yb is configured by the pair of Y heads 77ya and 77yb which measures the position of fine movement stage WFS1 in the Y-axis direction using a Y diffraction grating of grating RG.

As shown in FIGS. 14A and 14B, X head 77x irradiates measurement beams $LBx_1$ and $LBx_2$ (indicated by a solid line in FIG. 14A) on grating RG from two points (refer to the white circles in FIG. 14B) on a straight line LX parallel to the X-axis that are at an equal distance from a center line CL of measurement arm 71A. Measurement beams $LBx_1$ and $LBx_2$ are irradiated on the same irradiation point on grating RG (refer to FIG. 15A). The irradiation point of measurement beams $LBx_1$ and $LBx_2$, that is, a detection point of X head 77x (refer to reference code DP in FIG. 14B) coincides with an exposure position which is the center of an irradiation area (exposure area) IA of illumination light IL irradiated on wafer W (refer to FIG. 1). Incidentally, while measurement beams $LBx_1$ and $LBx_2$ are actually refracted at a boundary and the like of main body section 81 and an atmospheric layer, it is shown, simplified in FIG. 15A and the like.

Figure 15A:
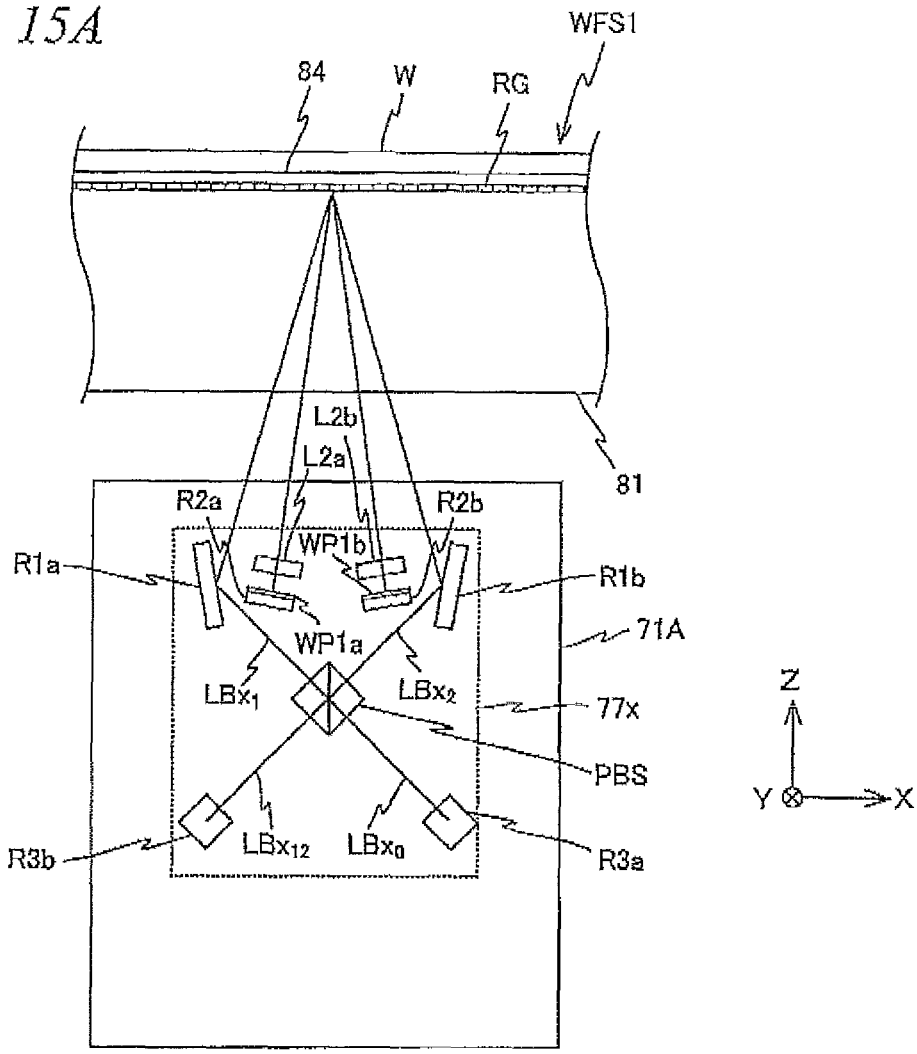
FIG. 15A is a view showing a rough configuration of an X head 77x.
Figure 15B:
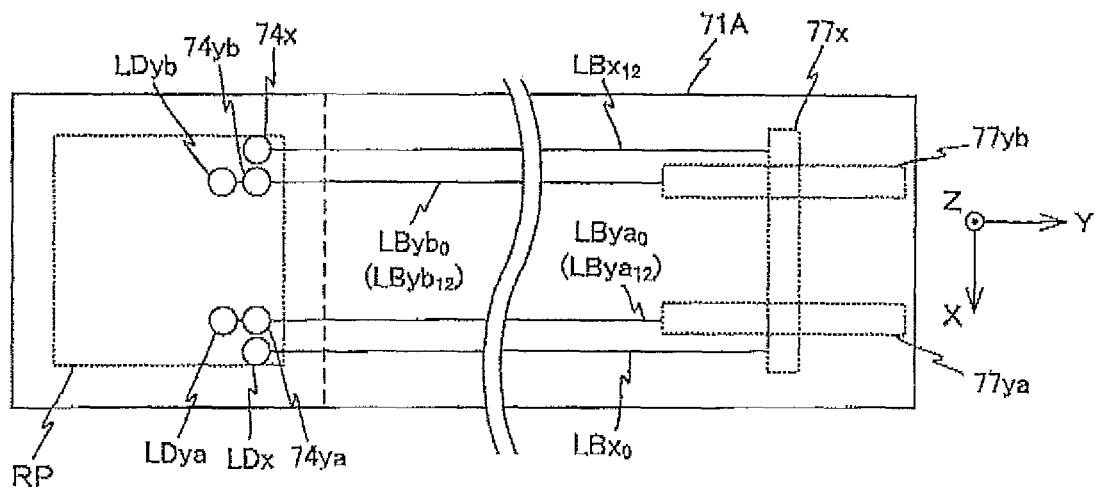
FIG. 15B is a view used to explain a placement of each of the X head 77x, Y heads 77ya and 77yb inside the measurement arm.

As shown in FIG. 15B, each of the pair of Y heads 77ya and 77yb are placed on the +X side and the −X side of center line CL of measurement arm 71A. As shown in FIGS. 14A and 14B, Y head 77ya is placed on a straight line LYa which is parallel to the Y-axis, and irradiates measurement beams $LBya_1$ and $LBya_2$ that are each shown by a broken line in FIG. 14A on a common irradiation point on grating RG from two points (refer to the white circles in FIG. 14B) which are distanced equally from straight line LX. The irradiation point of measurement beams $LBya_1$ and $LBya_2$, that is, a detection point of Y head 77ya is shown by reference code DPya in FIG. 146.

Similar to Y head 77ya, Y head 77yb is placed on a straight line LYb which is located the same distance away from center line CL of measurement arm 71A as straight line LYa and is parallel to the Y-axis, and irradiates measurement beams $LByb_1$ and $LByb_2$ on a common irradiation point DPyb on grating RG from two points (refer to the white circles in FIG. 14B) which are distanced equally from straight line LX. As shown in FIG. 14B, detection points DPya and DPyb of each of the measurement beams $LBya_1$ and $LBya_2$, and measurement beams $LByb_1$ and $LByb_2$ are placed on straight line LX which is parallel to the X-axis. Now, in main controller 20, the position of fine movement stage WFS1 in the Y-axis direction is determined, based on an average of the measurement values of the two Y heads 77ya and 77yb. Accordingly, in the embodiment, the position of fine movement stage WFS1 in the Y-axis direction is measured with a midpoint of detection points DPya and DPyb serving as a substantial measurement point. And, the midpoint of detection points DPya and DPyb according to Y heads 77ya and 77yb coincides with irradiation point DP of measurement beams $LBx_1$ and $LBX_2$, on grating RG. More specifically, in the embodiment, there is a common detection point regarding measurement of positional information of fine movement stage WFS1 in the X-axis direction and the Y-axis direction, and this detection point coincides with the exposure position, which is the center of irradiation area (exposure area IA of illumination light IL irradiated on wafer W. Accordingly, in the embodiment, by using encoder system 73, main controller 20 can constantly perform measurement of the positional information of fine movement stage WFS1 in the XY plane, directly under (at the back side of fine movement stage WFS1) the exposure position when transferring a pattern of reticle R on a predetermined shot area of wafer W mounted on fine movement stage WFS1. Further, main controller 20 measures a rotational amount of fine movement stage WFS in the θz direction, based on a difference of the measurement values of the pair of Y heads 77ya and 77yb, which are placed apart in the X-axis direction and measure the position of fine movement stage WFS in the Y-axis direction, respectively.

A configuration of three heads 77x, 77ya, and 77yb which configures encoder system 73 will now be described. FIG. 15A representatively shows a rough configuration of X head 77x, which represents three heads 77x, 77ya, and 77yb. Further, FIG. 15B shows a placement of each of the X head 77x, and Y heads 77ya and 77yb within measurement arm 71A.

As shown in FIG. 15A, X head 77x is equipped with a polarization beam splitter PBS whose separation plane is parallel to the YZ plane, a pair of reflection mirrors R1a and R1b, lenses L2a and L2b, quarter wavelength plates (hereinafter, described as λ/4 plates) WP1a and WP1b, refection mirrors R2a and R2b, and refection mirrors R1a and R3b and the like, and these optical elements are placed in a predetermined positional relation. Y heads 77ya and 77yb also have an optical system with a similar structure. As shown in FIGS. 15A and 15B, X head 77x, Y heads 77ya and 77yb are unitized and each fixed inside of measurement arm 71A.

As shown in FIG. 15B, in X head 77x (X encoder 73x), a laser beam $LBx_0$ is emitted in the −Z direction from a light source LDx provided on the upper surface (or above) at the end on the −Y side of measurement arm 71A, and its optical path is bent to become parallel with the Y-axis direction via a reflection surface RP which is provided on a part of measurement arm 71A inclined at an angle of 45 degrees with respect to the XY plane. This laser beam $LBx_0$ travels through the solid section inside measurement arm 71 in parallel with the longitudinal direction (the Y-axis direction) of measurement arm 71A, and reaches reflection mirror R3a shown in FIG. 15A. Then, the optical path of laser beam $LBx_0$ is bent by reflection mirror R3a and is incident on polarization beam splitter PBS. Laser beam $LBx_0$ is split by polarization by polarization beam splitter PBS into two measurement beams $LBx_1$ and $LBx_2$. Measurement beam $LBx_1$ having been transmitted through polarization beam splitter PBS reaches grating RG formed on fine movement stage WFS1, via reflection mirror R1a, and measurement beam $LBx_2$ reflected off polarization beam splitter PBS reaches grating RG via reflection mirror R1b. Incidentally, "split by polarization" in this case means the splitting of an incident beam into a P-polarization component and an S-polarization component.

Predetermined-order diffraction beams that are generated from grating RG due to irradiation of measurement beams $LBx_1$ and $LBx_2$, such as, for example, the first-order diffraction beams are severally converted into a circular polarized light by λ/4 plates WP1a and WP1b via lenses L2a and L2b, and reflected by reflection mirrors R2a and R2b and then the beams pass through λ/4 plates WP1a and WPM again and reach polarization beam splitter PBS by tracing the same optical path in the reversed direction.

Each of the polarization directions of the two first-order diffraction beams that have reached polarization beam splitter PBS is rotated at an angle of 90 degrees with respect to the original direction. Therefore, the first-order diffraction beam of measurement beam $LBx_1$ having passed through polarization beam splitter PBS first, is reflected off polarization beam splitter PBS. The first-order diffraction beam of measurement beam $LBx_2$ having been reflected off polarization beam splitter PBS first, passes through polarization beam splitter PBS. Accordingly, the first-order diffraction beams of each of the measurement beams $LBx_1$, and $LBx_2$ are coaxially synthesized as a synthetic beam $LBx_{12}$. Synthetic beam $LBx_{12}$ has its optical path bent by reflection mirror R3b so it becomes parallel to the Y-axis, travels inside measurement arm 71A parallel to the y-axis, and then is sent to an X photodetection system 74x provided on the upper surface (or above) at the end on the −Y side of measurement arm 71A shown in FIG. 15B via reflection surface RP previously described.

In X photodetection system 74x, the polarization direction of the first-order diffraction beams of beams $LBx_1$ and $LBx_2$ synthesized as synthetic beam $LBx_{12}$ is arranged by a polarizer (analyzer) (not shown) and the beams overlay each other so as to form an interference light, which is detected by the photodetector and is converted into an electric signal in accordance with the intensity of the interference light. When fine movement stage WFS1 moves in the measurement direction (in this case, the X-axis direction) here, a phase difference between the two beams changes, which changes the intensity of the interference light. This change of the intensity of the interference light is supplied to main controller 20 (refer to FIG. 3) as positional information related to the X-axis direction of fine movement stage WFS1.

As shown in FIG. 15B, laser beams $LBya_0$ and $LByb_0$ which are emitted from light sources LDya and LDyb, respectively, and whose optical paths are bent by an angle of 90 degrees so as to become parallel to the Y-axis by reflection surface RP previously described, are incident on Y heads 77ya and 77yb, and similar to the previous description, synthetic beams $LBya_{12}$ and $LByb_{12}$ of the first-order diffraction beams by grating RG (Y diffraction grating) of each of the measurement beams split by polarization by the polarization beam splitter are output from Y heads 77ya and 77yb, respectively, and return to Y photodetection systems 74ya and 74yb. Now, laser beams $LBya_0$ and $LByb_0$ emitted from light sources LDya and LDyb, and synthetic beams $LBya_{12}$ and $LByb_{12}$ returning to Y photodetection systems 74ya and 74yb, each pass an optical path which are overlaid in a direction perpendicular to the page surface of FIG. 15B. Further, as described above, in Y heads 77ya and 77yb, optical paths are appropriately bent (omitted in drawings) inside so that laser beams $LBya_0$ and $LByb_0$ irradiated from the light source and synthetic beams $LBya_{12}$ and $LByb_{12}$ returning to Y photodetection systems 74ya and 74yb pass optical paths which are parallel and distanced apart in the Z-axis direction.

As shown in FIG. 14A, laser interferometer system 75 makes three measurement beams $LBz_1$, $LBz_2$, and $LBz_3$ enter the lower surface of fine movement stage WFS1 from the tip of measurement arm 71. Laser interferometer system 75 is equipped with three laser interferometers 75a to 75c (refer to FIG. 3) that irradiate three measurement beams $LBz_1$, $LBz_2$, and $LBz_3$, respectively.

In laser interferometer system 75, three measurement beams $LBz_1$, $LBz_2$, and $LBz_3$ are emitted in parallel with the Z-axis from each of the three points that are not collinear on the upper surface of measurement arm 71A, as shown in FIGS. 14A and 14B. Now, as shown in FIG. 14B, three measurement beams $LBz_1$, $LBz_2$, and $LBz_3$ are each irradiated from positions which are the apexes of an isosceles triangle (or an equilateral triangle) whose centroid coincides with the exposure area which is the center of irradiation area (exposure area) IA. In this case, the outgoing point (irradiation point) of measurement beam $LBz_3$ is located on center line CL, and the outgoing points (irradiation points) of the remaining measurement beams $LBz_1$ and $LBz_2$ are equidistant from center line CL. In the embodiment, main controller 20 measures the position in the Z-axis direction, the rotational amount in the θx direction and the θy direction of fine movement stage WFS1, using laser interferometer system 75. Incidentally, laser interferometers 75a to 75c are provided on the upper surface (or above) at the end on the −Y side of measurement arm 71A. Measurement beams $LBz_1$, $LBz_2$, and $LBz_3$ emitted in the −Z direction from laser interferometers 75a to 75e travel within measurement arm 71 along the Y-axis direction via reflection surface RP previously described, and each of their optical paths is bent so that the beams are emitted from the three points described above.

In the embodiment, on the lower surface of fine movement stage WFS1, a wavelength selection filter (omitted in drawings) which transmits each measurement beam from encoder system 73 and blocks the transmission of each measurement beam from laser interferometer system 75 is provided. In this case, the wavelength selection filter also serves as a reflection surface of each of the measurement beams from laser interferometer system 75. As the wavelength selection filter, a thin film and the like having wavelength-selectivity is used, and in the embodiment, the filter is provided, for example, on one surface of the transparent plate (main body section 81) and grating RG is placed on the wafer holder side with respect to the one surface.

As it can be seen from the description so far, main controller 20 can measure the position of fine movement stage WFS1 in directions of six degrees of freedom by using encoder system 73 and laser interferometer system 75 of fine movement stage position measurement system 70A. In this case, since the optical path lengths of the measurement beams are extremely short and also are almost equal to each other in encoder system 73, the influence of air fluctuation can mostly be ignored. Accordingly, by encoder system 73, positional information (including the θz direction) of fine movement stage WFS1 within the XY plane can be measured with high accuracy. Further, because the substantial detection points on the grating in the X-axis direction and the Y-axis direction by encoder system 73 and detection points on the lower surface of fine movement stage WFS lower surface in the Z-axis direction by laser interferometer system 75 coincide with the center (exposure position) of exposure area IA, respectively, generation of the so-called Abbe error is suppressed to a substantially ignorable degree. Accordingly, by using fine movement stage position measurement system 70A, main controller 20 can measure the position of fine movement stage WFS1 in the X-axis direction, the Y-axis direction, and the Z-axis direction with high precision, without any Abbe errors. Further, in the case coarse movement stage WCS1 is below projection unit PU and fine movement stage WFS2 is movably supported by coarse movement stage WCS1, by using fine movement stage position measurement system 70A, main controller 20 can measure the position in directions of six degrees of freedom of fine movement stage WFS2 and especially the position of fine movement stage WFS2 in the X-axis direction, the Y-axis direction, and the Z-axis direction can be measured with high precision, without any Abbe errors.

Further, fine movement stage position measurement system 70B which measurement station 300 is equipped with, is configured similar to fine movement stage position measurement system 70A, but in a symmetric manner, as shown in FIG. 1. Accordingly, measurement arm 71B which fine movement stage position measurement system 70B is equipped with has a longitudinal direction in the Y-axis direction, and the vicinity of the end on the +Y side is supported almost cantilevered from main frame BD, via support member 72B.

In the case coarse movement stage WCS2 is below aligner 99 and fine movement stage WFS2 or WFS1 is movably supported by coarse movement stage WCS2, by using fine movement stage position measurement system 70B, main controller 20 can measure the position in directions of six degrees of freedom of fine movement stage WFS2 or WFS1 and especially the position of fine movement stage WFS2 or WFS1 in the X-axis direction, the Y-axis direction, and the Z-axis direction can be measured with high precision, without any Abbe errors.

Figure 16:
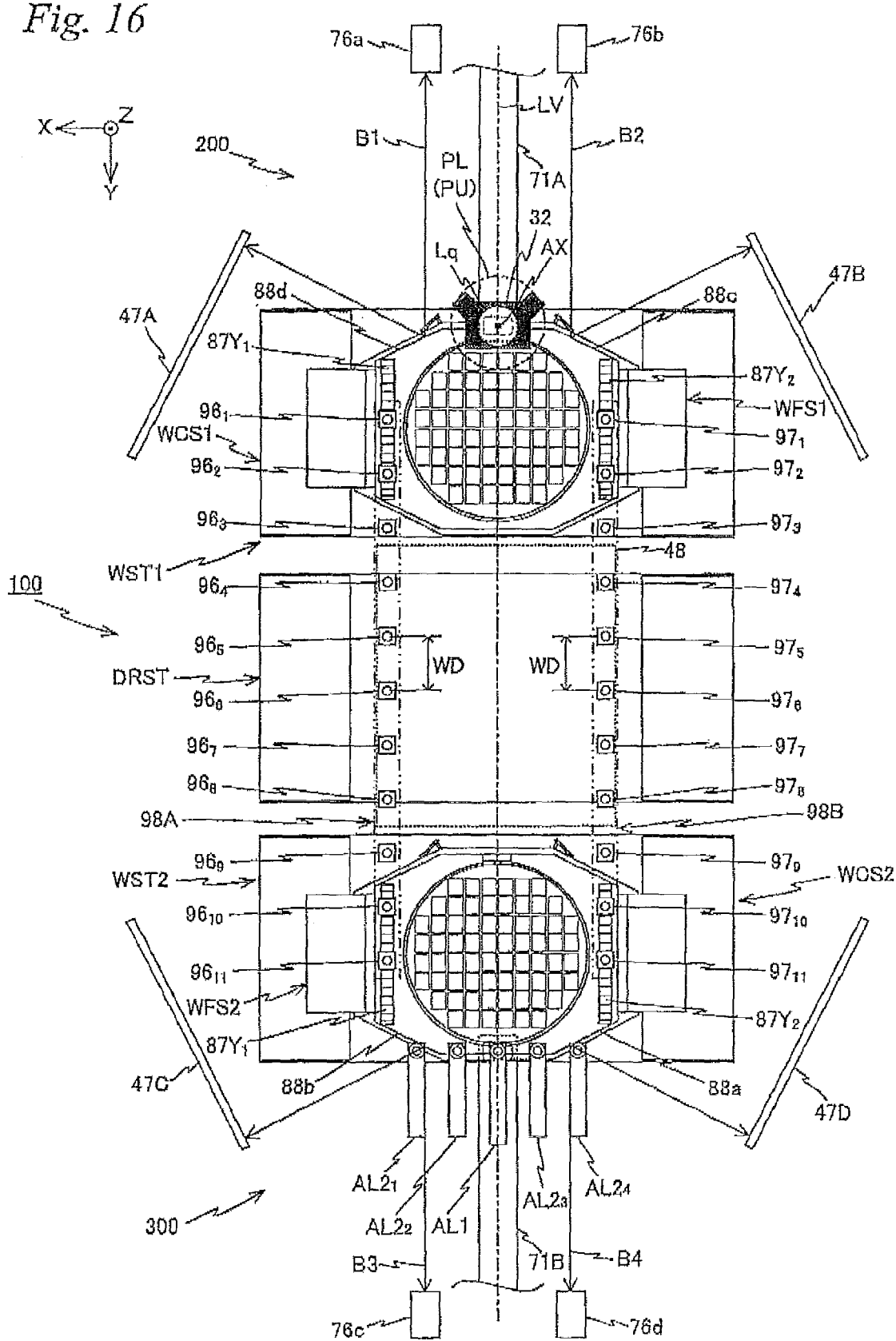
FIG. 16 is a view used to explain a placement of head units 98A and 98B, and four laser interferometers 76a to 76d.

Next, a configuration and the like of fine movement stage position measurement system 70C (refer to FIG. 3), which is used to measure positional information when fine movement stages WFS1 and WFS2 are delivered from coarse movement stage WCS2 placed in measurement station 300 to coarse movement stage WCS1 placed in exposure station 200, will be described. As shown in FIG. 3, fine movement stage position measurement system 70C includes encoder system 78 and laser interferometer system 79. FIG. 16 shows a partially omitted view of exposure apparatus 100 when viewed from above (the +Z direction). As shown in FIG. 16, encoder system 78 (refer to FIG. 3) has a pair of head units 98A and 98B extending in the Y-axis direction installed between exposure station 200 and measurement station 300. Although illustration of head units 98A and 98B is omitted in FIG. 16 and the like from the viewpoint of avoiding intricacy of the drawings, in actual practice, the head units are fixed to main frame BD previously described in a suspended state via a support member.

Incidentally, in the state shown in FIG. 16, fine movement stage WFS1 (wafer stage WST1) is located at a measurement limit position in the +Y direction of fine movement stage position measurement system 70A. More specifically, when fine movement stage WFS1 moves further to the +Y direction from the state shown in FIG. 16, irradiation points of measurement beams $LBx_1$, $LBx_2$, $LBya_1$, $LBya_2$, $LByb_1$, and $LByb_2$ (refer to FIG. 14A) emitted from measurement arm 71A move off from grating RG placed at fine movement stage WFS1 while measurement beams $LBz_1$, $LBz_2$, and $LBz_3$ (refer to FIG. 14A) move off from the rear surface (reflection surface) of fine movement stage WFS, which makes position measurement of fine movement stage WFS1 by fine movement stage position measurement system 70A no longer possible. Further, in FIG. 16, fine movement stage WFS2 (wafer stage WST2) is located at a measurement limit position in the −Y direction of fine movement stage position measurement system 70B. More specifically, when fine movement stage WFS2 moves further to the −Y direction from the state shown in FIG. 16, position measurement of fine movement stage WFS2 by fine movement stage position measurement system 70B is no longer possible, similar to the case described above.

As shown in FIG. 16, head units 98A and 98B are placed symmetrically with respect to reference axis LV, on the +X side and −X side of reference axis LV. Head units 98A and 98B are each equipped with a plurality of (in this case, 11) Y heads $96_i$ and $97_j$ (i, j=1 to 11), which are placed at a distance WD in the Y-axis direction, symmetrically with respect to reference axis LV. Hereinafter, Y heads $96_j$ and $97_i$ will also be described as Y heads 96 and 97, respectively, as necessary.

The spacing of head unit 98A and head unit 98B in the X-axis direction approximately coincides with the spacing of two Y scales $87Y_1$ and $87Y_2$ in the X-axis direction placed at fine movement stages WFS1 and WFS2, respectively, and at a position (hereinafter referred to as a centering position) where the center of fine movement stages WFS1 and WFS2 coincides with reference axis LV as shown in FIG. 16, head units 98A and 98B respectively face Y scales $87Y_1$ and $87Y_2$. The spacing in the Z-axis direction between each of the Y heads 96 and 97 configuring head units 98A and 98B and Y scales $87Y_1$ and $87Y_2$ it is set to around several mm.

Head unit 98A constitutes a multiple-lens (eleven-lens, in this case) Y linear encoder (hereinafter, shortly referred to as a "Y encoder" or an "encoder" as appropriate) that measures the position of each of the fine movement stages WFS1 and WFS2 in the Y-axis direction (Y position), using Y scale $87Y_1$ previously described. Similarly, head unit 98B constitutes a multiple-lens (eleven-lens, in this case) Y encoder that measures the position of each of the fine movement stages WFS1 and WFS2 in the Y-axis direction, using Y scale $87Y_2$ previously described.

In this case, distance WD of the adjacent Y heads 96 and 97 (to be more accurate, projection points of the measurement beams irradiated by Y heads 96 and 97 on the Y scale) that head units 98A and 98B are each equipped with, is set to half or less than half the length of Y scales $87Y_1$ and $87Y_2$ in the Y-axis direction. Accordingly, when fine movement stages WFS1 and WFS2 more straight in the Y-axis direction, of the 11 Y heads $96_1$ to $96_{11}$ configuring head unit 98A, two heads (or three heads in some cases) face Y scale $87Y_1$, and of the 11

Y heads $97_1$ to $97_{11}$ configuring head unit 98B, two heads (or three heads in some cases) face Y scale $87Y_2$. Incidentally, of each of the eleven Y heads 96 and 97, two each of the Y heads, $96_1$, $96_2$, $97_1$, and $97_2$ positioned at ends on the −Y side, are placed within the measurable range (within exposure station 200) of fine movement stage position measurement system 70A, while two each of the Y heads, $96_{10}$, $96_{11}$, $97_{10}$, and $97_{11}$ positioned at ends on the +Y side, are placed within the measurable range (within measurement station 300) of fine movement stage position measurement system 70B.

Accordingly, as shown in FIG. 16, two each of the Y heads, $96_1$, $96_2$, $97_1$, and $97_2$ face Y scales $87Y_1$ and $87Y_2$ of fine movement stage WFS1, respectively, in a state where fine movement stage WFS1 is positioned at the measurement limit position in the +Y direction of fine movement stage position measurement system 70A, while two each of the Y heads, $96_{10}$, $96_{11}$, $97_{10}$, and $97_{11}$ face Y scales $87Y_1$ and $87Y_2$ of fine movement stage WFS2, respectively, in a state where fine movement stage WFS2 is positioned at the measurement limit position in the −Y direction of fine movement stage position measurement system 70B. In other words, a part of the measurable range of fine movement stage position measurement system 70C of the embodiment overlaps a part of the measurable range of each of the fine movement stage position measurement systems 70A and 70B.

Encoder system 78, or more specifically, (the Y encoders configured by) head unit 98A and head unit 98B described above, measure position coordinates of fine movement stages WFS1 and WFS2 at a resolution of, for example, around 0.1 nm, and the measurement values are supplied to main controller 20. Main controller 20 controls the position in the Y-axis direction and rotation in the θz direction of wafer stages WST1 and WST2, based on the measurement values of head unit 98A and head unit 98B.

Further, each of the Y heads 96 and 97 configuring head unit 98A and head unit 98B can also measure positional information of Y scales $87Y_1$ and $87Y_2$ in the Z-axis direction, or more specifically, the positional information of fine movement stage WFS1 (or WFS2) in the Z-axis direction. Now, as an example, each of the Y heads 96 and 97 is to measure the positional information of fine movement stage WFS1 (or WFS2) in the Z-axis direction, based on an intensity change of reflected lights (diffraction lights) from Y scales $87Y_1$ and $87Y_2$ of the measurement beam. In encoder system 78 of the embodiment, at least two Y heads 96 of head unit 98A and at least two Y heads 97 of head unit 98B face Y scales $87Y_1$ and $87Y_2$, respectively, and positional information in the Z-axis direction of the wafer surface is measured at four places and then the measurement values are supplied to main controller 20. Main controller 20 controls the position in the Z-axis direction and the rotation in the θx and θy directions of fine movement stages WFS1 and WFS2, based on the measurement values of the plurality of Y heads. Incidentally, means for measuring the positional information of fine movement stages WFS1 and WFS2 in the Z-axis direction is not limited to this, and for example, in the vicinity of each of the Y heads 96 and 97, Z heads (more specifically, 22) can be placed, separately from Y heads 96 and 97, and the position in the Z-axis direction and the rotation in the θx and θy directions of fine movement stages WFS1 and WFS2 can be controlled by these Z heads. As a Z head, for example, a head of an optical displacement sensor similar to an optical pickup used in a CD drive device and the like can be used.

Next, a configuration and the like of laser interferometer system 79 (refer to FIG. 3) which configures fine movement stage position measurement system 70C will be described. As shown in FIG. 16, laser interferometer system 79 has a pair of laser interferometers 76a and 76b placed further to the −Y side than exposure station 200, and a pair of laser interferometers 76c and 76d placed further to the +Y side than measurement station 300. The pair of laser interferometers 76a and 76b is placed symmetrically with respect to reference axis LV, on the +X side and −X side of reference axis LV, and irradiates measurement beams B1 and B2 parallel to the Y-axis on reflection surfaces 88d and 88c of fine movement stage WFS1 (or WFS2), respectively. Measurement beams B1 and B2 are reflected, for example, at fixed mirrors 47A and 47B fixed to main frame BD (refer to FIG. 1) via reflection surfaces 88d and 88c, respectively. By receiving each of the reflected lights, laser interferometers 76a and 76b measure each of the optical path lengths of measurement beams B1 and B2. Main controller 20 computes the position of fine movement stage WFS1 (or WFS2) in the X-axis direction, using the measurement results. Further, the pair of laser interferometers 76c and 76d is placed symmetrically with respect to reference axis LV, on the +X side and −X side of reference axis LV, and irradiates measurement beams B3 and B4 parallel to the Y-axis on reflection surfaces 88b and 88a of fine movement stage WFS2 (or WFS1), respectively. Measurement beams B3 and B4 are reflected, for example, at fixed mirrors 47C and 47D fixed to main frame BD via reflection surfaces 88b and 88a, respectively. By receiving each of the reflected lights, laser interferometers 76c and 76d measure each of the optical path lengths of measurement beams B3 and B4. Main controller 20 computes the position of fine movement stage WFS2 (or WFS1) in the X-axis direction, using the measurement results.

Next, a configuration and the like of fine movement stage position measurement system 70D (refer to FIG. 3), which is used to measure positional information (including positional information in the θz direction) within the XY plane when fine movement stages WFS1 and WFS2 are delivered from coarse movement stage WCS1 to coarse movement stage WCS2, will be described.

Figure 17:
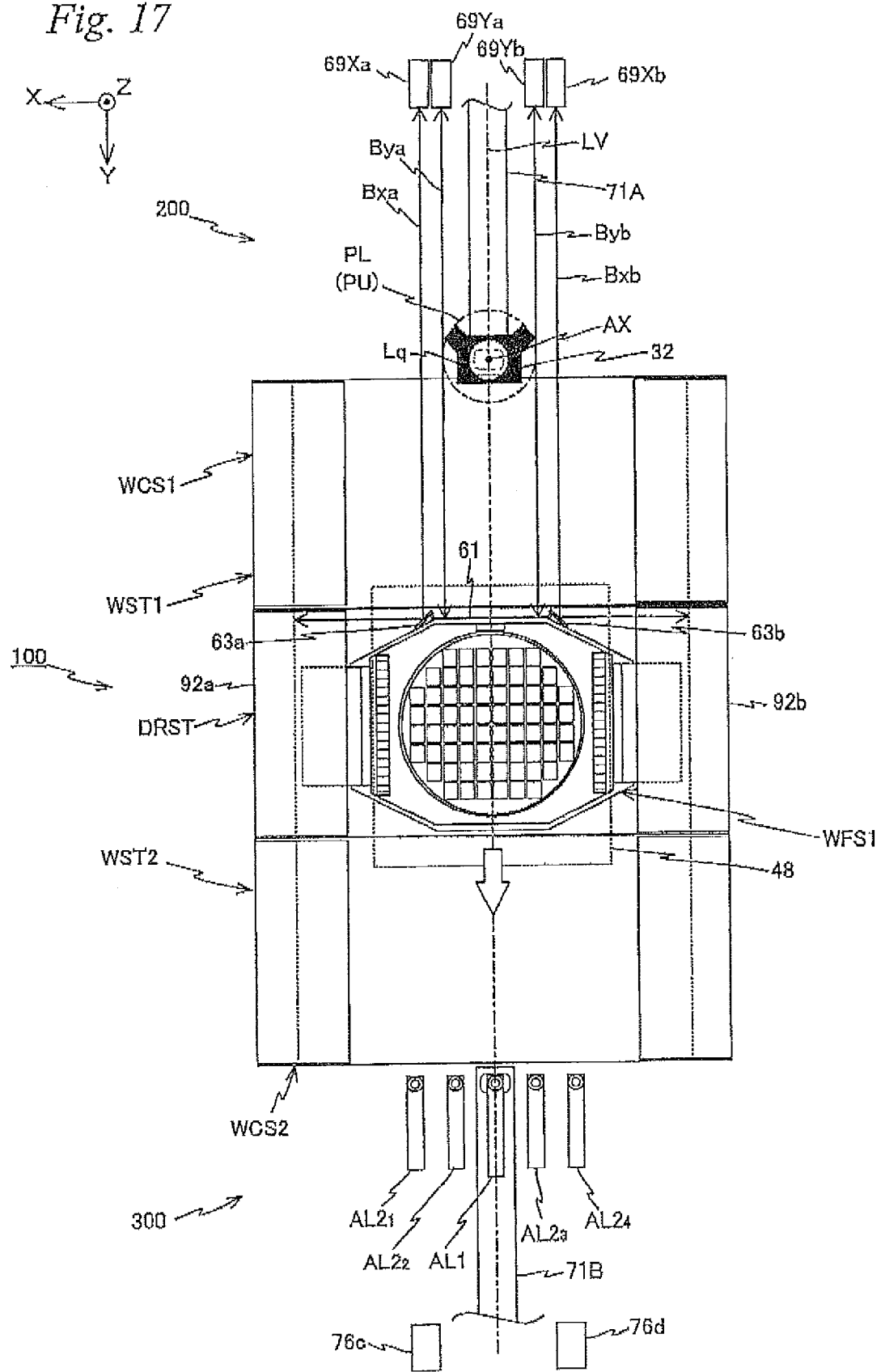
FIG. 17 is a view used to explain a placement of a laser interferometer configuring fine movement stage position measurement system 70D.

FIG. 17 shows a partially omitted view of exposure apparatus 100 when viewed from above (the +Z direction). Incidentally, in FIG. 17, illustration of one of the two fine movement stages (in this case, fine movement stage WFS2), and laser interferometers 76a and 76b previously described configuring fine movement stage position measurement system 70C, is omitted.

Fine movement stage position measurement system 70D includes a pair of Y laser interferometers 69Ya and 69Yb, and a pair of X laser interferometers 69Xa and 69Xb, shown in FIG. 17. Y laser interferometer 69Ya and X laser interferometer 69Xa are each placed below (on the −Z side) laser interferometer 76a previously described (drawing omitted in FIG. 17, refer to FIG. 16). Y laser interferometer 691b and X laser interferometer 69Xb are each placed below (on the −Z side) laser interferometer 76b previously described (drawing omitted in FIG. 17, refer to FIG. 16). In this case, an optical path of each of the measurement beams (to be described later) of Y laser interferometers 69Ya and 69Yb, and X laser interferometers 69Xa and 69Xb are placed on approximately the same XY plane.

Y laser interferometers 69Ya and 69Yb are placed symmetrically with respect to reference axis LV, on the +X side and the −X side of reference axis LV, and irradiate measurement beams Bya and Byb which are parallel to the Y-axis on reflection surface 61 of fine movement stage WFS1 (or WFS2) and receive the reflected lights so as to measure the optical path length of each of the measurement beams Bya and Byb. Main controller 20 computes the position of fine movement stage WFS1 (or WFS2) in the Y-axis direction and the θz direction, using the measurement results.

Further, X laser interferometers 69Xa and 69Xb are placed symmetrically with respect to reference axis LV, on the +X side and the −X side of Y laser interferometers 69Ya and 69Yb, and irradiate measurement beams Bxa and Bxb which are parallel to the Y-axis on movable mirrors 63a and 63b of fine movement stage WFS1 (or WFS2). Now, when fine movement stages WFS1 and WFS2 are delivered from coarse movement stage WCS1 to coarse movement stage WCS2 via relay stage DRST, fine movement stages WFS1 and WFS2 are to move inside a space formed in coarse movement stage WCS1, relay stage DRST, and coarse movement stage WCS2, respectively (refer to FIGS. 24A to 24D), as it will be described later on. On this movement, measurement beams Bxa and Bxb reflected by movable mirrors 63 and 63b, respectively, are reflected off reflection surfaces formed on side surfaces (inner side surfaces) that face each other of side wall sections 92a and 92b of coarse movement stage WCS1, relay stage DRST, and coarse movement stage WCS2. X laser interferometers 69Xa and 69Xb receive the reflected lights of measurement beams Bxa and Bxb via movable mirrors 63a and 63b of fine movement stage WFS1 (or WFS2), respectively, and measure the optical path lengths of each of the measurement beams Bxa and Bxb. Main controller 20 computes the position of fine movement stage WFS1 (or WFS2) in the X-axis direction, using the measurement results. Incidentally, in the embodiment, while the position of fine movement stage WFS1 (or WFS2) in the X-axis direction is computed using the optical path lengths of the two measurement beams Bxa and Bxb, as well as this, for example, the position of fine movement stage WFS1 (or WFS2) in the X-axis direction can be computed using a difference between the optical path lengths of measurement beams Bxa and Bya. In this case, one X laser interferometer is acceptable.

In exposure apparatus 100 of the embodiment structured in the manner described above, when manufacturing a device, exposure by the step-and-scan method is performed on wafer W held by one of the fine movement stages (in this case, WFS1, as an example) held by coarse movement stage WCS1 located in exposure station 200, and a pattern of reticle R is transferred on each of a plurality of shot areas on wafer W. The exposure operation by this step-and scan method is performed by main controller 20, by repeating a movement operation between shots in which wafer stage WST1 is moved to a scanning starting position (an acceleration starting position) for exposure of each shot area on wafer W, and a scanning exposure operation in which a pattern formed on reticle R is transferred onto each of the shot areas by the scanning exposure method, based on results of wafer alignment (for example, information on array coordinates of each shot area on wafer W obtained by enhanced global alignment (EGA) that has been converted into a coordinate which uses the second fiducial marks as a reference) that has been performed beforehand, and results of reticle alignment and the like. Incidentally, the exposure operation described above is performed, in a state where liquid Lq is held in a space between tip lens 191 and water W, or more specifically, by liquid immersion exposure. Further, exposure is performed in the following order, from the shot area located on the +Y side on wafer W to the shot area located on the −Y side. Incidentally, details on EGA are disclosed in, for example, U.S. Pat. No. 4,780,617 and the like.

In exposure apparatus 100 of the embodiment, during the series of exposure operations described above, main controller 20 measures the position of fine movement stage WFS1 (wafer W) using fine movement stage position measurement system 70A, and the position of wafer W is controlled based on the measurement results.

Figure 18A:
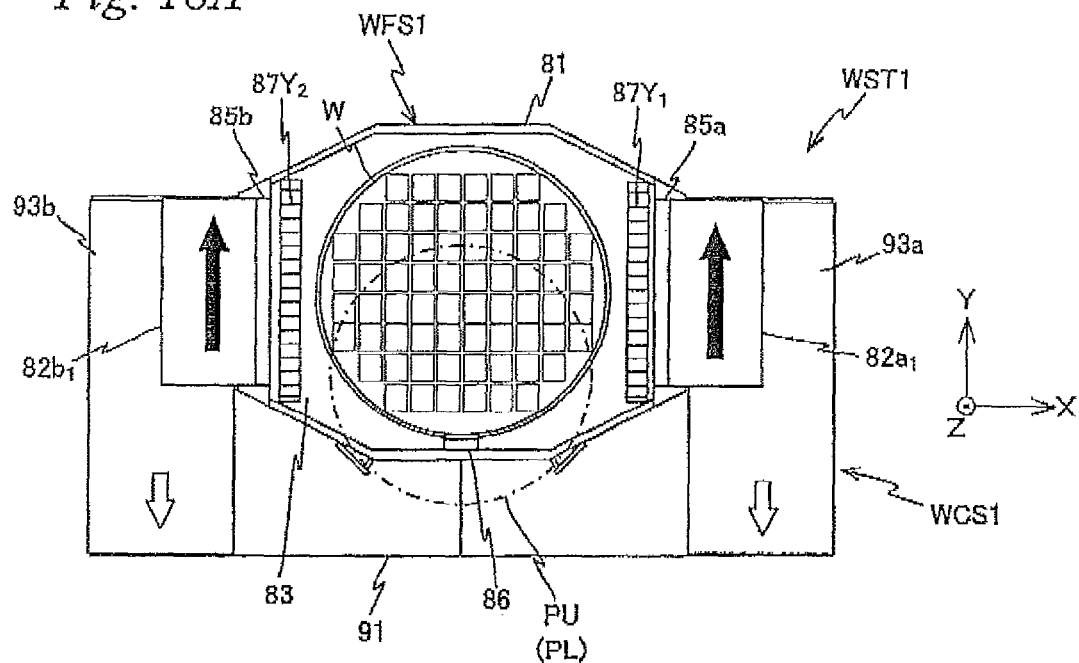
FIG. 18A is a view used to explain a drive method of a wafer at the time of scanning exposure.

Incidentally, while wafer W has to be scanned with high acceleration in the Y-axis direction at the time of scanning exposure operation described above, in exposure apparatus 100 of the embodiment, main controller 20 scans wafer W in the Y-axis direction by driving (refer to the black arrow in FIG. 18A) only fine movement stage WFS1 in the Y-axis direction (and in directions of the other five degrees of freedom, if necessary), without driving coarse movement stage WCS1 in principle at the time of scanning exposure operation as shown in FIG. 18A. This is because when moving only fine movement stage WFS1, weight of the drive object is lighter when comparing with the case where coarse movement stage WCS1 is driven, which allows an advantage of being able to drive wafer W with high acceleration. Further, because position measuring accuracy of fine movement stage position measurement system 70A is higher than wafer stage position measurement system 16A as previously described, it is advantageous to drive fine movement stage WFS1 at the time of scanning exposure. Incidentally, at the time of this scanning exposure, coarse movement stage WCS1 is driven to the opposite side of fine movement stage WFS1 by an operation of a reaction force (refer to the outlined arrow in FIG. 18A) by the drive of fine movement stage WFS1. More specifically, because coarse movement stage WCS1 functions as a countermass, momentum of the system consisting of the entire wafer stage WST1 is conserved, and centroid shift does not occur, inconveniences such as unbalanced load acting on base board 12 by the scanning drive of fine movement stage WFS1 do not occur.

Figure 18B:
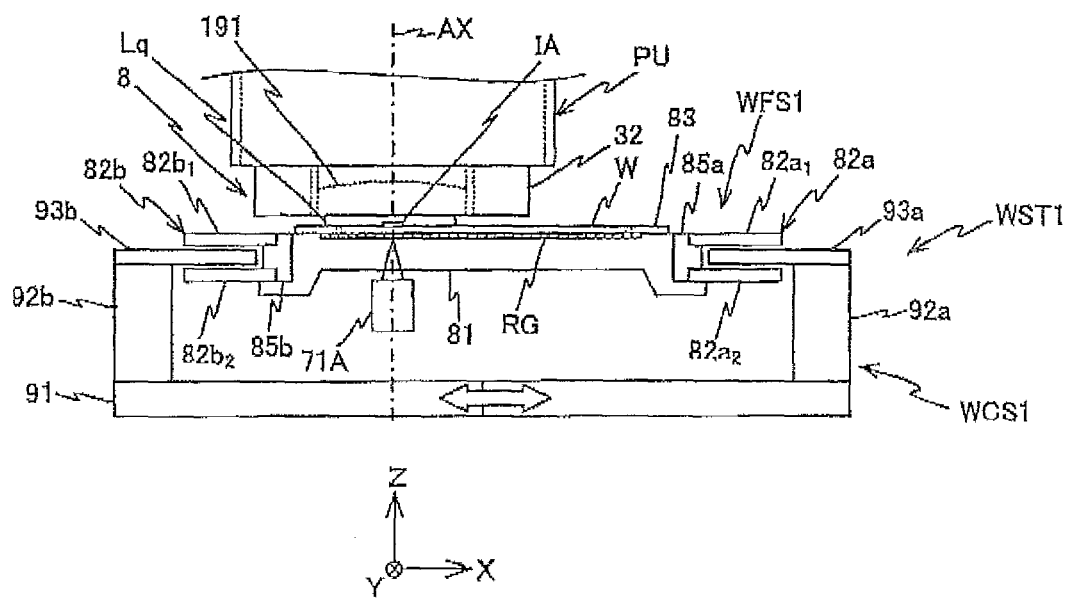
FIG. 18B is a view used to explain a driving method of a wafer at the time of stepping.

Meanwhile, when movement (stepping) operation between shots in the X-axis direction is performed, because movement capacity in the X-axis direction of fine movement stage WFS1 is small, main controller 20 moves wafer W in the X-axis direction by driving coarse movement stage WCS1 in the X-axis direction as shown in FIG. 18B.

In parallel with exposure to water W on fine movement stage WFS1 described above, wafer exchange, wafer alignment, and the like are performed on the other fine movement stage WFS2. Wafer exchange is performed, by unloading wafer W which has been exposed from above fine movement stage WFS2 by a wafer carrier system (not shown), as well as loading a new wafer W on fine movement stage WFS2 when coarse movement stage WCS2 supporting fine movement stage WFS2 is at a wafer exchange position in the vicinity of measurement station 300. Here, at the wafer exchange position, a decompression chamber (decompressed space) formed by a wafer holder (omitted in drawings) of fine movement stage WFS2 and the back surface of wafer W is connected to a vacuum pump via an exhaust pipe line (not shown) and piping, and by main controller 20 making the vacuum pump operate, gas inside the decompression chamber is exhausted outside via the exhaust pipe line and the piping, which creates a negative pressure within the decompression chamber and starts the suction of wafer W by the wafer holder. And when the inside of the decompression chamber reaches a predetermined pressure (negative pressure), main controller 20 suspends the vacuum pump. When the vacuum pump is suspended, the exhaust pipe line is closed by an action of a check valve (not shown). Accordingly, the decompressed state of the decompression chamber is maintained, and wafer W is held by the wafer holder even if tubes and the like used to suction the gas in the decompression chamber by vacuum are not connected to fine movement stage WFS2. This allows fine movement stage WFS2 to be separated from the coarse movement stage and to be carried without any problems.

On wafer alignment, first of all, main controller 20 drives fine movement stage WFS2 so as to position measurement plate 86 on fine movement stage WFS2 right under primary alignment system AL1, and detects the second fiducial mark using primary alignment system AL1. Then, as disclosed in, for example, PCT International Publication No. 2007/097379 (the corresponding U.S. Patent Application Publication No. 2008/0088843) and the like, for example, main controller 20 can move wafer stage WST2 in the −Y direction and position wafer stage WST at a plurality of points on the movement path, and each time the position is set, measures (obtains) positional information of the alignment marks in the alignment shot area (sample shot area), using at least cue of alignment systems AL1, $AL2_2$, and $AL2_3$. For example, in the case of considering a case where positioning is performed four times, main controller 20, for example, uses primary alignment system AL1 and secondary alignment systems $AL2_2$ and $AL2_3$ at the time of the first positioning to detect alignment marks (hereinafter also referred to as sample marks) in three sample shot areas, uses alignment systems AL1, and $AL2_1$ to $AL2_4$ at the time of the second positioning to detect five sample marks on wafer W, uses alignment systems AL1, and $AL2_1$ to $AL2_4$ at the time of the third positioning to detect five sample marks, and uses primary alignment system AL1, and secondary alignment systems $AL2_2$ and $AL2_3$ at the time of the fourth positioning to detect three sample marks, respectively. Accordingly, positional information of alignment marks in a total of 16 alignment shot areas can be obtained in a remarkably shorter period of time, compared with the case where the 16 alignment marks are sequentially measured with a single alignment system. In this case, each of alignment systems AL1, $AL2_2$ and $AL2_3$ detects a plurality of alignment marks (sample marks) arrayed along the Y-axis direction that are sequentially placed within the detection area (e.g. corresponding to the irradiation area of the detection light), corresponding with the movement operation of wafer stage WST2 described above. Therefore, on the measurement of the alignment marks described above, it is not necessary to move wafer stage WST in the X-axis direction.

In the embodiment, main controller 20 performs position measurement including the detection of the second fiducial marks, and in the case of the wafer alignment, performs position measurement of fine movement stage WFS2 in the YY plane supported by coarse movement stage WCS2 at the time of the wafer alignment, using fine movement stage position measurement system 70B including measurement arm 71B. However, besides this, wafer alignment can be performed while measuring the position of wafer W via wafer stage position measurement system 16B previously described, in the case of performing the movement of fine movement stage WFS2 at the time of wafer alignment integrally with coarse movement stage WCS2. Further, because measurement station 300 and exposure station 200 are arranged apart, the position of fine movement stage WFS2 is controlled on different coordinate systems at the time of wafer alignment and at the time of exposure. Therefore, main controller 20 converts array coordinates of each shot area on wafer W acquired from the wafer alignment into array coordinates which are based on the second fiducial marks.

Figure 19A:
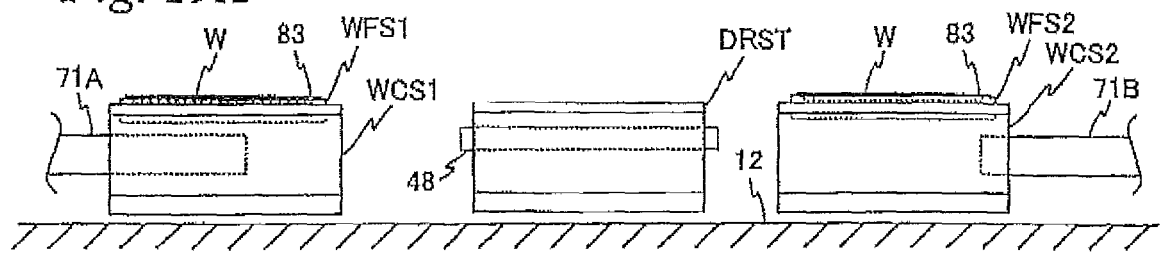
FIG. 19A to FIG. 19D are views used to explain a parallel processing performed using fine movement stages WFS1 and WFS2 (No. 1).
Figure 27:
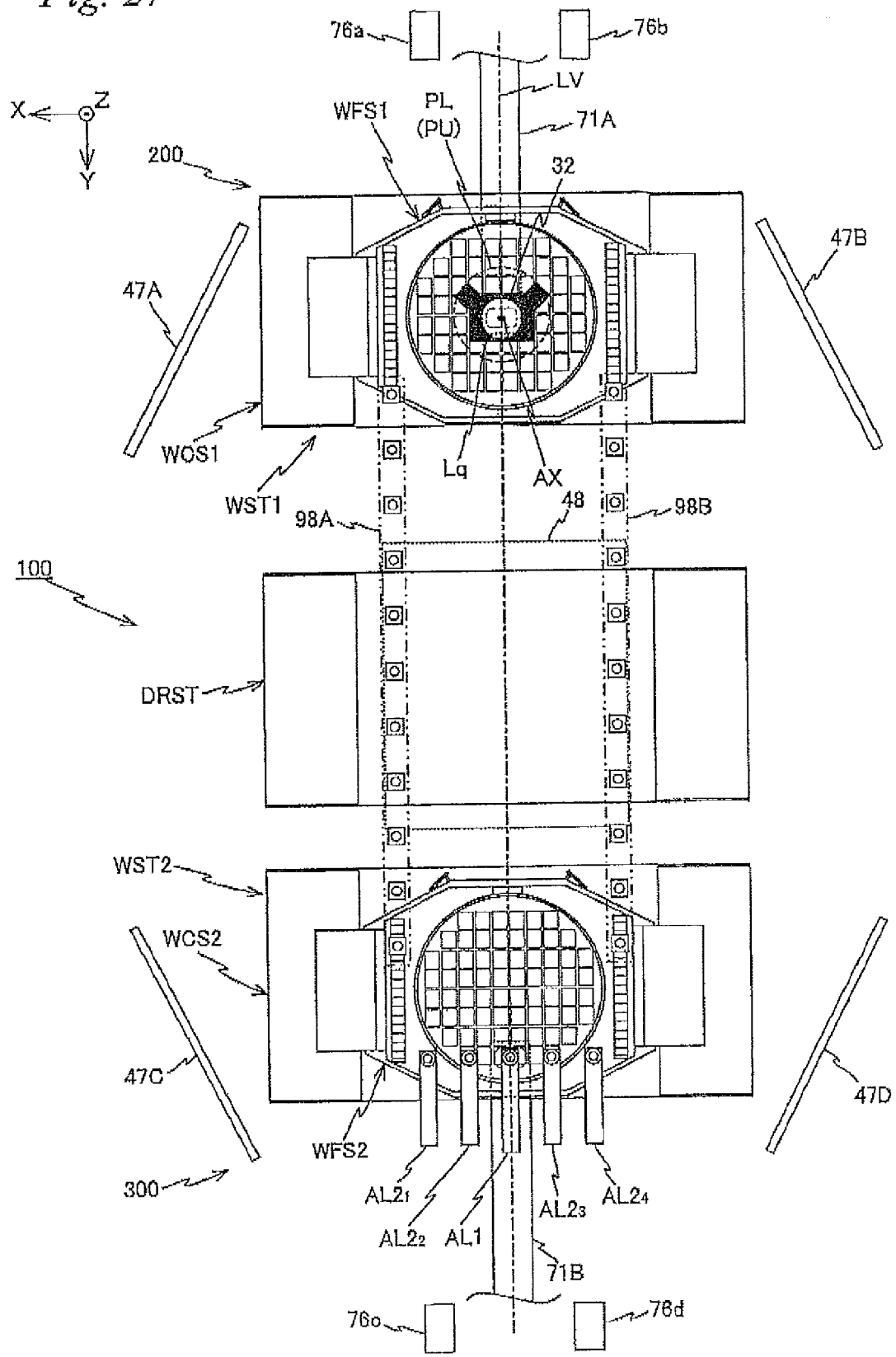
FIG. 27 is a view used to explain a parallel processing performed using fine movement stages WFS1 and WFS2, and is a view showing the exposure apparatus in FIG. 19A from above.

While wafer alignment to wafer W held by fine movement stage WFS2 is completed in the manner described above, exposure of wafer W which is held by fine movement stage WFS1 in exposure station 200 is still being continued. FIGS. 19A and 27 show a positional relation of coarse movement stages WCS1, WCS2 and relay stage DRST at the stage when wafer alignment to wafer W has been completed.

Figure 19B:
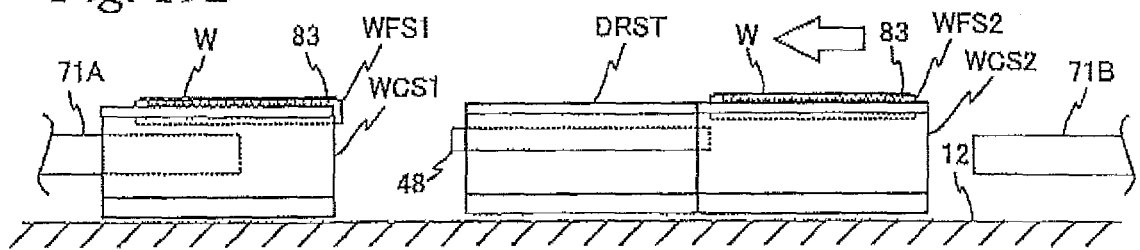
Figure 28:
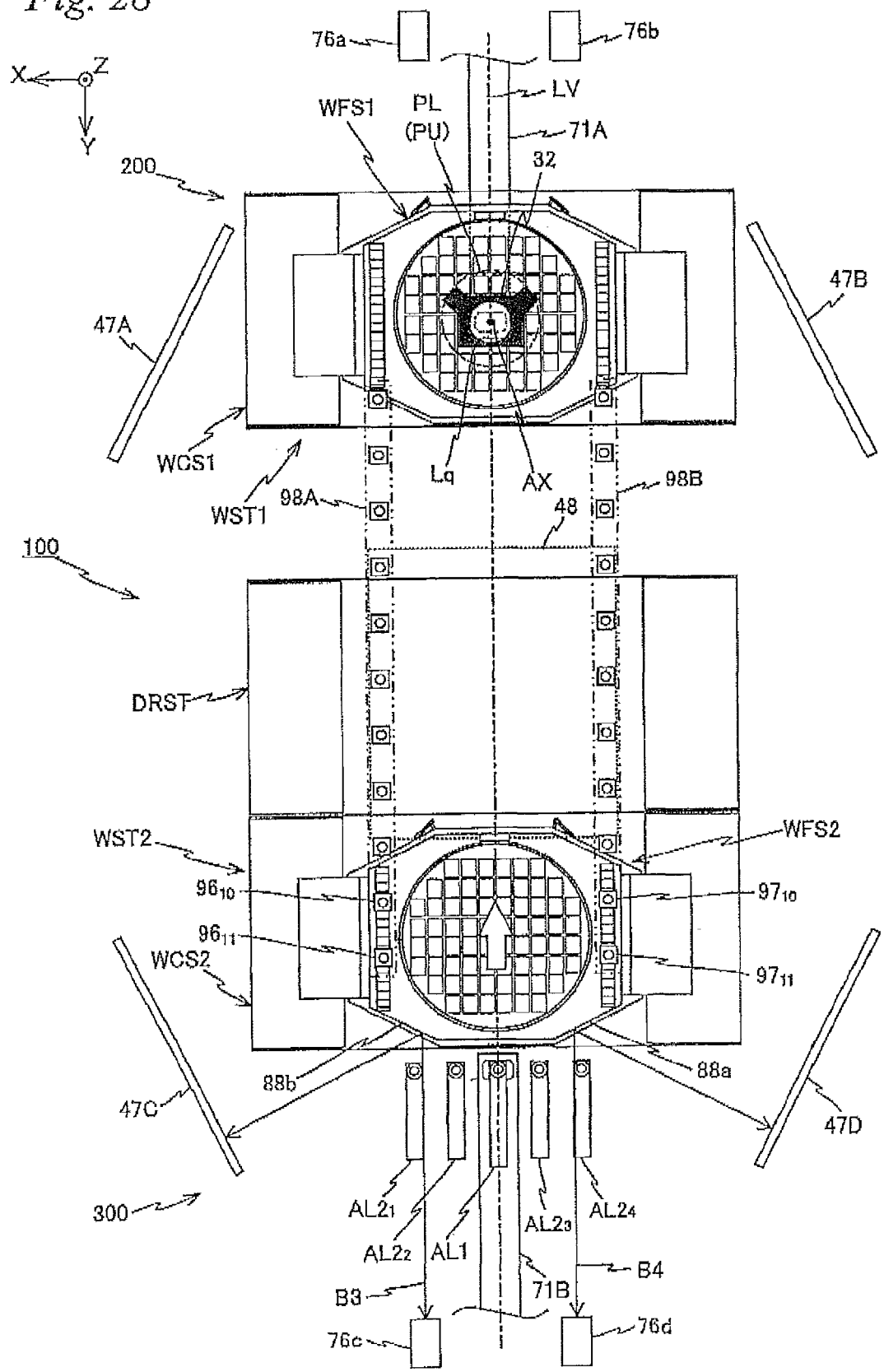
FIG. 28 is a view used to explain a parallel processing performed using fine movement stages WFS1 and WFS2, and is a view showing the exposure apparatus in FIG. 19B from above.

Main controller 20 drives wafer stage WST2 by a predetermined distance in the −Y direction via coarse movement stage drive system 51B, as shown in an outlined arrow in FIGS. 19B and 28, and makes wafer stage WST2 be in contact or be in proximity by around 500 μm to relay stage DRST which is standing still at a predetermined waiting position (for example, substantially coincides with a center position between an optical axis AX of projection optical system PL and a detection center of primary alignment system AL1). In this case, on moving wafer stage WST2 toward relay stage DRST, main controller 20 switches the measurement system measuring the positional information of wafer stage WST2 at the measurement limit position (the position shown in FIG. 16) in the −Y direction of fine movement stage position measurement system 70B (measurement arm 70B), from fine movement stage position measurement system 70B to fine movement stage position measurement system 70C. In this case, in order to continuously link the position (position measurement value) of wafer stage WST2 which is to be measured, main controller 20 resets the measurement values of fine movement stage position measurement system 70C, using the measurement values of fine movement stage position measurement system 703. More specifically, main controller 20 resets each of the measurement values of encoder heads (Y heads) 96 and 97 configuring encoder system 78 and laser interferometers 75c and 76d configuring laser interferometer system 79 included in fine movement stage position measurement system 70C, so that the measurement values of fine movement stage position measurement system 70C coincide with the measurement values of fine movement stage position measurement system 70B. Hereinafter, main controller 20 moves wafer stage WST2 in the −Y direction, while measuring the position (information) of wafer stage WST2 based on the measurement values (in FIG. 28, the measurement values of Y heads $96_{10}$, $96_{11}$, $97_{10}$, and $97_{11}$, and laser interferometers 76c and 76d) of fine movement stage position measurement system 70C. Incidentally, on this movement, main controller 20 can control the position of wafer stage WST2, based on the measurement values of wafer stage position measurement system 16B.

In this case, the switching of the measurement system is not performed only at the measurement limit position described above, and can also be performed before the measurement limit position (before the movable body subject to measurement reaches the measurement limit position). In this case, linkage (associating) of measurement values can be performed within a measurement range of the two measurement systems that overlap each other.

Figure 19C:
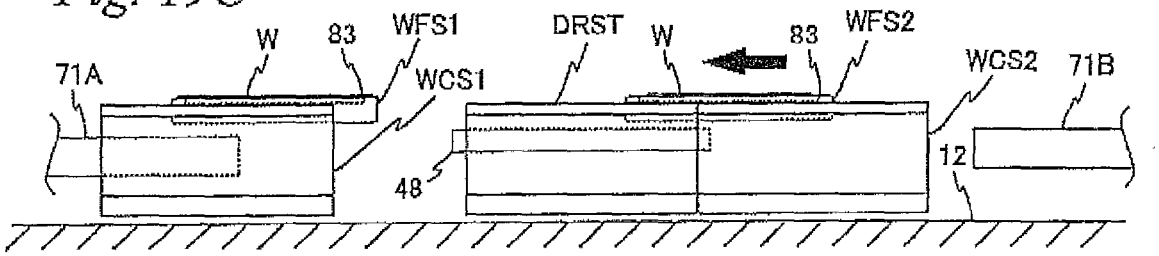
Figure 19D:
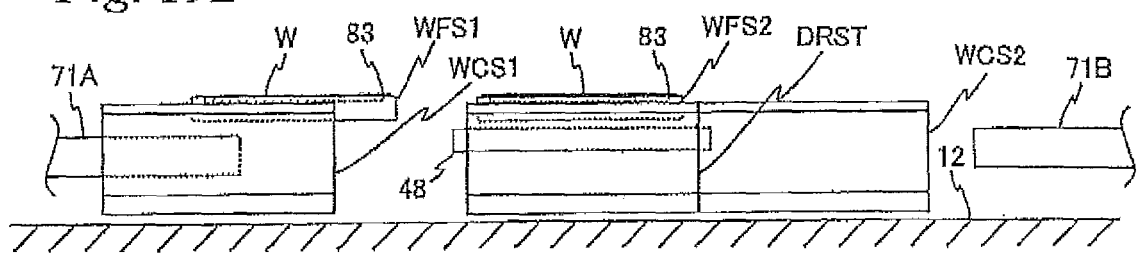
Figure 19D:
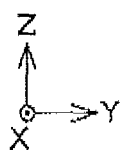
Figure 29:
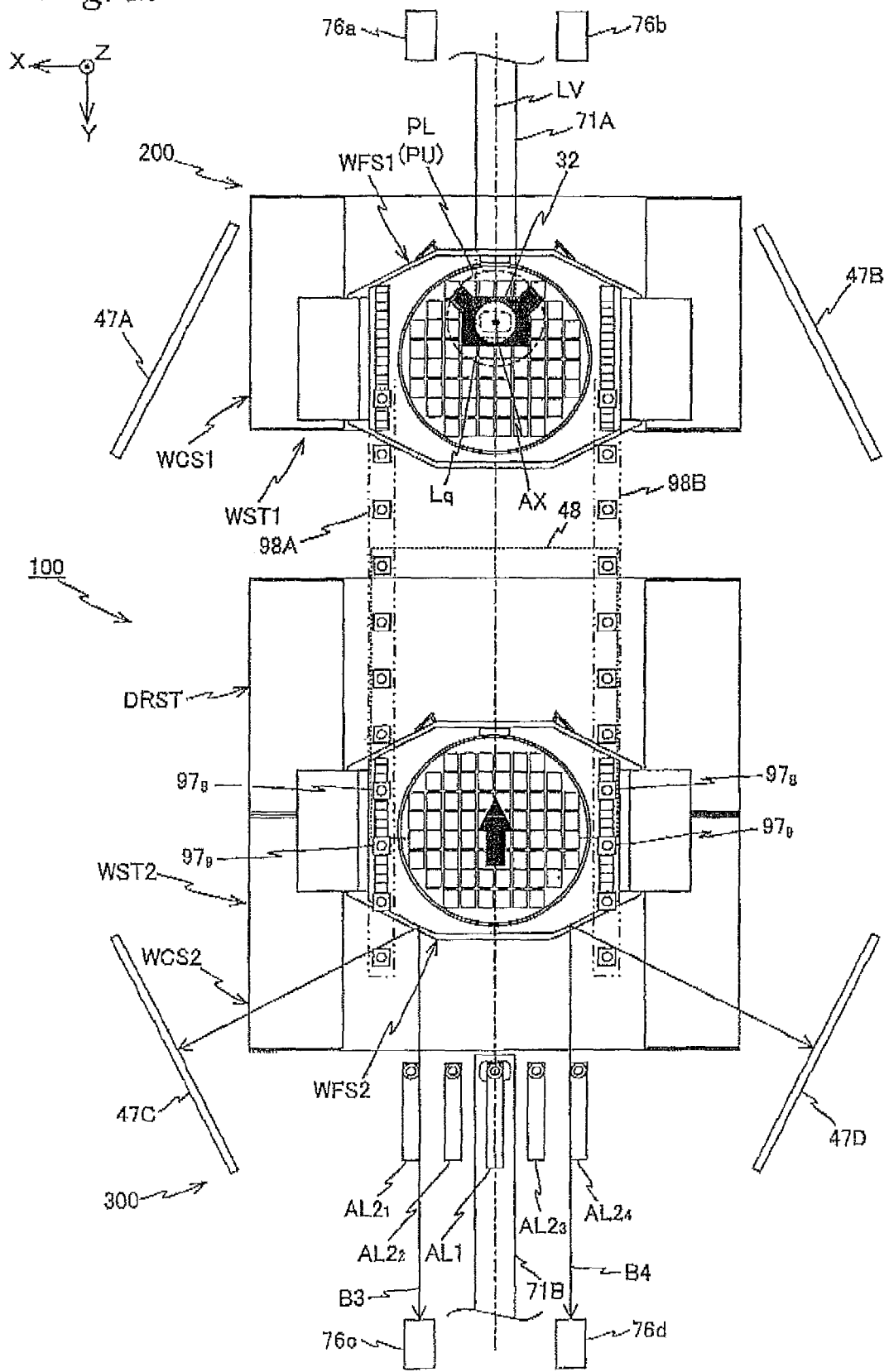
FIG. 29 is a view used to explain a parallel processing performed using fine movement stages WFS1 and WFS2, and is a view showing the exposure apparatus in FIG. 19C from above.
Figure 30:
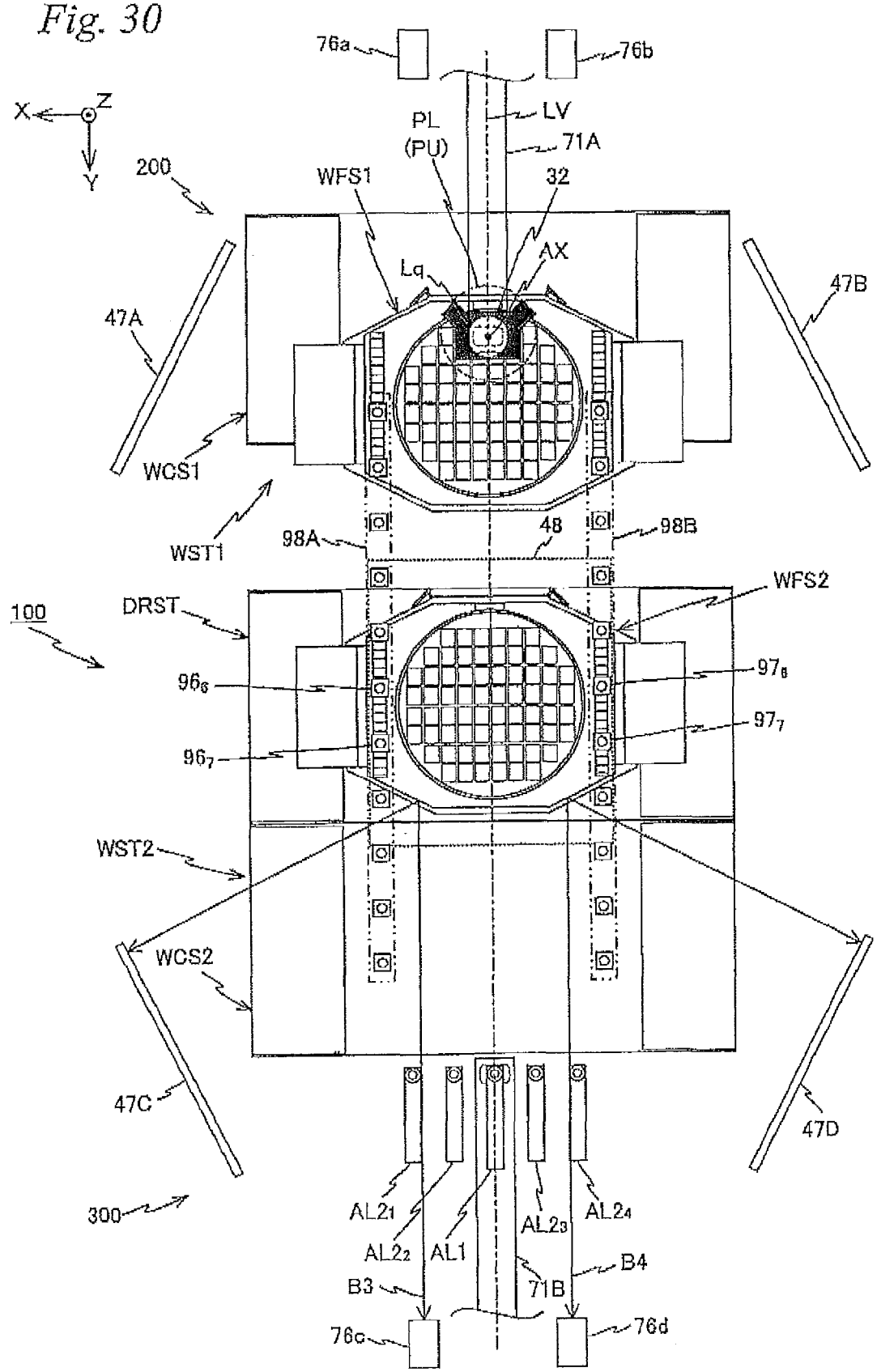
FIG. 30 is a view used to explain a parallel processing performed using fine movement stages WFS1 and WFS2, and is a view showing the exposure apparatus in FIG. 19D from above.

Next, main controller 20 controls the current flowing in Y drive coils of fine movement stage drive systems 52B and 52C, and drives fine movement stage WFS2 in the −Y direction by a Lorentz force while measuring the positional information of fine movement stage WFS2 based on the measurement values of fine movement stage position measurement system 70C (in FIG. 29, Y heads $96_8$, $96_9$, $97_8$, and $97_9$, and laser interferometers 76c and 76d), as is shown by the black arrow in FIGS. 19C and 29, and moves fine movement stage WFS2 from coarse movement stage WCS2 onto relay stage DRST. FIGS. 19D and 30 show a state where fine movement stage WFS2 has been moved and mounted on relay stage DRST.

Main controller 20 waits for the exposure to wafer W on fine movement stage WFS1 to be completed, in a state where relay stage DRST and coarse movement stage WCS2 are waiting at a position shown in FIGS. 19D and 30.

Figure 21:
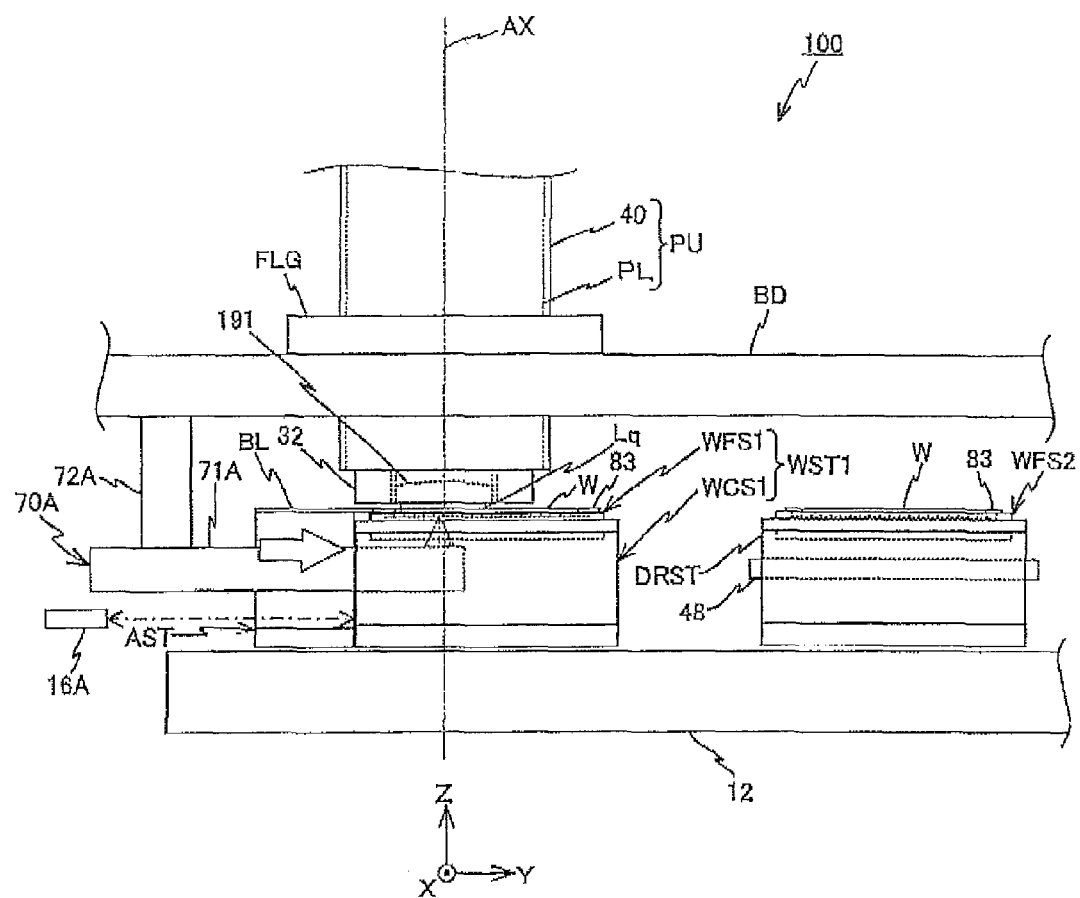
FIG. 21 is a view used to explain a delivery of a liquid immersion space (liquid Lq) performed between a fine movement stage and a blade (No. 1)

FIG. 21 shows a state of wafer stage WST1 immediately after completing the exposure.

Figure 25A:
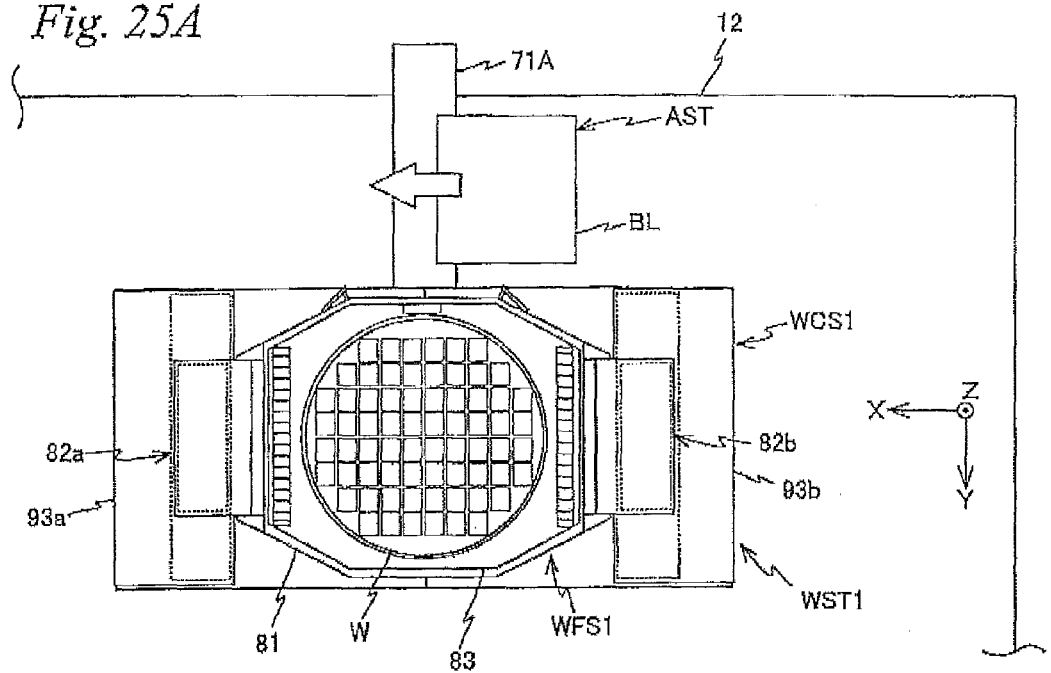
FIGS. 25A and 25B are views used to explain a movement of an auxiliary stage on a delivery of a liquid immersion space (liquid Lq) performed between a fine movement stage and a blade (No. 1)

Prior to the completion of exposure, main controller 20 drives auxiliary stage AST (blade BL) in the +X direction by a predetermined amount from the waiting position shown in FIG. 20 via auxiliary stage drive system 58 (refer to FIG. 3) as is shown by an outlined arrow in FIG. 25A. This positions the tip of blade BL above measurement arm 71A, as shown in FIG. 25A. Then, main controller 20 waits for the exposure to be completed in this state.

Figure 22:
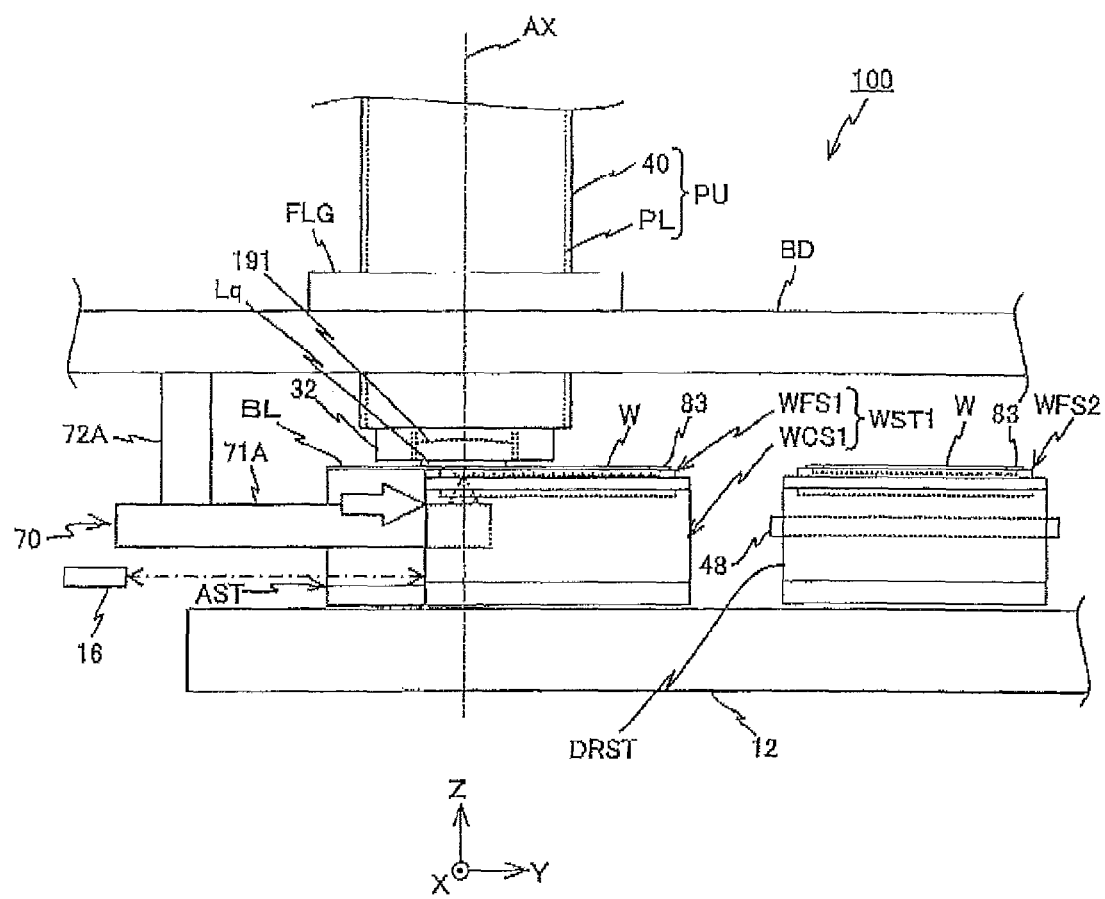
FIG. 22 is a view used to explain a delivery of a liquid immersion space (liquid Lq) performed between a fine movement stage and a blade (No. 2)
Figure 25B:
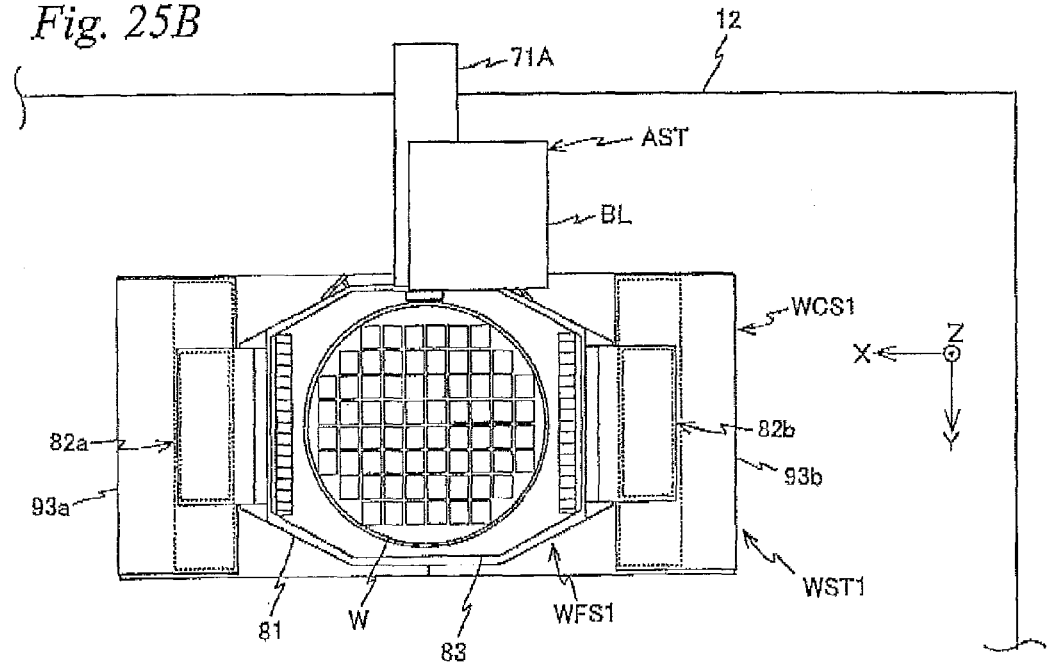
Figure 26:
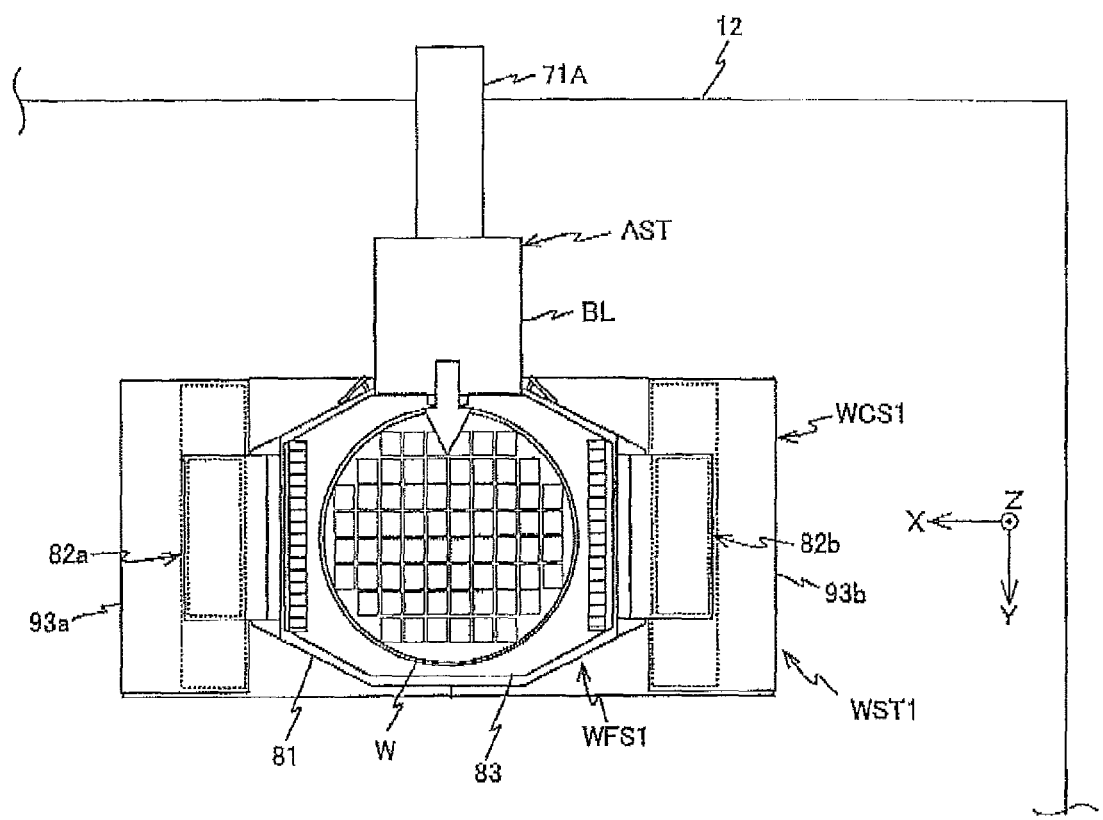
FIG. 26 is a view used to explain a movement of an auxiliary stage on a delivery of a liquid immersion space (liquid Lq) performed between a fine movement stage and a blade (No. 2)

Then, when exposure has been completed, main controller 20 drives auxiliary stage AST (blade BL) in the +X direction and the +Y direction via auxiliary stage drive system 58, so as to make blade BL be in contact or in proximity in the Y-axis direction by a clearance of around 300 μm to fine movement stage WFS1, as shown in FIGS. 21 and 25B. More specifically, main controller 20 begins to set blade BL and fine movement stage WFS1 to a scrum state. Then, main controller 20 drives auxiliary stage AST (blade BL), furthermore in the +X direction. Then, when the center of blade BL coincides with the center of measurement arm 71A, auxiliary stage AST (blade BL) is driven (refer to the outlined arrow in FIGS. 22 and 26) in the +Y direction integrally with wafer stage WST1, while the scrum state of blade BL and fine movement stage WFS1 is maintained, as shown in FIGS. 22 and 26. By this operation, the liquid immersion space formed by liquid Lq held between tip lens 191 and fine movement stage WFS1 is passed from fine movement stage WFS1 to blade BL. FIG. 22 shows a state just before the liquid immersion space farmed by liquid Lq is passed from fine movement stage WFS1 to blade BL. In the state shown in FIG. 22, liquid Lq is held between tip lens 191, and fine movement stage WFS1 and blade BL. Incidentally, in the case of driving blade BL and fine movement stage WFS1 in proximity, it is desirable to set a gap (clearance) between blade BL and fine movement stage WFS1 so as to prevent or to suppress leakage of liquid Lq. In this case, in proximity includes the case where the gap (clearance) between blade BL and fine movement stage WFS1 is zero, or in other words, the case when both blade BL and fine movement stage WFS1 are in contact.

Figure 23:
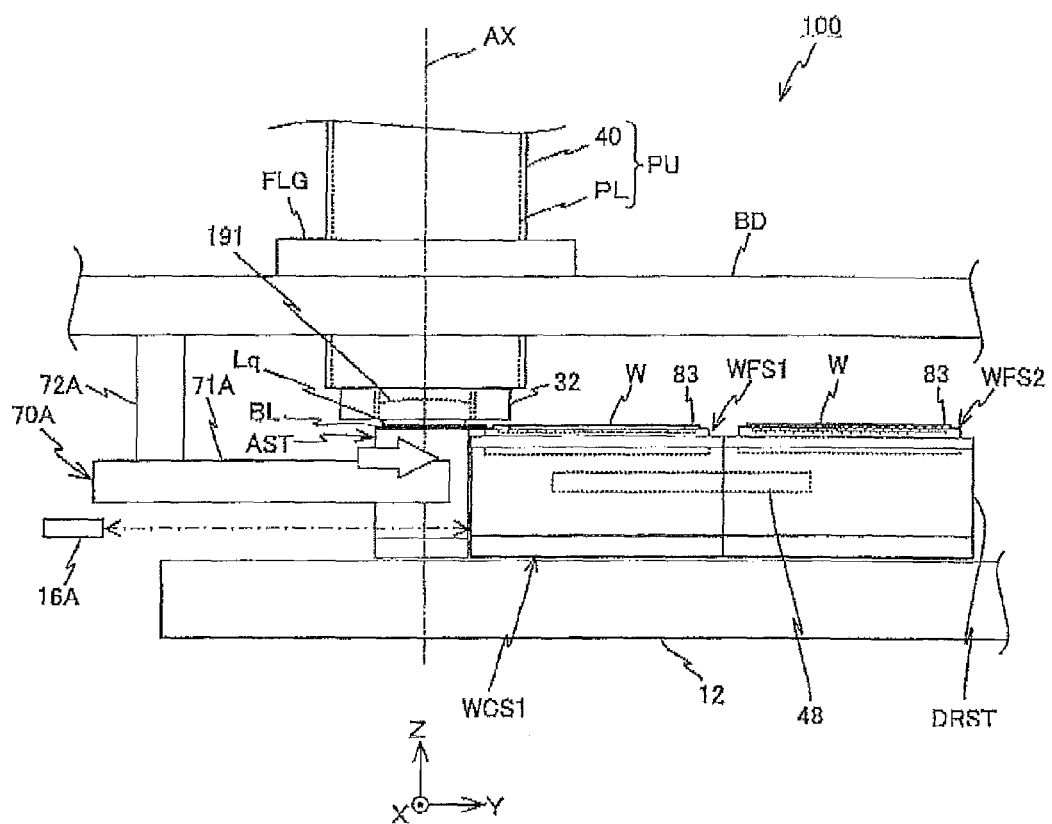
FIG. 23 is a view used to explain a delivery of a liquid immersion space (liquid Lq) performed between a fine movement stage and a movable blade (No. 3)

Then, when the liquid immersion space has been passed from fine movement stage WFS1 to blade BL, as shown in FIG. 23, coarse movement stage WCS1 holding fine movement stage WFS1 comes into contact or in proximity by a clearance of around 500 μm to relay stage DRST waiting in a proximity state with coarse movement stage WCS2, holding fine movement stage WFS2 at the waiting position previously described. During the stage where coarse movement stage WCS1 holding fine movement stage WFS1 moves in the +Y direction, main controller 20 inserts carrier member 48 of carrier apparatus 46 into the space of coarse movement stage WCS1, via carrier member drive system 54. Incidentally, when moving wafer stage WST2 toward relay stage DRST, main controller 20 switches the measurement system measuring the positional information of wafer stage WST1 at the measurement limit position (the position shown in FIG. 16) in the +Y direction of fine movement stage position measurement system 70A (measurement arm 70A), from fine movement stage position measurement system 70A to fine movement stage position measurement system 70C. In this case, in order to continuously link the position (position measurement value) of wafer stage WST1 which is to be measured, main controller 20 resets the measurement values of fine movement stage position measurement system 70C, using the measurement values of fine movement stage position measurement system 70A. More specifically, main controller 20 resets each of the measurement values of encoder heads (Y heads) 96 and 97 configuring encoder system 78 and laser interferometers 76a and 76b configuring laser interferometer system 79 included in fine movement stage position measurement system 70C, so that the measurement values of fine movement stage position measurement system 70C coincide with the measurement values of fine movement stage position measurement system 70A. Hereinafter, main controller 20 moves wafer stage WST2 in the −Y direction, while measuring the position (information) of wafer stage WST2 based on the measurement values (in FIG. 16, the measurement values of Y heads $96_1$, $96_2$, $97_1$, and $97_2$, and laser interferometers 76a and 76b) of fine movement stage position measurement system 70C. Incidentally, on this movement, main controller 20 can control the position of wafer stage WST1, based on the measurement values of wafer stage position measurement system 16A. Incidentally, the switching of the measurement system is not performed only at the measurement limit position described above, and can also be performed before the measurement limit position. Further, in this case, linkage (associating) of measurement values can be performed within a measurement range of the two measurement systems that overlap each other.

And, at the point when coarse movement stage WCS1 holding fine movement stage WFS1 comes into contact or in proximity to relay stage DRST, main controller 20 drives carrier member 48 upward so that fine movement stage WFS1 is supported from below.

Figure 31:
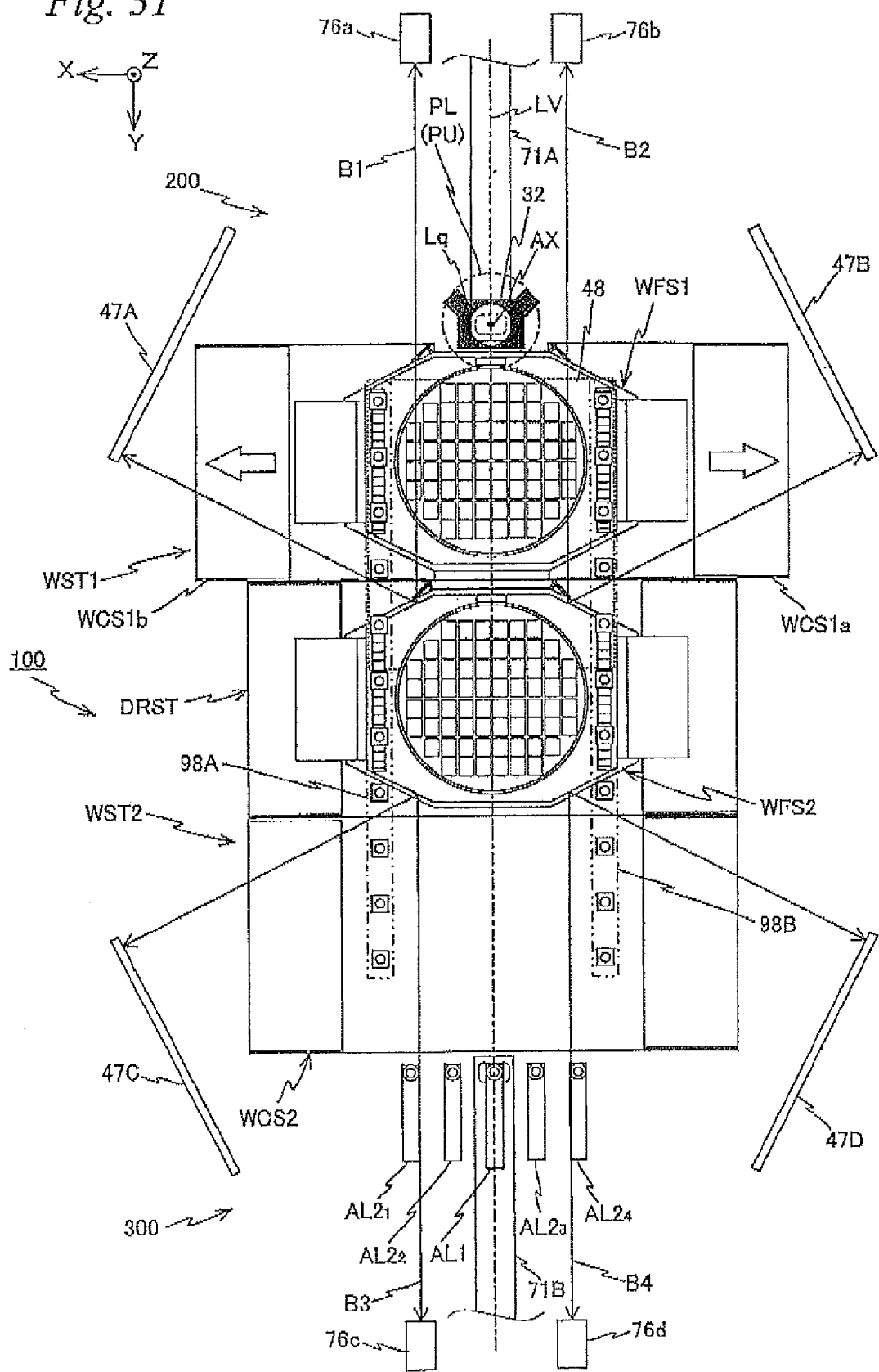
FIG. 31 is a view used to explain a parallel processing performed using fine movement stages WFS1 and WFS2, and is a view showing the exposure apparatus in FIG. 24A from above.

And, in this state, main controller 20 releases the lock mechanism (not shown), and separates coarse movement stage WCS1 into the first section WCS1a and the second section WCS1b (refer to the outlined arrow in FIG. 31), as shown in FIG. 31. By this operation, fine movement stage WFS1 is detachable from coarse movement stage WCS1. Then, main controller 20 drives carrier member 48 supporting fine movement stage WFS1 downward (in the −Z direction) perpendicularly to the XY plane, as is shown by the outlined arrow in FIG. 24A. By this drive, measurement beams Bya and Byb, and Bxa and Bxb from Y laser interferometers 69Ya and 69Yb and X laser interferometers 69Xa and 69Xb configuring fine movement stage position measurement system 70D respectively begin to fall on reflection surface 61 and movable mirrors 63a and 63b of fine movement stage WFS1. Therefore, main controller 20 switches the measurement system which measures the positional information of fine movement stage WFS1 in the XY plane supported by the movable member of carrier member 48, from fine movement stage position measurement system 70C to fine movement stage position measurement system 70D.

In this case, main controller 20 resets the measurement values of fine movement stage position measurement system 70D, using the measurement values of fine movement stage position measurement system 70C, and secures the continuity of the position (position measurement value) of wafer stage WST1 which is to be measured.

And then, main controller 20 locks the lock mechanism (not shown) after the first section WCS1a and the second section WCS1b are joined together.

Now, in the state shown in FIG. 31 where fine movement stage WFS1 is housed inside coarse movement stage WCS1 and fine movement stage WFS2 is also supported by relay stage DRST, main controller 20 can measure the positional information in the X-axis direction of fine movement stage WFS2 using laser interferometers 76a and 76b on the exposure station 200 side, as well as measure the positional information in the X-axis direction of fine movement stage WFS2 using laser interferometers 76c and 76d on the measurement station 300 side. In other words, in the embodiment, the size (length) and placement of the reflection surface of fixed mirrors 47A to 47D are set so that the laser interferometers used to measure the position of fine movement stage WFS2 (or WFS1) in the X-axis direction can be switched in a state where fine movement stage WFS2 (or WFS1) is supported by relay stage DRST. Therefore, when fine movement stage WFS1 is driven downward in a state (waiting state) where fine movement stage WFS2 is supported by relay stage DRST as shown in FIG. 31, corresponding to this, main controller 20 switches the measurement system used to measure the positional information of fine movement stage WFS2 in the X-axis direction from laser interferometers 76c and 76d to laser interferometers 76a and 76b. Incidentally, the positional information of the fine movement stage in directions of the remaining five degrees of freedom is also continuously measured by encoder system 78. As is described, because laser interferometer system 79 of the embodiment is configured so that the laser interferometer to be used is switched from laser interferometers 76c and 76d placed in the rear of the movement direction of movement stage WFS2 to laser interferometers 76a and 76b placed in front of the movement direction of WFS2 depending on the position of fine movement stage WFS2, the size of each of the fixed mirrors 47A to 47D can be reduced.

Figure 32:
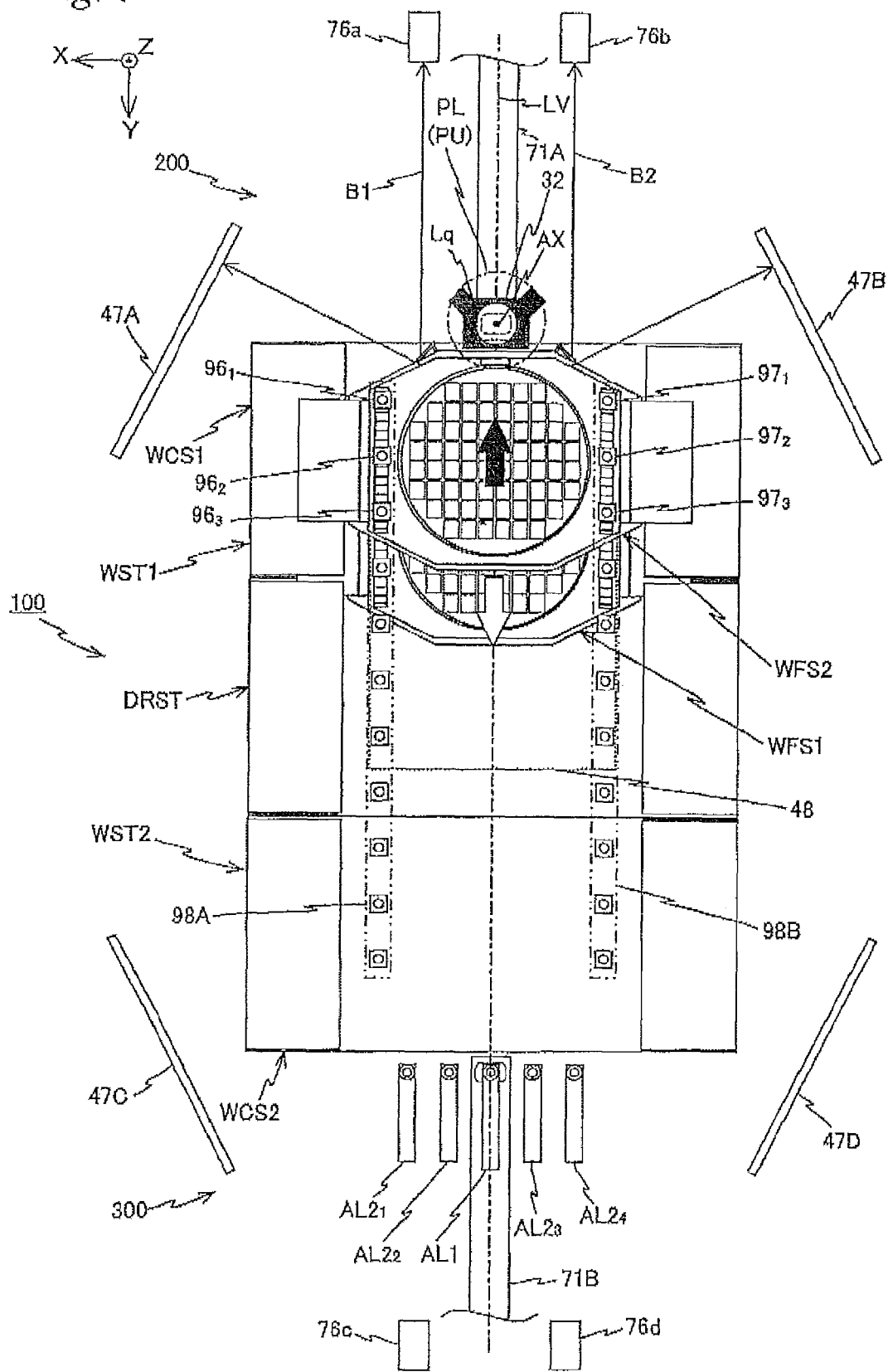
FIG. 32 is a view used to explain a parallel processing performed using fine movement stages WFS1 and WFS2, and is a view showing the exposure apparatus in FIG. 24B from above.

Next, main controller 20 moves carrier member 48 which supports fine movement stage WFS1 from below to the inside of stage main section 44 of relay stage DRST. FIGS. 24B and 32 show the state where carrier member 48 is being moved. The positional information (including the positional information in the θz direction) in the XY plane of fine movement stage WFS1 at this point is measured by fine movement stage position measurement system 70D previously described (refer to FIG. 17).

Further, concurrently with the movement of carrier member 48, main controller 20 controls the current flowing in the YZ coils of fine movement stage drive systems 52C and 52A based on measurement values (measurement values of Y heads $96_2$, $96_3$, $97_2$, and $97_3$ (or Y heads $96_1$, $96_2$, $97_1$, and $97_2$) and laser interferometers 76a and 76b in FIG. 32) of fine movement stage position measurement system 70C, and drives fine movement stage WFS2 in the −Y direction as is shown by the black arrow in FIGS. 24B and 32 by a Lorentz force, and moves (a slide movement) fine movement stage WFS2 from relay stage DRST onto coarse movement stage WCS1.

Figure 24A:
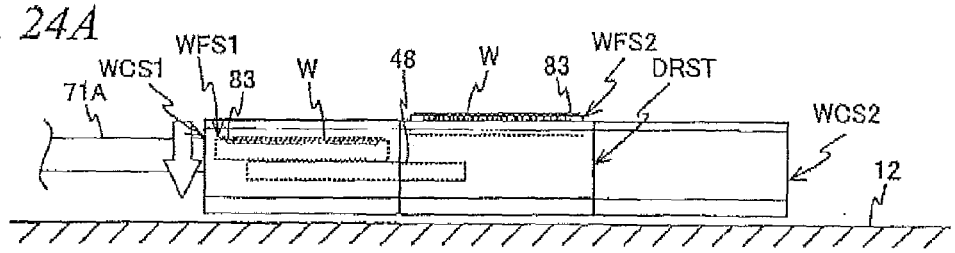
FIG. 24A to FIG. 24F are views used to explain a parallel processing performed using fine movement stage WFS1 and WFS2 (No. 2)
Figure 24B:
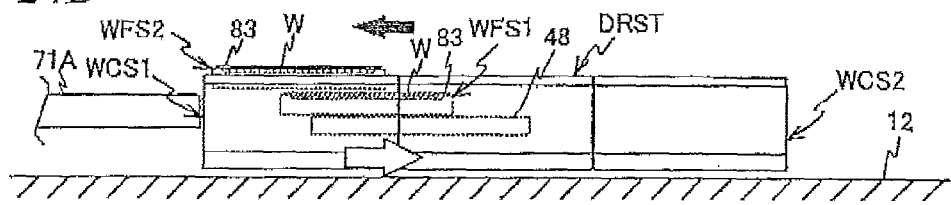
Figure 24C:
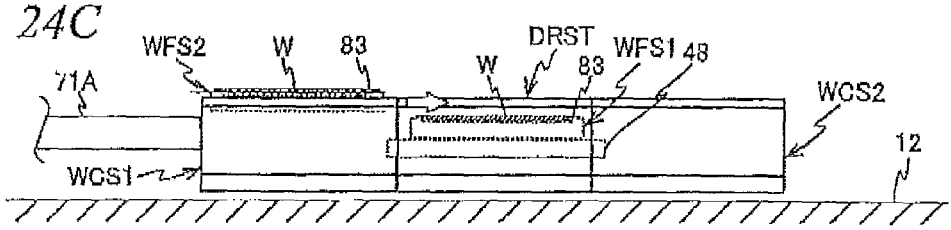

Further, after housing the carrier member main section of carrier member 48 into the space of relay stage DRST so that fine movement stage WFS1 is completely housed in the space of relay stage DRST, main controller 20 moves the movable member holding fine movement stage WFS1 in the +Y direction on the carrier member main section (refer to the outlined arrow in FIGS. 24C and 32).

Next, main controller 20 makes coarse movement stage WCS1 which holds fine movement stage WFS2 move in the −Y direction based on the measurement values of fine movement stage position measurement system 70C, and delivers the liquid immersion space held with tip lens 191 from blade BL to fine movement stage WFS2. The delivery of this liquid immersion space (liquid Lq) is performed by reversing the procedure of the delivery of the liquid immersion area from fine movement stage WFS1 to blade BL previously described. Incidentally, on this movement, main controller 20 can move coarse movement stage WCS1 in the −Y direction, based on the measurement values of wafer stage position measurement system 16A.

Further, on driving coarse movement stage WCS1 holding fine movement stage WFS2 in the −Y direction, main controller 20 switches the measurement system measuring the positional information of fine movement stage WFS2 (wafer stage WST1) at the measurement limit position (the position shown in FIG. 16) in the +Y direction of fine movement stage position measurement system 70A (measurement arm 70A), from fine movement stage position measurement system 70C to fine movement stage position measurement system 70A. In this case, main controller 20 resets the measurement values of (encoders 73x, 73ya, and 73yb and laser interferometers 75a, 75b, and 75c that configure) fine movement stage position measurement system 70A, using the measurement values of fine movement stage position measurement system 70C, and secures the continuity of the position (position measurement value) of fine movement stage WFS2 which is to be measured. Then, Main controller 20 drives wafer stage WST1 (coarse movement stage WCS1 and fine movement stage WFS2) in the −Y direction while measuring the positional information of wafer W held by wafer stage WST2, based on the measurement values of fine movement stage position measurement system 70A. Incidentally, the switching of the measurement system is not performed only at the measurement limit position described above, and can also be performed before the measurement limit position. Further, in this case, linkage (associating) of measurement values can be performed within a measurement range of the two measurement systems that overlap each other.

Figure 24D:
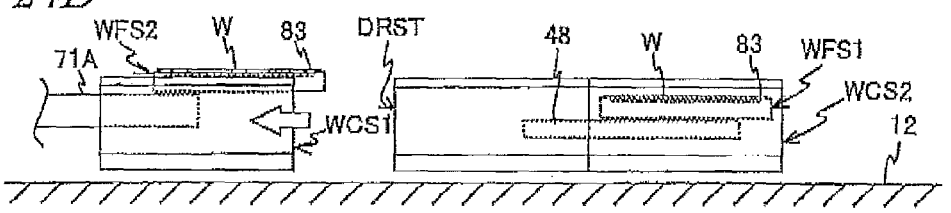

Then, prior to the beginning of exposure, main controller 20 performs reticle alignment in a procedure (a procedure disclosed in, for example, U.S. Pat. No. 5,646,413 and the like) similar to a normal scanning stepper, using the pair of reticle alignment systems RA1 and RA2 previously described, and the pair of first fiducial marks on measurement plate 86 of fine movement stage WFS and the like. FIG. 24D shows fine movement stage WFS2 during reticle alignment, along with coarse movement stage WCS1 holding the fine movement stage. Then, main controller 20 performs exposure operation by the step-and-scan method, based on results of the reticle alignment and the results of the wafer alignment (array coordinates which uses the second fiducial marks of each of the shot areas on wafer W), and transfers the pattern of reticle R on each of the plurality of shot areas on wafer W. As is obvious from FIGS. 24E and 24F, in this exposure, fine movement stage WFS2 is returned to the −Y side after reticle alignment, and then exposure is performed in the order from shot areas on the +Y side on wafer W to the shot areas on the −Y side.

Concurrently with the delivery of the liquid immersion space, reticle alignment, and exposure described above, the following operations are performed.

More specifically, as shown in FIG. 24D, main controller 20 moves carrier member 48 holding fine movement stage WFS1 into the space of coarse movement stage WCS2, based on the measurement values of fine movement stage position measurement system 70D and wafer stage position measurement system 16B. At this point, with the movement of carrier member 48, main controller 20 moves the movable member holding fine movement stage WFS1 on the carrier member main section in the +Y direction.

Figure 24E:
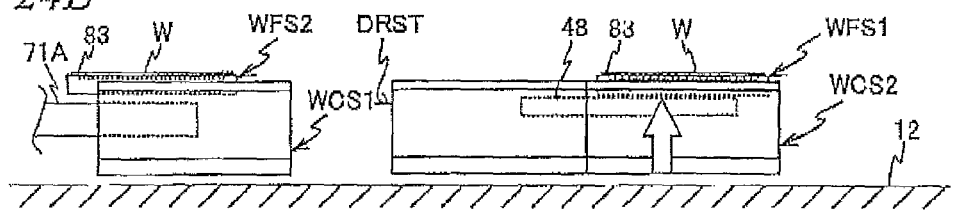

Next, main controller 20 releases the lock mechanism (not shown), and separates coarse movement stage WCS2 into the first section WCS2a and the second section WCS2b, and also drives carrier member 48 holding fine movement stage WFS1 upward perpendicularly to the XY plane as is shown by the outlined arrow in FIG. 24E so that the pair of mover sections equipped in fine movement stage WFS1 are positioned at a height where the pair of mover sections are engageable with the pair of stator sections of coarse movement stage WCS2. By this movement, measurement beams Bya and Byb, and Bxa and Bxb from Y laser interferometers 69Ya and 69Yb and X laser interferometers 69Xa and 69Xb configuring fine movement stage position measurement system 70D no longer fall an fine movement stage WFS1. Therefore, main controller 20 switches the measurement system which measures the positional information of fine movement stage WFS1 in the XY plane, from fine movement stage position measurement system 70D to fine movement stage position measurement system 70C. At this point, main controller 20 resets the measurement values of fine movement stage position measurement system 70C, using the measurement values of fine movement stage position measurement system 70D, and secures the continuity of the position (position measurement value) of fine movement stage WFS1 which is to be measured.

And then, main controller 20 brings together the first section WCS2a and the second section WCS2b of coarse movement stage WCS2. By this, fine movement stage WFS1 holding wafer W which has been exposed is supported by coarse movement stage WCS2. Therefore, main controller 20 locks the lock mechanism (not shown).

Figure 24F:
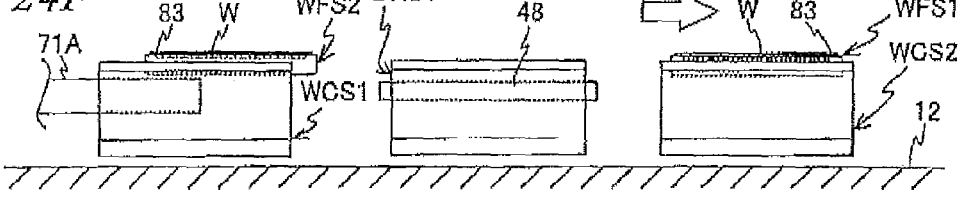

Next, main controller 20 drives coarse movement stage WCS2 supporting fine movement stage WFS1 in the +Y direction as shown by the outlined arrow in FIG. 24F, and moves coarse movement stage WCS2 to measurement station 300.

Then, by main controller 20, on fine movement stage WFS1, wafer exchange, detection of the second fiducial marks, wafer alignment and the like are performed, in procedures similar to the ones previously described. Also in this case, at the wafer exchange position, gas within the decompression chamber formed by the wafer holder (omitted in drawings) of fine Movement stage WFS1 and the back surface of wafer W is exhausted outside by the vacuum pump, which creates a negative pressure within the decompression chamber and wafer W is suctioned by the wafer holder. And, by an action of a check valve (not shown), the decompressed state of the decompression chamber is maintained, and wafer W is held by the wafer holder even if tabes and the like used to suction the gas in the decompression chamber by vacuum are not connected to fine movement stage WFS1. This allows fine movement stage WFS1 to be separated from the coarse movement stage and to be carried without any problems.

Then, main controller 20 converts array coordinates of each shot area on wafer W acquired from the wafer alignment into array coordinates which are based on the second fiducial marks. In this case as well, position measurement of fine movement stage WFS1 on alignment is performed, using fine movement stage position measurement system 70B.

While wafer alignment to wafer W held by fine movement stage WFS1 is completed in the manner described above, exposure of wafer W which is held by fine movement stage WFS2 in exposure station 200 is still being continued.

Then, in a manner similar to the previous description, main controller 20 moves fine movement stage WFS1 to relay stage DRST. Main controller 20 waits for the exposure to wafer W on fine movement stage WFS2 to be completed, in a state where relay stage DRST and coarse movement stage WCS2 are waiting at the waiting position previously described.

Hereinafter, a similar processing is repeatedly performed, alternately using fine movement stages WFS1 and WFS2, and an exposure processing to a plurality of wafer Ws is continuously performed.

As described in detail above, according to exposure apparatus 100 of the embodiment, in exposure station 200, wafer W mounted on fine movement stage WFS1 (or WFS2) held relatively movable by coarse movement stage WCS1 is exposed with exposure light IL, via reticle R and projection optical system PL. In doing so, positional information in the XY plane of fine movement stage WFS1 (or WFS2) held movable by coarse movement stage WCS1 is measured by main controller 20, using encoder system 73 of fine movement stage position measurement system 70A which has measurement arm 71A which is placed facing grating RG placed at fine movement stage WFS1 (or WFS2). In this case, because space is formed inside coarse movement stage WCS1 and each of the heads of fine movement stage position measurement system 70A are placed in this space, there is only space between fine movement stage WFS1 (or WFS2) and each of the heads of fine movement stage position measurement system 70A. Accordingly, each of the heads can be arranged in proximity to fine movement stage WFS1 (or WFS2) (grating RG), which allows a highly precise measurement of the positional information of fine movement stage WFS1 (or WFS2) by fine movement stage position measurement system 70A. Further, as a consequence, a highly precise drive of fine movement stage WFS1 (or WFS2) via coarse movement stage drive system 51A and/or fine movement stage drive system 52A by main controller 20 becomes possible.

Further, in this case, irradiation points of the measurement beams of each of the heads of encoder system 73 and laser interferometer system 75 configuring fine movement stage position measurement system 70A emitted from measurement arm 71A on grating RG coincide with the center (exposure position) of irradiation area (exposure area) IA of exposure light IL irradiated on wafer W. Accordingly, main controller 20 can measure the positional information of fine movement stage WFS1 (or WFS2) with high accuracy, without being affected by so-called Abbe error. Further, because optical path lengths in the atmosphere of the measurement beams of each of the heads of encoder system 73A can be made extremely short by placing measurement arm 71A right under grating RG, the influence of air fluctuation is reduced, and also in this point, the positional information of fine movement stage WFS1 (or WFS2) can be measured with high accuracy.

Further, in the embodiment, fine movement stage position measurement system 70B configured symmetric to fine movement stage position measurement system 70A is provided in measurement station 300. And in measurement station 300, when wafer alignment to wafer W on fine movement stage WFS2 (or WFS1) held by coarse movement stage WCS2 is performed by alignment systems AL1, and AL2₁ to AL2₄ and the like, positional information in the XY plane of fine movement stage WFS2 (or WFS1) held movable on coarse movement stage WCS2 is measured by fine movement stage position measurement system 70B with high precision. As a consequence, a highly precise drive of fine movement stage WFS2 (or WFS1) via coarse movement stage drive system 513 and/or fine movement stage drive system 523 by main controller 20 becomes possible.

Further, in the embodiment, because the free end and the fixed end in each of the arms are set in opposite directions in measurement arm 71A at the exposure station 200 side and measurement arm 71B at the measurement station 300 side, coarse movement stage WCS1 can approach measurement station 300 (to be more precise, relay stage DRST) and coarse movement stage WCS2 can also approach exposure station 200 (to be more precise, relay stage DRST), without being disturbed by measurement arms 71A and 71B.

Further, according to the embodiment, the delivery of fine movement stage WFS2 (or WFS1) holding the wafer which has not yet undergone exposure from coarse movement stage WCS2 to relay stage DRST, and the delivery from relay stage DRST to coarse movement stage WCS1 are performed, by making fine movement stage WFS2 (or WFS1) perform a slide movement along an upper surface (a surface (a first surface) parallel to the XY plane including the pair of stator sections 93a and 93b) of coarse movement stage WCS2, relay stage DRST, and coarse movement stage WCS1. Further, the delivery of fine movement stage WFS1 (or WFS2) holding the wafer which has been exposed from coarse movement stage WCS1 to relay stage DRST, and the delivery from relay stage DRST to coarse movement stage WCS1 are performed, by making fine movement stage WFS1 (or WFS2) move within the space inside coarse movement stage WCS1, relay stage DRST, and coarse movement stage WCS2, which are positioned on the −Z side of the first surface. Accordingly, the delivery of the wafer between coarse movement stage WCS1 and relay stage DRST, and coarse movement stage WCS2 and relay stage DRST, can be realized by suppressing an increase in the footprint of the apparatus as much as possible.

Further, in the embodiment, although relay stage DRST is configured movable within the XY plane, as is obvious from the description on the series of parallel processing operations previously described, in the actual sequence, relay stage DRST remains waiting at the waiting position previously described. On this point as well, an increase in the footprint of the apparatus is suppressed.

Further, according to exposure apparatus 100 of the embodiment, positional information of fine movement stage WFS1 (or WFS2) is measured with highly precision by fine movement stage position measurement system 70D even outside the measurable range of fine movement stage position measurement systems 70A and 70B. Because a part of the measurable range of fine movement stage position measurement system 70A and fine movement stage position measurement system 70C overlaps each other, while a part of the measurable range of fine movement stage position measurement system 70B and fine movement stage position measurement system 70C also overlaps each other (refer to FIG. 16), positional information of fine movement stage WFS1 (or WFS2) can be measured seamlessly when fine movement stage WFS1 (or WFS2) moves from measurement station 300 to exposure station 200, by using the three fine movement stage position measurement systems 70A, 70B, and 70C.

Further, because fine movement stage position measurement system 70C measures positional information of fine movement stage WFS1 (or WFS2) in directions of five degrees of freedom using encoder system 78 which includes a plurality of Y heads 96 and 97 that are placed facing Y scales $87Y_1$ and $87Y_2$ placed on fine movement stage WFS1 (or WFS2) by a clearance of around several millimeters, the position of fine movement stage WFS1 (or WFS2) can be measured with high precis ion.

Further, according to exposure apparatus 100 of the embodiment, when fine movement stage WFS1 (or WFS2) is moved and mounted from exposure station 200 to measurement station 300 via relay stage DRST, fine movement stage WFS1 (or WFS2) which is to be moved and mounted is supported by the movable member of carrier member 48 and moves in the −Y direction, inside coarse movement stage WCS1, relay stage DRST and coarse movement stage WCS2. Positional information of fine movement stage WFS1 (or WFS2) in the XY plane on this movement is measured by fine movement stage position measurement system 70D.

Accordingly, it becomes possible for main controller 20 to measure positional information of fine movement stage WFS1 (or WFS2) in a wide range within the XY plane, based on the output of fine movement stage position measurement systems 70A, 70B, 70C and 70D.

Further, according to exposure apparatus of the embodiment, when the first section WCS1a and the second section WCS1b of coarse movement stage WCS1 are each driven by main controller 20 via coarse movement stage drive system 51A, and the first section WCS1a and the second section WCS1b are separated, fine movement stage WFS1 (or WFS2) held by coarse movement stage WCS1 before the separation can easily be detached from coarse movement stage WCS1, while still holding wafer W which has been exposed. That is, wafer W can be detached easily from coarse movement stage WCS1, integrally with fine movement stage WFS1.

In this case, in the embodiment, because coarse movement stage WCS1 is separated into the first section WCS1a and the second section WCS1b and fine movement stage WFS1 (or WFS2) holding wafer W which has been exposed is easily detached from coarse movement stage WCS1, after moving fine movement stage WFS1 (or WFS2) integrally with coarse movement stage WCS1 in a direction (the +Y direction) from a fixed end to a free end of measurement arm 71A which is supported in a cantilevered state with the tip inside the space within coarse movement stage WCS1, fine movement stage WFS1 (or WFS2) holding wafer W which has been exposed can be detached from coarse movement stage WCS1 without measurement arm 71A interfering the detachment.

Further, after fine movement stage WFS1 (or WFS2) holding wafer W which has been exposed is detached from coarse movement stage WCS1, coarse movement stage WCS1 is made to hold another fine movement stage WFS2 (or WFS1) which holds wafer W which has not yet undergone exposure. Accordingly, it becomes possible to detach fine movement stage WFS1 (or WFS2) holding wafer W which has been exposed from coarse movement stage WCS1, or to make coarse movement stage WCS1 hold another fine movement stage WFS2 (or WFS1) holding wafer W which has not yet undergone exposure, in a state each holding wafer W.

Further, main controller 20 drives carrier member 48 via carrier member drive system 54, and fine movement stage WFS1 (or WFS2), which still holds wafer W which has been exposed and has been detached from coarse movement stage WCS1, is housed in the space inside of relay stage DRST.

Further, main controller 20 drives carrier member 48 via carrier member drive system 54 so that the position of fine movement stage WFS1 (or WFS2) holding wafer W which has been exposed is set to a predetermined height, in a state where the first section of WCS2a and the second section WCS2b of coarse movement stage WCS2 are separated via coarse movement stage drive system 51B. And, by the first section of WCS2a being integrated with the second section WCS2b of coarse movement stage WCS2 via coarse movement stage drive system 51B by main controller 20, fine movement stage WFS1 (or WFS2) holding wafer W which has been exposed can be delivered from relay stage DRST to coarse movement stage WCS2.

Furthermore, main controller 20 moves and mounts fine movement stage WFS2 (or WFS1) holding wafer W which has not yet undergone exposure from coarse movement stage WCS2 to relay stage DRST, via fine movement stage drive systems 52B and 52C, and then further from relay stage DRST to coarse movement stage WCS1, via fine movement stage drive systems 52C and 52A.

Therefore, according to exposure apparatus 100 of the embodiment, wafer W can be delivered between the three, which are coarse movement stage WCS1, relay stage DRST, and coarse movement stage WCS2, integrally with fine movement stage WFS1 or WFS2, even if the size of wafer W increases, without any problems in particular.

Further, when fine movement stage WFS1 (or WFS2) holds liquid Lq between tip lens 191 (projection optical system PL) blade BL (auxiliary stage AST) moves into a scrum state where blade BL is in contact or in proximity via a clearance of around 300 µm with fine movement stage WFS1 (or WFS2) in the Y-axis direction, and moves along in the Y-axis direction with fine movement stage WFS1 (or WFS2) while maintaining the scrum state from the fixed end side to the free end side of measurement arm 71A, and then holds liquid 14 with tip lens 191 (projection optical system PL) after this movement. Therefore, it becomes possible to deliver liquid Lq (the liquid immersion space formed by liquid Lq) held with tip lens 191 (projection optical system PL) from fine movement stage WFS1 (or WFS2) to blade BL, without measurement arm 71A disturbing the delivery.

Further, according to exposure apparatus 100 of the embodiment, because fine movement stage WFS1 (or WFS2) can be driven with good precision, it becomes possible to drive wafer W mounted on this fine movement stage WFS1 (or WFS2) in synchronization with reticle stage RST (reticle R) with good precision, and to transfer a pattern of reticle R onto wafer W by scanning exposure. Further, in exposure apparatus 100 of the embodiment, because wafer exchange, alignment measurement and the like of wafer W on fine movement stage WFS2 (or WFS1) can be performed in measurement station 300, concurrently with the exposure operation performed on wafer W mounted on fine movement stage WFS1 (or WFS2) in exposure station 200, throughput can be improved when compared with the case where each processing of wafer exchange, alignment measurement, and exposure is sequentially performed.

Incidentally, in the embodiment above, while the case has been described where Y scales $87Y_1$ and $87Y_2$ placed on the upper surface of plate 83 of fine movement stage WFS1 (or WFS2) are subject to measurement by Y heads 96 and 97 belonging to head units 98A and 98B configuring a part of encoder system 78 (fine movement stage position measurement system 70C), besides this, grating RG, which is subject to measurement by X head 77x, and Y heads 77ya and 77yb configuring a part of fine movement stage position measurement systems 70A and 703, can also be subject to measurement by Y heads 96 and 97. In this case, Y scales $87Y_1$ and $87Y_2$ will not be necessary. Further, in this case, grating RG should be formed substantially covering the entire area of the upper surface of main body section 81 of fine movement stage WFS1 (or WFS2) in this case, on grating RG, measurement beams from Y heads 96 and 97 are irradiated from above (the +Z side) via plate 83 and cover glass 84 (refer to FIGS. 2A and 2B), and measurement beams from X head 77x, and Y heads 77ya and 77yb configuring a part of fine movement stage position measurement systems 70A and 70B, respectively, are also to be irradiated from below (the –Z side). In this case, when difficulties occur in Y heads 96 and 97 on measurement, the liquid repellent film does not have to be formed in a partial area including an area corresponding to the placement area of Y scales $87Y_1$ and $87Y_2$ on the upper surface of plate 83.

In the embodiment above, the case has been described of the movement range of fine movement stages WFS1 and WFS2 when the exchange of fine movement stages WFS1 and WFS2 was performed between coarse movement stage WCS2 and coarse movement stage WCS1, via relay stage DRST, in the case encoder system 78 (head units 98A and 98B, and Y heads 96 and 97) was placed. However, as well as this, for example, an encoder system similar to encoder system 78 can be arranged, further at another place as is described in the following modified example.

Modified Example

Figure 33:
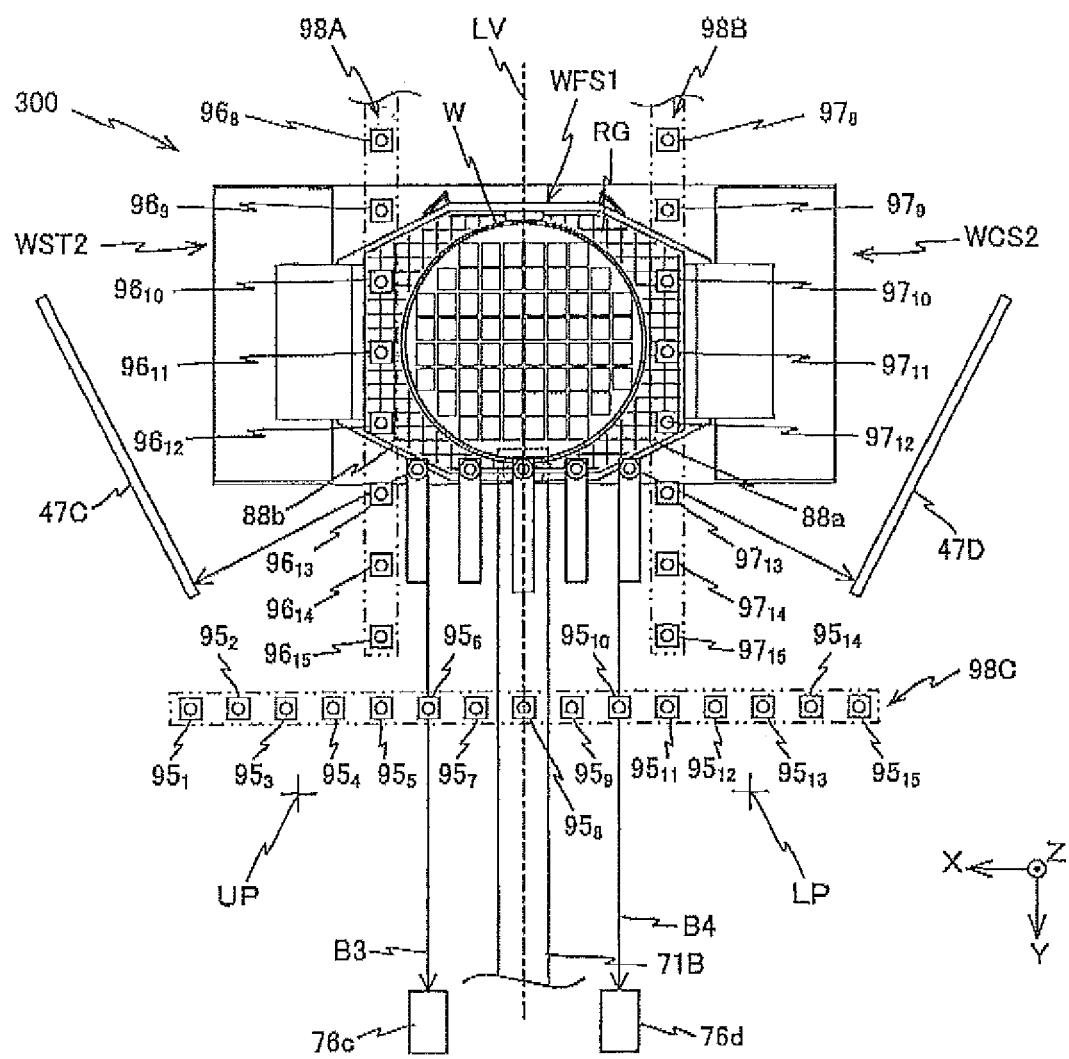
FIG. 33 is planar view showing a measurement station and a wafer exchange area of an exposure apparatus related to a modified example.

FIG. 33 shows a planar view of a measurement station 300 and a wafer exchange area (including an unloading position UP and a loading position LP) located on the +Y side of measurement station 300 of an exposure apparatus related to a modified example. As it can be seen from FIG. 33, on the +X side and the –X side of the wafer exchange area in a placement symmetric to a reference axis LV, an unloading position UP where a wafer is unloaded from fine movement stage WFS1 (or WFS2) and a loading position LP where a wafer is loaded on fine movement stage WFS1 (or WFS2) are placed, respectively.

On fine movement stage WFS1 (or WFS2), grating RG is formed substantially covering the entire area of the upper surface of main body section 81.

Between measurement station 300, and unloading position UP and loading position LP, a head unit 98C is installed, which is equipped in another encoder system (hereinafter referred to as a third encoder system) different from encoder systems 73 and 78. Head unit 98C is fixed to main frame BD by suspension via a support member.

Head unit 98C is equipped with a plurality of (fifteen, in this case) two-dimensional encoder heads (hereinafter, shortly referred to as 2D heads) $95_k$ (k=1 to 15) that are arrayed eguispaced in the X-axis direction. In this case, a 2D head refers to an encoder head whose measurement direction is in two directions, which are the X-axis direction and the Y-axis direction. In the following description, 2D heads $95_k$ will also be expressed as 2D heads 95 when necessary. The array distance of 2D heads 95 is determined so as to satisfy the conditions in a. and b. described below.

a. One each of 2D heads 95 can constantly face an area of grating RG on the +X side and the –X side of the wafer mounting area on fine movement stage WFS1 (or WFS2) when fine movement stage WFS1 (or WFS2) moves between unloading position UP and loading position LP.

b. In the case when two adjacent 2D heads are at a position where a linkage process (a process to secure the continuity of the position to be measured (position Measurement value)) should be performed between the two adjacent 2D heads during the movement of fine movement stage WFS1 (or WFS2) between unloading position UP and loading position LP, the two adjacent 2D heads should be able to simultaneously face the area of grating RG on the +X side and the –X side of the wafer mounting area.

Incidentally, each 2D head 95 is fixed at a position around several mm above grating RG.

Each of the 2D heads 95 irradiates a measurement beam on grating RG from above (the +Z side) via plate 83 and cover glass 84 (refer to FIGS. 2A and 2B), receives the diffraction light which occurs from an X diffraction grating and a Y diffraction grating of grating RG, respectively, and measures an XY position of grating RG (more specifically, fine movement stage WFS1 (or WFS2)). As previously described, in the third encoder system, at least two 2D heads 95 face grating RG. Accordingly, head unit 98C constitutes a multiple-lens (fifteen-lens, in this case) two-dimensional encoder system that measures the position (including the θz position) of fine movement stage WFS1 (or WFS2) within the XY plane, using grating RG.

The third encoder system measures the position of fine movement stage WFS1 (or WFS2) within the XY plane at a resolution of, for example, around 0.1 nm, and then supplies the positional information (measurement values) to main controller 20. Main controller 20 drives fine movement stage WFS1 (or WFS2) (wafer stage WST2) within the wafer exchange area, based on the positional information (measurement values) that has been supplied.

Incidentally, in this modified example, in addition to eleven each of Y heads $96_i$ and $97_j$ (i, j=1 to 11) previously described, four more each of Y heads $96_i$ and $97_j$ (i, j to 15) belong to two head units 98A and 98B configuring encoder system 78 (fine movement stage position measurement system 70C). Y heads $96_i$ and $97_j$ (i, j=12 to 15) are placed on the +Y side of Y heads $96_{11}$ and $97_{11}$ in parallel to the Y-axis by a distance WD, respectively. This increases the measurable range of encoder system 78 (fine movement stage position measurement system 70C), to the wafer exchange area.

Next, a processing performed using fine movement stage WFS1 supported by coarse movement stage WCS2 in the wafer exchange area, in the exposure apparatus related to this modified example, will be described based on FIGS. 34A to 35B.

Figure 34A:
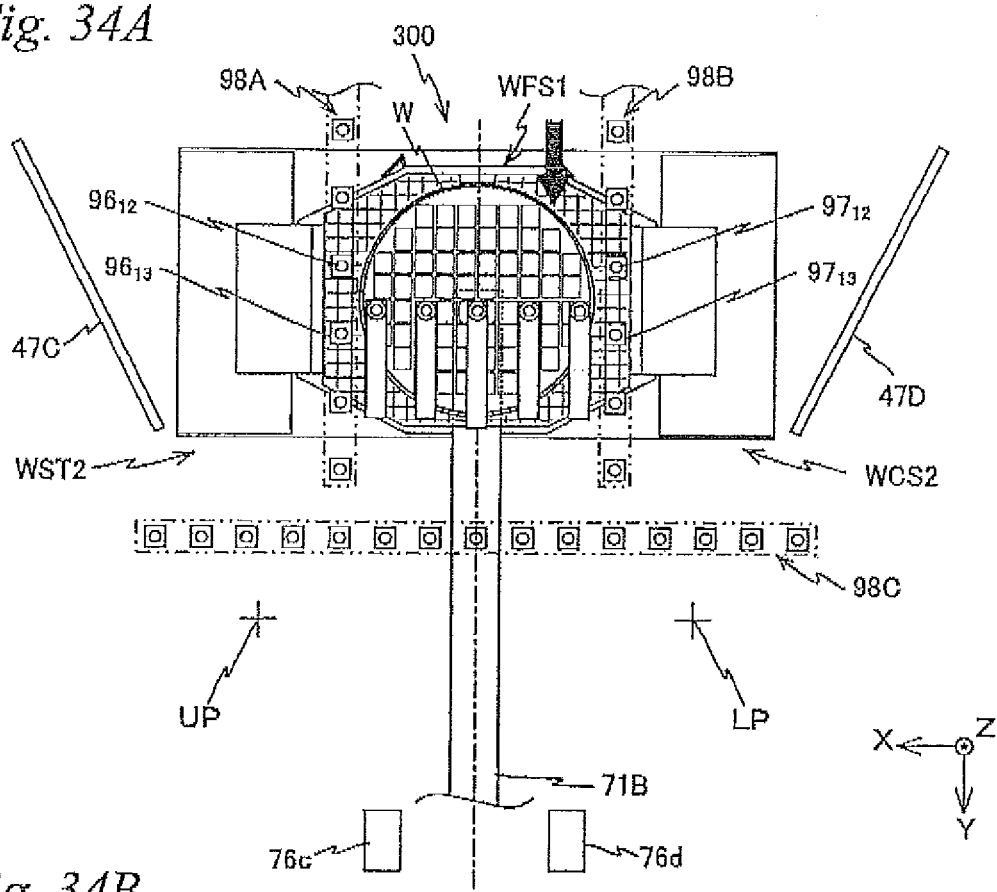
FIGS. 34A and 34B are views (No. 1) used to explain a processing performed using a fine movement stage supported by coarse movement stage WCS2 in the wafer exchange area, in the exposure apparatus related to the modified example.

FIG. 34A shows a view of coarse movement stage WCS2 (wafer stage WST2) returning to measurement station 300, while holding fine movement stage WFS1 which holds a wafer that has undergone exposure. Prior to the state shown in FIG. 34A, fine movement stage WFS1 and fine movement stage WFS2 holding the wafer to which wafer alignment has been performed are exchanged between coarse movement stage WCS2 and coarse movement stage WCS1. The state shown in FIG. 34A corresponds to the state shown in FIG. 24F. More specifically, coarse movement stage WCS2 holding fine movement stage WFS1 is driven in the +Y direction by main controller 20 as is shown by the black arrow in FIG. 34A, based on the positional information measured by fine movement stage position measurement system 70C.

Then, main controller 20 drives coarse movement stage WCS2 (wafer stage WST2) holding fine movement stage WFS1 further in the +Y direction based on positional information (measurement values) of fine movement stage WFS1 from fine movement stage position measurement system 70C, passed measurement station 300, and then to the wafer exchange area.

Figure 34B:
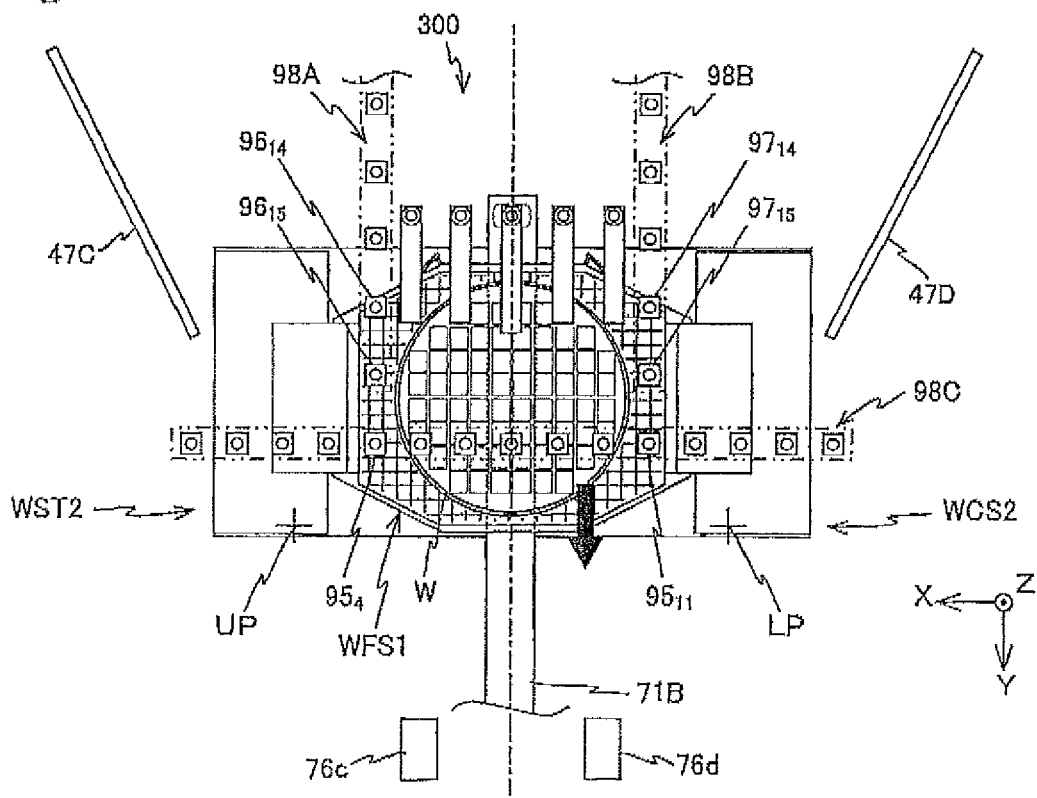

FIG. 34B shows a state where wafer stage WST2 is located at the measurement limit position on the +Y side of fine movement stage position measurement system 70C (two head units 98A and 98B). At the measurement limit position, Y heads $96_{14}$ and $96_{15}$ belonging to head unit 98A, and Y heads $97_{14}$ and $97_{15}$ belonging to head unit 98B of fine movement stage position measurement system 70C face the area of grating RG on the +X side and the -X side of the wafer mounting area of fine movement stage WFS1. When this occurs, 2D heads $95_4$ and $95_{11}$ belonging to head unit 98C face the area of grating RG on the +X side and the -X side of the wafer mounting area. Therefore, main controller 20 switches the measurement system which measures the positional information of fine movement stage WFS1, from fine movement stage position measurement system 70C to the third encoder system.

In this case, in order to continuously link the position (position measurement value) of wafer stage WST2 which is to be measured, main controller 20 resets the measurement values of the third encoder system, using the measurement values of fine movement stage position measurement system 70C. More specifically, main controller 20 resets the measurement values of 2D heads $95_4$ and $95_{11}$ so that the measurement values of the third encoder system coincides with the measurement values of fine movement stage position measurement system 70C.

Figure 35A:
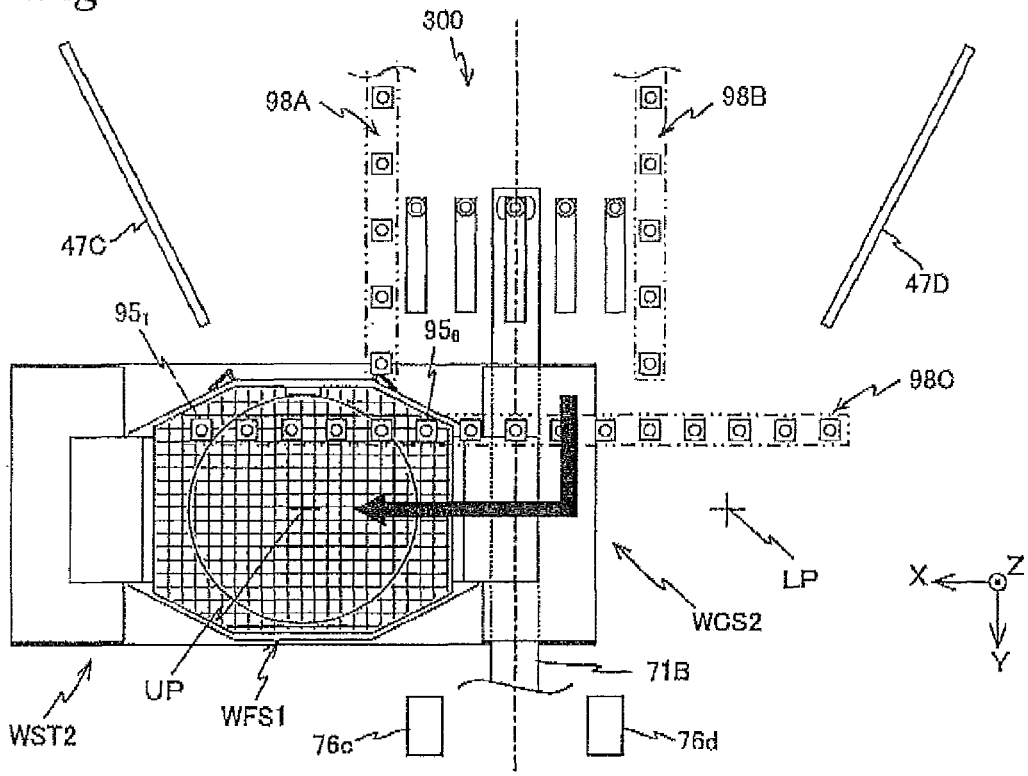
FIGS. 35A and 35B are views (No. 2) used to explain a processing performed using a fine movement stage supported by coarse movement stage WCS2 in the wafer exchange area, in the exposure apparatus related to the modified example.

After switching the measurement system, main controller 20 drives wafer stage WST2 in the +X direction after driving wafer stage WST2 further in the +Y direction as is shown by the black arrow in FIG. 35A, based on the positional information of fine movement stage WFS1 measured by the third encoder system. By this drive, fine movement stage WFS1 is positioned at unloading position UP, as shown in FIG. 35A. By the movement of fine movement stage WFS1 in the +X direction on this drive, 2D heads $95_4$ to $95_1$ sequentially face the area of grating RG on the +X side of the wafer mounting area, while 2D heads $95_{11}$ to $95_6$ sequentially face the area of grating RG on the -X side of the wafer mounting area. Then, by an unload arm (not shown), wafer W is unloaded from fine movement stage WFS1.

Figure 35B:
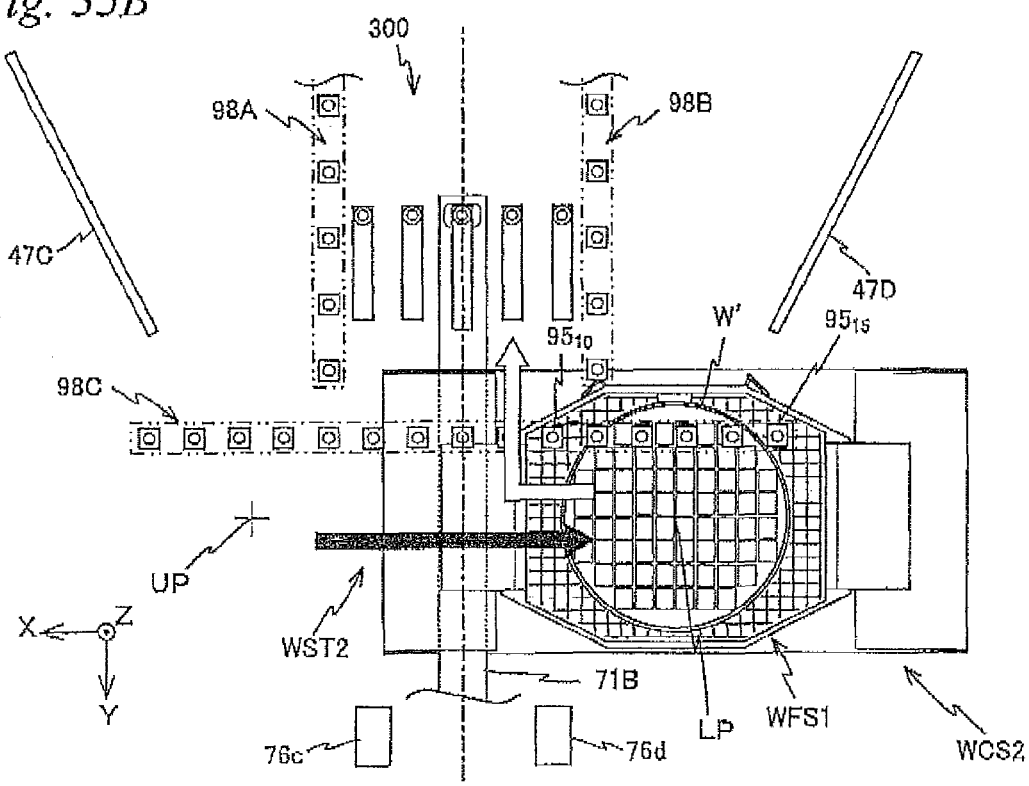

After the unloading of wafer W, main controller 20 drives wafer stage WST2 (fine movement stage WFS1) in the -X direction as is shown by the black arrow in FIG. 35B. By this drive, fine movement stage WFS1 is positioned at loading position LP, as shown in FIG. 35B. By the movement of fine movement stage WFS1 in the -X direction on this drive, 2D heads $95_1$ to $95_{10}$ sequentially face the area of grating RG on the +X side of the wafer mounting area, while 2D heads $95_6$ to $95_{15}$ sequentially face the area of grating RG on the -X side of the wafer mounting area. Then, by a load arm (not shown), a new wafer W' is loaded onto fine movement stage WFS1.

After the loading of wafer W', main controller 20 drives wafer stage WST2 (fine movement stage WFS1) in the -Y direction on reference axis LV after driving wafer stage WST2 in the +X direction, as is shown by the outlined arrow in FIG. 35B. By this drive, wafer stage WST2 (fine movement stage WFS1) is moved within the measurable range of fine movement stage position measurement system 70C shown in FIG. 34B. Then, main controller 20 switches the measurement system which measures the positional information of fine movement stage WFS2, from the third encoder system, to fine movement stage position measurement system 70C.

In this case, in order to continuously link the position (position measurement value) of wafer stage WST2 which is to be measured, main controller 20 resets the measurement values of Y heads $96_{14}$ and $96_{15}$, and $97_{14}$ and $97_{15}$, so that the measurement values of fine movement stage position measurement system 70C coincides with the measurement values of the third encoder system.

After switching the measurement system, main controller 20 moves wafer stage WST2 into measurement station 300, based on the positional information (measurement values) of fine movement stage WFS1 measured by fine movement stage position measurement system 70C, and then performs wafer alignment on wafer W' in the manner previously described.

Incidentally, in the embodiment above, fine movement stage position measurement system 70D was configured by an interferometer system for the following reason. More specifically, the reason for this is because fine movement stage position measurement system 70D is used to measure positional information of one of the fine movement stages when the one fine movement stage holding a wafer on which exposure has been performed is moved and mounted from one of the coarse movement stages to the other, or from coarse movement stage WCS1 to coarse movement stage WCS2 for wafer exchange, the accuracy required does not have to be too high, and no problems occur in particular even in the case when the system is affected by air fluctuation.

Incidentally, when fine movement stage WFS1 (or WFS2) is delivered from coarse movement stage WCS2 to coarse movement stage WCS1 (via relay stage DRST), the configuration of fine movement stage position measurement system 70C used to measure the positional information of fine movement stage WFS1 (or WFS2) in the XY plane and fine movement stage position measurement system 70D used to measure the positional information of fine movement stage WFS1 (or WFS2) in the XY plane when fine movement stage WFS1 (or WFS2) is delivered from coarse movement stage WCS1 to coarse movement stage WCS2 (via relay stage DRST) is not limited to the configuration described in the embodiment above. For example, fine movement stage position measurement system 70C does not have to be equipped with both encoder system 78 and laser interferometer system 79, and either of the systems will do. Further, the configuration of fine movement stage position measurement systems 70C and 70D is arbitrary. For example, as these position measurement systems, a measurement system (not limited to an encoder) which irradiates a measurement beam from the upper surface side of the fine movement stage on a grating arranged on the back surface side can be used. In this case, a transmitting section or an opening section through which the measurement beam passes can be provided in a part of the fine movement stage, only in a range covering a replacement operation range. Further, each of the measurement devices configuring fine movement stage position measurement systems 70C and 70D can perform position measurement by irradiating a measurement beam on (a Measurement plane or a reflection surface of) the fine movement stage not from above or from the sides, but from below.

Incidentally, in the embodiment above, while the case has been described where blade BL (movable member) was provided in auxiliary stage AST which moves within an XY plane, the present invention is not limited to this. That is, the movable member can have any configuration as long as when a holding member (in the embodiment above, the fine movement stage is equivalent) holds liquid Lq with an optical member (in the embodiment above, tip lens 191 is equivalent), a movable member can approach (including the case of being in contact) the holding member within a predetermined distance (e.g., 300 μm) in the Y-axis direction, and can move along in the Y-axis direction (from the fixed end side to the free end side of measurement arm 71A in the embodiment above) along with the holding member while maintaining the proximity state (the scrum state previously described), and then can hold liquid Lq with the optical member after the movement. Accordingly, the movable member can be a movable blade which is driven by a robot arm, or other drive devices.

Incidentally, in the embodiment above, fine movement stage WFS1 holding wafer W which has been exposed was delivered first to carrier member 48 of relay stage DRST, and then fine movement stage WFS2 held by relay stage DRST was slid afterwards to be held by coarse movement stage WCS1, using FIGS. 24A to 24C. However, besides this, fine movement stage WFS2 can be delivered to carrier member 48 of relay stage DRST first, and then fine movement stage WFS1 held by coarse movement stage WCS1 can be slid afterwards to be held by relay stage DRST.

Further, in the embodiment above, while the gap (clearance) between relay stage DRST and coarse movement stages WCS1 and WCS2 was set to around 300 μm in the case of making coarse movement stages WCS1 and WCS2 proximal to relay stage DRST, respectively to replace fine movement stages WFS1 and WFS2, this gap does not necessarily have to be set small as in the case, for example, such as when blade DL and fine movement stage WFS1 are driven in proximity. In this case, relay stage DRST and coarse movement stage can be distanced within a range where fine movement stage is not tilted greatly (that is, the stator and the mover of the linear motor do not come into contact) at the time of movement of the fine movement stage between relay stage DRST and the coarse movement stage.

In other words, the gap between relay stage DRST and coarse movement stages WCS1 and WCS2 is not limited to around 300 μm, and can be made extremely large.

Further, in the embodiment above, while the case has been described where the apparatus is equipped with relay stage DRST, in addition to coarse movement stages WCS1 and WCS2, relay stage DRST does not necessarily have to be provided. In this case, the fine movement stage has to be delivered, for example, between coarse movement stage WCS1 and coarse movement stage WCS2, and for this purpose, a relay member has to be added in order to achieve the delivery. For example, a holding member which temporarily holds the fine movement stage can be installed between the movable range of coarse movement stage WCS1 and the movable range of coarse movement stage WCS2, or, for example, the fine movement stage can be delivered to coarse movement stages WCS1 and WCS2 using a robot arm and the like. As a holding member, a vertically movable table can be used, which fits inside of base board 12 at normal times so as not to project above from the floor surface, and moves upward to support the fine movement stage when coarse movement stages WCS1 and WCS2 are separated into two sections, and then moves downward while still supporting the fine movement stage. Alternatively, in the case a narrow notch is formed in the Y-axis direction in coarse movement slider section 91 of coarse movement stages WCS1 and WCS2, a table whose shaft section protrudes from the floor surface and is vertically movable can be used. In any case, the holding member can have any structure as long as the section supporting the fine movement stage is movable at least in one direction, and does not interfere when the fine movement stage is delivered directly between coarse movement stages WCS1 and WCS2 in a state supporting the fine movement stage. In any case, when the fine movement stage is supported neither by coarse movement stage WCS1 nor WCS2, a measurement system (not limited to an interferometer system) which measures the positional information within the XY plane of the fine movement stage held by the relay member has to be provided. Besides this, for example, a carrier mechanism, which delivers the fine movement stage to coarse movement stage WCS1 and then receives the fine movement stage and delivers the fine movement stage to an external carrier system (not shown) from coarse movement stage WCS1, can be provided in coarse movement stage WCS2. In this case, the external carrier system can attach the fine movement stage holding the wafer to coarse movement stage WCS2. Incidentally, in the case the relay stage is not arranged, this allows the footprint of the apparatus to be reduced.

Incidentally, in the embodiment above, while the case has been described where coarse movement stages WCS1 and WCS2 were separable into the first section and the second section as well as the first section and the second section being engageable, besides this, the first section and the second section may have any type of arrangement, even when the first section and the second section are physically constantly apart, as long as they are reciprocally approachable and dividable, and on separation, a holding member (the fine movement stage in the embodiment above) is detachable, whereas when the distance is closed, the holding member is supportable.

Incidentally, in the embodiment above, while the case has been described where fine movement stage position measurement systems 70A and 70B are made entirely of, for example, glass, and are equipped with measurement arms 71A and 71B in which light can proceed inside, the present invention is not limited to this. For example, at least only the part where each of the laser beams previously described proceed in the measurement arm has to be made of a solid member which can pass through light, and the other sections, for example, can be a member that does not transmit light, and can have a hollow structure. Further, as a measurement arm, for example, a light source or a photodetector can be built in the tip of the measurement arm, as long as a measurement beam can be irradiated from the section facing the grating. In this case, the measurement beam of the encoder does not have to proceed inside the measurement arm.

Further, in the measurement arm, the part (beam optical path segment) where each laser beam proceeds can be hollow. Or, in the case of employing a grating interference type encoder system as the encoder system, the optical member on which the diffraction grating is formed only has to be provided on an arm that has low thermal expansion, such as for example, ceramics, Inver and the like. This is because especially in an encoder system, the space where the beam separates is extremely narrow (short) so that the system is not affected by air fluctuation as much as possible. Furthermore, in this case, the temperature can be stabilized by supplying gas whose temperature has been controlled to the space between fine movement stage (wafer holder) and the measurement arm (and beam optical path). Furthermore, the measurement arm need not have any particular shape.

Incidentally, in the embodiment above, while measurement arms 71A and 71B are provided on the same main frame 5D, as well as this, measurement arms 71A and 71B can be provided on a different support member. For example, the projection system (projection unit PU) and the alignment system (aligner 99) can be supported by separate support devices, and measurement arm 71A can be provided on the support device of the projection system, and measurement arm 71B can be provided on the support device of the alignment system.

Incidentally, in the embodiment, because measurement arms 71A and 71B are fixed to main frame BD integrally, torsion and the like may occur due to internal stress (including thermal stress) in measurement arms 71A and 71B, which may change the relative position between measurement arms 71A and 71B, and main frame BD. Therefore, as countermeasures against such cases, the position of measurement arms 71A and 71B (a change in a relative position with respect to main frame BD, or a change of position with respect to a reference position) can be measured, and the position of measurement arms 71A and 71B can be finely adjusted, or the measurement results corrected, with actuators and the like.

Further, in the embodiment above, while the case has been described where measurement arms 71A and 71B are integral with main frame BD, as well as this, measurement arms 71A and 71B and mainframe BD may be separated. In this case, a measurement device (for example, an encoder and/or an interferometer) which measures a position (or displacement) of measurement arms 71A and 71B with respect to main frame BD (or a reference position), and an actuator and the like to adjust a position of measurement arms 71A and 71B can be provided, and main controller 20 as well as other controllers can maintain a positional relation between main frame BD (and projection optical system PL) and measurement arms 71A and 71B at a predetermined relation (for example, constant), based on measurement results of the measurement device.

Further, a measurement system (sensor), a temperature sensor, a pressure sensor, an acceleration sensor for vibration measurement and the like can be provided in measurement arms 71A and 71B, so as to measure a variation in measurement arms 71A and 71B by an optical technique. Or, a distortion sensor (strain gauge) or a displacement sensor can be provided, so as to measure a variation in measurement arms 71A and 71B. And, by using the values obtained by these sensors, positional information obtained by fine movement stage position measurement system 70A and/or wafer stage position measurement system 68A, or fine movement stage position measurement system 70B and/or wafer stage position measurement system 68B can be corrected.

Further, in the embodiment above, while the case has been described where measurement arm 71A (or 71B) is supported in a cantilevered state via one support member 72A (or 72B) from mainframe BD, as well as this, for example, measurement arm 71A (or 71B) can be supported by suspension from main frame BD via a U-shaped suspension section, including two suspension members which are arranged apart in the X-axis direction. In this case, it is desirable to set the distance between the two suspension members so that the fine movement stage can move in between the two suspension members.

Further, fine movement stage position measurement systems 70A and 70B do not always have to be equipped with a measurement arm, and will suffice as long as the systems have a head which is placed facing grating RG inside the space of coarse movement stages WCS1 and WCS2 and receives a diffraction light from grating RG of at least one measurement beam irradiated on grating RG, and can measure the positional information of fine movement stage WFS at least within the XY plane, based on the output of the head.

Further, in the embodiment above, while an example has been shown where encoder system 73 is equipped with an X head and a pair of Y heads, besides this, for example, one or two two-dimensional heads (2D heads) can be provided, as in the third encoder system of the modified example described above. In the case two 2D heads are provided, detection points of the two heads can be arranged to be two points which are spaced equally apart in the X-axis direction on the grating, with the exposure position serving as the center.

Incidentally, fine movement stage position measurement system 70A can measure positional information in directions of six degrees of freedom of the fine movement stage only by using encoder system 73, without being equipped with laser interferometer system 75. Besides this, an encoder which can measure positional information in at least one of the X-axis direction and the Y-axis direction, and the Z-axis direction can also be used. For example, by irradiating measurement beams from a total of three encoders including an encoder which can measure positional information in the X-axis direction and the Z-axis direction and an encoder which can measure positional information in the Y-axis direction and the Z-axis direction, on three measurement points that are noncollinear, and receiving the return lights, positional information of the movable body on which grating RG is provided can be measured in directions of six degrees of freedom. Further, the configuration of encoder system 73 is not limited to the embodiment described above, and is arbitrary.

Incidentally, in the embodiment above, while the grating was placed on the upper surface of the fine movement stage, that is, a surface that faces the wafer, as well as this, the grating can be formed on a wafer holder holding the wafer. In this case, even when a wafer holder expands or an installing position to the fine movement stage shifts during exposure, this can be followed up when measuring the position of the wafer holder (wafer). Further, the grating can be placed on the lower surface of the fine movement stage, and in this case, the fine movement stage does not have to be a solid member through which light can pass because the measurement beam irradiated from the encoder head does not proceed inside the fine movement stage, and fine movement stage can have a hollow structure with the piping, wiring and like placed inside, which allows the weight of the fine movement stage to be reduced.

Incidentally, in the embodiments above, while an encoder system was used in which measurement beams proceeded inside of measurement arms 71A and 71B and were irradiated on grating RG of the fine movement stage from below, as well as this, an encoder system can be used which has an optical system (such as a beam splitter) of an encoder head provided in the measurement arm, and the optical system and a light source can be connected by an optical fiber, which allows a laser beam to be transmitted from the light source to the optical system via the optical fiber, and/or the optical system and a photodetection section can be connected by an optical fiber, and the optical fiber allows a return light from grating RG to be transmitted from the optical system to the photodetection system.

Further, the drive mechanism of driving the fine movement stage with respect to the coarse movement stage is not limited to the mechanism described in the embodiment above. For example, in the embodiment, while the coil which drives the fine movement stage in the Y-axis direction also functioned as a coil which drives fine movement stage in the Z-axis direction, besides this, an actuator (linear motor) which drives the fine movement stage in the Y-axis direction and an actuator which drives the fine movement stage in the Z-axis direction, or more specifically, levitates the fine movement stage, can each be provided independently. In this case, because it is possible to make a constant levitation force act on the fine movement stag, the position of the fine movement stage in the Z-axis direction becomes stable. Incidentally, in the embodiments above, while the case has been described where mover sections 82a and 82b equipped in the fine movement stage have a U shape in a side view, as a matter of course, the mover section, as well as the stator section, equipped in the linear motor that drives the fine movement stage do not have to be U shaped.

Incidentally, in the embodiment above, while fine movement stages WFS1 and WFS2 are supported in a noncontact manner by coarse movement stage WCS1 or WCS2 by the action of the Lorentz force (electromagnetic force), besides this, for example, a vacuum preload type hydrostatic air bearings and the like can be arranged on fine movement stages WFS1 and WFS2 so that the stages are supported by levitation with respect to coarse movement stage WCS1 or WCS2. Further, in the embodiment above, while fine movement stages WFS1 and WFS2 could be driven in directions of all 6 degrees of freedom, the present invention is not limited to this, and fine movement stages WFS1 and WFS2 only needs to be able to move within a two-dimensional plane which is parallel to the XY plane. Further, fine movement stage drive systems 52A and 52B are not limited to the magnet moving type described above, and can also be a moving coil type as well. Furthermore, fine movement stages WFS1 and WFS2 can also be supported in contact with coarse movement stage WCS1 or WCS2. Accordingly, as the fine movement stage drive system which drives fine movement stages WFS1 and WFS2 with respect to coarse movement stage WCS1 or WCS2, for example, a rotary motor and a ball screw (or a feed screw) can also be combined for use.

Incidentally, the fine movement stage position measurement system can be configured so that position measurement is possible within the total movement range of wafer stage WST. In this case, wafer stage position measurement system 16 will not be required. Further, in the embodiment above, base board 12 can be a counter mass which can reeve by an operation of a reaction force of the drive force of the wafer stage. In this case, coarse movement stage does not have to be used as a counter mass, or when the coarse movement stage is used as a counter mass as in the embodiment described above, the weight of the coarse movement stage can be reduced.

Incidentally, the wafer used in the exposure apparatus of the embodiment above is not limited to the 450 mm wafer, and can be a wafer of a smaller size (such as a 300 mm wafer).

Further, in the embodiment above, the case has been described where the exposure apparatus is a liquid immersion type exposure apparatus. However, the present invention is not limited to this, but can also be applied suitably in a dry type exposure apparatus that performs exposure of wafer W without liquid (water).

Further, while the case has been described where the exposure apparatus of the embodiment described above uses two fine movement stages WFS1 and WFS2, besides this, the exposure apparatus can also have a configuration where one fine movement stage reciprocally moves between measurement station 300 and exposure station 200. In this case, because the fine movement stage is constantly driven flush with the two-dimensional plane where the exposure operation and the alignment measurement are performed, positional information of the fine movement stage is measured using fine movement stage position measurement system 70C as is described in the embodiment above also when the fine movement stage is carried front exposure station 200 to measurement station 300.

Further, the structure of the encoder system configuring fine movement stage position measurement system 70C is not limited to the one described in the embodiment above. For example, the encoder system can have a configuration where a measurement beam is irradiated on a scale which is provided fixed to main frame BD extending in the Y-axis direction from an encoder head placed on the fine movement stage, and positional information of the fine movement stage is measured based on the light from this scale.

Incidentally, in the embodiment above, the case has been described where the present invention is applied to a scanning stepper; however, the present invention is not limited to this, and can also be applied to a static exposure apparatus such as a stepper. Even in the case of a stepper, by measuring the position of a stage on which the object subject to exposure is mounted using an encoder, position measurement error caused by air fluctuation can substantially be nulled, which is different from when measuring the position of this stage using an interferometer, and it becomes possible to position the stage with high precision based on the measurement values of the encoder, which in turn makes it possible to transfer a reticle pattern on the object with high precision. Further, the present invention can also be applied to a reduction projection exposure apparatus by a step-and-stitch method that synthesizes a shot area and a shot area.

Further, the magnification of the projection optical system in the exposure apparatus of the embodiment above is not only a reduction system, but also may be either an equal magnifying system or a magnifying system, and projection optical system PL is not only a dioptric system, but also may be either a catoptric system or a catadioptric system, and in addition, this projected image may be either an inverted image or an upright image.

In addition, the illumination light IL is not limited to ArF excimer laser light (with a wavelength of 193 nm), but may be ultraviolet light, such as KrF excimer laser light (with a wavelength of 248 nm), or vacuum ultraviolet light, such as F2 laser light (with a wavelength of 157 nm). As disclosed in, for example, U.S. Pat. No. 7,023,610, a harmonic wave, which is obtained by amplifying a single-wavelength laser beam in the infrared or visible range emitted by a DFB semiconductor laser or fiber laser, with a fiber amplifier doped with, for example, erbium (or both erbium and ytteribium), and by converting the wavelength into ultraviolet light using a non-linear optical crystal, can also be used as vacuum ultraviolet light.

In addition, the illumination light IL of the exposure apparatus 10 in the abovementioned embodiment is not limited to light with a wavelength of 100 nm or greater, and, of course, light with a wavelength of less than 100 nm may be used. For example, the present invention can be applied to an EUV exposure apparatus that uses an EUV (Extreme Ultraviolet) light in a soft X-ray range (e.g. a wavelength range from 5 to 15 nm). In addition, the present invention can also be applied to an exposure apparatus that uses charged particle beams such as an electron beam or an ion beam.

Further, in the embodiment above, a transmissive type mask (reticle) is used, which is a transmissive substrate on which a predetermined light shielding pattern (or a phase pattern or a light attenuation pattern) is formed. Instead of this reticle, however, as is disclosed in, for example, U.S. Pat. No. 6,778,257, an electron mask (which is also called a variable shaped mask, an active mask or an image generator, and includes, for example, a DMD (Digital Micromirror Device) that is a type of a non-emission type image display device (spatial light modulator) or the like) on which a light-transmitting pattern, a reflection pattern, or an emission pattern is formed according to electronic data of the pattern that is to be exposed can also be used. In the case of using such a variable shaped mask, because the stage where a wafer, a glass plate or the like is mounted is scanned with respect to the variable shaped mask, an equivalent effect as the embodiment above can be obtained by measuring the position of this stage using an encoder system and a laser interferometer system.

Further, as is disclosed in, for example, PCT International Publication No. 2001/035160, the present invention can also be applied to an exposure apparatus (lithography system) that forms line-and-space patterns on a wafer W by forming interference fringes on wafer W.

Moreover, as disclosed in, for example, U.S. Pat. No. 6,611,316, the present invention can also be applied to an exposure apparatus that synthesizes two reticle patterns via a projection optical system and almost simultaneously performs double exposure of one shot area by one scanning exposure.

Incidentally, an object on which a pattern is to be formed (an object subject to exposure to which an energy beam is irradiated) in the embodiment above is not limited to a wafer, but may be other objects such as a glass plate, a ceramic substrate, a film member, or a mask blank.

In addition, the application of the exposure apparatus is not limited to an exposure apparatus for fabricating semiconductor devices, but can be widely adapted to, for example, an exposure apparatus for fabricating liquid crystal devices, wherein a liquid crystal display device pattern is transferred to a rectangular glass plate, as well as to exposure apparatuses for fabricating organic electroluminescent displays, thin film magnetic heads, image capturing devices (e.g., CCDs), micromachines, and DNA chips. In addition to fabricating microdevices like semiconductor devices, the present invention can also be adapted to an exposure apparatus that transfers a circuit pattern to a glass substrate, a silicon wafer, or the like in order to fabricate a reticle or a mask used by a visible light exposure apparatus, an FUV exposure apparatus, an X-ray exposure apparatus, an electron beam exposure apparatus, and the like.

Incidentally, the movable body apparatus of the present invention can be applied not only to the exposure apparatus, but can also be applied widely to other substrate processing apparatuses (such as a laser repair apparatus, a substrate inspection apparatus and the like), or to apparatuses equipped with a movable stage of a position setting apparatus of a sample or a wire bonding apparatus in other precision machines.

Incidentally, the disclosures of all publications, the Published PCT International Publications, the U.S. patent applications and the U.S. patents that are cited in the description so far related to exposure apparatuses and the like are each incorporated herein by reference.

Electronic devices such as semiconductor devices are manufactured through the steps of; a step where the function/performance design of the device is performed, a step where a reticle based on the design step is manufactured, a step where a wafer is manufactured from silicon materials, a lithography step where the pattern of a mask (the reticle) is transferred onto the wafer by the exposure apparatus (pattern formation apparatus) and the exposure method in the embodiment previously described, a development step where the wafer that has been exposed is developed, an etching step where an exposed member of an area other than the area where the resist remains is removed by etching, a resist removing step where the resist that is no longer necessary when etching has been completed is removed, a device assembly step (including a dicing process, a bonding process, the package process), inspection steps and the like. In this case, in the lithography step, because the device pattern is formed on the wafer by executing the exposure method previously described using the exposure apparatus of the embodiment, a highly integrated device can be produced with good productivity.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. A movable body apparatus, comprising:
a movable body which is movable at least along a two-dimensional plane including a first axis and a second axis that are orthogonal to each other;
a first support member which supports the movable body at least when the movable body moves within a predetermined range within the two-dimensional plane;
a second support member which supports the movable body outside the predetermined range within the two-dimensional plane;
a first measurement system which measures positional information of the movable body in a direction parallel to the first axis and a direction parallel to the second axis when the movable body moves within the predetermined range within the two-dimensional plane, by irradiating at least one first measurement beam from below on a first measurement plane substantially parallel to the two-dimensional plane placed on the movable body and receiving a light from the first measurement plane of the at least one first measurement beam;

a second measurement system which measures positional information of the movable body at least in a direction parallel to the first axis outside the predetermined range within the two-dimensional plane; and a control system which controls a position of the movable body, based on measurement information of at least one of the first measurement system and the second measurement system, wherein the second measurement system measures the positional information when the movable body is moved from the first support member to the second support member, or from the second support member to the first support member.

2. The movable body apparatus according to claim 1 wherein the first measurement system has a head section which irradiates at least one first measurement beam from below on the first measurement plane and receives a light from the first measurement plane of the at least one first measurement beam, and an arm member extending in a direction parallel to the first axis.

3. The movable body apparatus according to claim 1 wherein the first support member is provided movable along the two-dimensional plane, and the movable body is supported and relatively movable with respect to the first support member.

4. The movable body apparatus according to claim 1 wherein the second measurement system includes a measurement member which irradiates at least one second measurement beam from above on the first measurement plane, and measures the positional information of the movable body by receiving a light from the first measurement plane of the at least one second measurement beam.

5. The movable body apparatus according to claim 4 wherein a grating whose periodic direction is at least in a direction parallel to the first axis is formed on the first measurement plane, and the measurement member receives a diffraction light from the grating and measures positional information of the movable body in a direction parallel to the first axis.

6. The movable body apparatus according to claim 4 wherein a plurality of the measurement members are arranged at a predetermined distance, along a direction parallel to the first axis.

7. The movable body apparatus according to claim 6 wherein some of the plurality of measurement members are placed within the predetermined range.

8. The movable body apparatus according to claim 1 wherein the second measurement system includes a measurement member which irradiates at least one second measurement beam on a second measurement plane substantially parallel to the two-dimensional plane, and measures positional information of the movable body by receiving a light from the second measurement plane of the at least one second measurement beam.

9. The movable body apparatus according to claim 8 wherein a grating whose periodic direction is in a direction parallel to the first axis is formed on the second measurement plane, whereby the second measurement system includes a head which receives a diffraction light from the grating and measures positional information of the movable body in a direction parallel to the first axis.

10. The movable body apparatus according to claim 8 wherein the second measurement plane is provided at the movable body, and a plurality of the measurement members are arranged at a predetermined distance, along a direction parallel to the first axis.

11. The movable body apparatus according to claim 10 wherein some of the plurality of measurement members are placed within the predetermined range.

12. The movable body apparatus according to claim 10 wherein a distance between the plurality of measurement members is not more than half a length of the second measurement plane along a direction parallel to the first axis.

13. The movable body apparatus according to claim 1 wherein the second measurement system measures positional information of the movable body at least in a direction parallel to the first axis, at a plurality of points distanced apart along a direction parallel to the second axis.

14. The movable body apparatus according to claim 1 wherein the second measurement system further measures positional information of the movable body in a direction parallel to a third axis which is orthogonal to the two-dimensional plane.

15. The movable body apparatus according to claim 14 wherein the second measurement system measures the positional information of the movable body in directions parallel to the first axis and the third axis, using the same measurement member.

16. The movable body apparatus according to claim 1 wherein a two-dimensional grating whose periodic direction is in directions parallel to the first axis and the second axis is formed on the first measurement plane, and the first measurement system receives a diffraction light from the two-dimensional grating and measures positional information of the movable body.

17. The movable body apparatus according to claim 1 wherein the second measurement system includes an interferometer system which measures positional information of the movable body in at least a direction parallel to the second axis within the two-dimensional plane, by irradiating a measurement beam on a reflection surface provided on the movable body and also receiving a reflected light from the reflection surface.

18. The movable body apparatus according to claim 17 wherein the reflection surface is placed perpendicular to the two-dimensional plane and is also tilted with respect to the first axis, and the second measurement system irradiates the measurement beam in parallel with the first axis.

19. The movable body apparatus according to claim 18 wherein the reflection surface includes a first reflection surface and a second reflection surface placed symmetrically with respect to the first axis, and the second measurement system irradiates a measurement beam on both the first and the second reflection surfaces.

20. The movable body apparatus according to claim 1 wherein
when the control system switches from one measurement system of the first measurement system and the second measurement system to the other measurement system, measurement values of the other measurement system is reset based on measurement values of the one measurement system.

21. An exposure apparatus that forms a pattern on an object by irradiation of an energy beam, the apparatus comprising:
the movable body apparatus according to claim 1 in which the object is mounted on the movable body; and
a patterning device which irradiates the energy beam on the object mounted on the movable body.

22. The exposure apparatus according to claim 21 wherein
a measurement center of the first measurement system which is a center of an irradiation point of the first measurement beam, coincides with an exposure position which is a center of an irradiation area of the energy beam irradiated on the object.

23. A device manufacturing method, the method including:
exposing an object using the exposure apparatus according to claim 21; and
developing the object which has been exposed.

24. The movable body apparatus according to claim 1, wherein the second measurement system measures the positional information of the movable body by irradiating a measurement light beam onto a portion of the movable body when the movable body is between the first and second support members during movement of the movable body from the first support member to the second support member, or during movement of the movable body from the second support member to the first support member.

25. A movable body apparatus, comprising:
a first support member which moves within a first range in a two-dimensional plane including a first axis and a second axis that are orthogonal to each other;
a second support member which moves within a second range positioned on one side of a direction parallel to the first axis of the first range in the two-dimensional plane;
a holding member which is placed in a vicinity of a border of the first range and the second range;
a movable body which is supported and relatively movable at least within a plane parallel to the two-dimensional plane, by the first support member and the second support member;
a first measurement system which measures positional information of the movable body in a direction parallel to the first axis and a direction parallel to the second axis, by irradiating at least one first measurement beam from below on a first measurement plane substantially parallel to the two-dimensional plane placed on the movable body supported by the first support member and receiving a light from the first measurement plane of the at least one first measurement beam; and
a second measurement system which measures positional information of the movable body on the holding member when the movable body is moved between the first support member and the second support member via the holding member.

26. The movable body apparatus according to claim 25 wherein
the second measurement system includes an interferometer system which measures positional information of the movable body in at least a direction parallel to the second axis within the two-dimensional plane, by irradiating a measurement beam on a reflection surface provided on the movable body and also receiving a reflected light from the reflection surface.

27. The movable body apparatus according to claim 26 wherein
the reflection surface is placed perpendicular to the two-dimensional plane and also tilted with respect to the first axis, and
the second measurement system irradiates the measurement beam in parallel with the first axis.

28. The movable body apparatus according to claim 27 wherein
the reflection surface includes a first reflection surface and a second reflection surface placed symmetrically with respect to the first axis, and
the second measurement system irradiates a measurement beam on each of the first and the second reflection surfaces.

29. The movable body apparatus according to claim 25 wherein
the second measurement system measures positional information of the movable body in the two-dimensional plane including a first position in a direction perpendicular to the two-dimensional plane, and
the apparatus further comprises a third measurement system which measures positional information of the movable body moving between the first support member and the second support member via the holding member, within the plane where the movable body is relatively supported by the first support member and the second support member, the plane including a second position in the direction perpendicular to the two-dimensional plane, and the second position being different from the first position.

30. An exposure apparatus that forms a pattern on an object by irradiation of an energy beam, the apparatus comprising:
the moveable body apparatus according to claim 25 in which the object is mounted on the movable body; and
a patterning device which irradiates the energy beam on the object mounted on the movable body.

31. The exposure apparatus according to claim 30 wherein
a measurement center of the first measurement system which is a center of an irradiation point of the first measurement beam, coincides with an exposure position which is a center of an irradiation area of the energy beam irradiated on the object.

32. A device manufacturing method, the method including:
exposing an object using the exposure apparatus according to claim 30; and
developing the object which has been exposed.

33. The movable body apparatus according to claim 25, wherein the second measurement system measures the positional information of the movable body when the movable body is held by the holding member and when the movable body is moved between the first support member and the second support member via the holding member, by irradiating a measurement light beam onto a portion of the movable body.

34. An exposure apparatus that exposes an object with an energy beam, the apparatus comprising:
a first support member which is movable within a first range including an exposure station where exposure of the object by the energy beam is performed;

a second support member which is movable within a second range including a measurement station where measurement of alignment information of the object is performed;

a movable body which holds the object, and is movably supported by each of the first and the second support members;

a first measurement system which measures positional information of the movable body supported by the first support member;

a second measurement system which measures positional information of the movable body supported by the second support member; and a third measurement system which measures positional information of the movable body when the movable body is moved from one support member of the first and the second support members to an other support member.

35. The exposure apparatus according to claim 34 wherein at least a part of the first measurement system is provided in a measurement member placed below the movable body supported by the first support member, and the first measurement system measures positional information of the movable body by irradiating a measurement beam on a measurement plane of the movable body.

36. The exposure apparatus according to claim 35 wherein in a predetermined plane where the object is moved, an irradiation position of the measurement beam of the first measurement system is set within an irradiation area of the energy beam.

37. The exposure apparatus according to claim 35 wherein the measurement member is provided in a support member of an optical system which emits the energy beam.

38. The exposure apparatus according to claim 34 wherein the third measurement system measures positional information from an upper side or a side with respect to the movable body, or from an upper side and a side with respect to the movable body.

39. The exposure apparatus according to claim 34 wherein at least a part of the second measurement system is provided in a measurement member placed below the movable body supported by the second movable body, and the second measurement system measures positional information of the movable body by irradiating a measurement beam on a measurement plane of the movable body.

40. The exposure apparatus according to claim 39, further comprising:

a detection system which detects alignment information, wherein in a predetermined plane, an irradiation position of the measurement beam of the second measurement system is set within a detection area of the detection system.

41. The exposure apparatus according to claim 40 wherein the measurement member is provided in a support member of the detection system.

42. The exposure apparatus according to claim 34 wherein at least the first measurement system of the first and the second measurement systems includes an encoder system, and the movable body has a grating formed on the measurement plane.

43. The exposure apparatus according to claim 34, further comprising:

a movable holding member which supports the movable body when moving the movable body from one support member of the first and the second support members to the other support member.

44. The exposure apparatus according to claim 43, further comprising:

a controller which moves the movable body supported by one support member of the first and the second support members to the holding member, and makes the first and the second support members be in proximity and moves the movable body supported by the other support member of the first and the second support members to the one support member of the first and the second support members.

45. An exposure method in which an object is exposed with an energy beam, the method comprising:

moving a first support member supporting a movable body holding the object within a first range including an exposure station where exposure of the object by the energy beam is performed, and measuring positional information of the movable body supported by the first support member using a first measurement system;

moving a second support member supporting the movable body holding the object within a second range including a measurement station where measurement of alignment information of the object is performed, and measuring positional information of the movable body supported by the second support member using a second measurement system; and measuring positional information of the movable body using a third measurement system when the movable body is moved from one support member of the first and the second support members to an other support member.

46. The exposure method according to claim 45 wherein positional information of the movable body is measured by irradiating a measurement beam on a measurement plane of the movable body from the first measurement system, at least a part of the first measurement system being provided in a measurement member placed below the movable body supported by the first support member.

47. The exposure method according to claim 46 wherein in a predetermined plane where the object is moved, an irradiation position of the measurement beam of the first measurement system is set within an irradiation area of the energy beam.

48. The exposure method according to claim 46 wherein the measurement member is provided in a support member of an optical system which emits the energy beam.

49. The exposure method according to claim 45 wherein the third measurement system measures positional information from an upper side or a side with respect to the movable body, or from an upper side and a side with respect to the movable body.

50. The exposure method according to claim 45 wherein positional information of the movable body is measured by irradiating a measurement beam on a measurement plane of the movable body from the second measurement system, at least a part of the second measurement system being provided in a measurement member placed below the movable body supported by the second support member.

51. The exposure method according to claim 50 wherein in a predetermined plane, an irradiation position of the measurement beam of the second measurement system is set within a detection area of a detection system which detects the alignment information.

52. The exposure method according to claim 51 wherein the measurement member is provided in a support member of the detection system.

53. The exposure method according to claim 45 wherein
at least the first measurement system of the first and the second measurement systems includes an encoder system, and
the movable body has a grating formed on a measurement plane.

54. The exposure method according to claim 45 wherein
the movable body is supported by a movable holding member when the movable body is moved from one support member of the first and the second support members to the other support member.

55. The exposure method according to claim 54 wherein
the movable body supported by one support member of the first and the second support members is moved to the holding member, and
the first and the second support members are made to be in proximity so that the movable body supported by the other support member of the first and the second support members is moved to the one support member.

56. A device manufacturing method, including
exposing an object using the exposure method according to claim 45; and
developing the object which has been exposed.

* * * * *